(12) United States Patent
Hidaka

(10) Patent No.: US 6,487,136 B2
(45) Date of Patent: Nov. 26, 2002

(54) SEMICONDUCTOR MEMORY DEVICE WITH REDUCED CURRENT CONSUMPTION IN DATA HOLD MODE

(75) Inventor: Hideto Hidaka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/115,618

(22) Filed: Apr. 4, 2002

(65) Prior Publication Data

US 2002/0105845 A1 Aug. 8, 2002

Related U.S. Application Data

(62) Division of application No. 09/511,927, filed on Feb. 23, 2000.

(30) Foreign Application Priority Data

Aug. 5, 1999 (JP) .......................................... 11-222605

(51) Int. Cl.[7] .................................................. G11C 7/00
(52) U.S. Cl. ...................................... 365/222; 365/149
(58) Field of Search ................................. 365/222, 149

(56) References Cited

U.S. PATENT DOCUMENTS

| | | |
|---|---|---|
| 5,148,546 A | 9/1992 | Blodgett |
| 5,249,155 A | 9/1993 | Arimoto et al. ............ 365/222 |
| 5,365,487 A | 11/1994 | Patel et al. |
| 5,663,916 A * | 9/1997 | Kikinis ....................... 365/222 |
| 5,724,297 A | 3/1998 | Noda et al. |
| 5,726,946 A | 3/1998 | Yamagata et al. |
| 5,825,705 A | 10/1998 | Tsukude et al. |
| 5,856,951 A | 1/1999 | Arimoto et al. |
| 5,877,978 A | 3/1999 | Morishita et al. |
| 6,038,186 A | 3/2000 | Tanizaki ...................... 365/222 |
| 6,301,184 B1 | 10/2001 | Sasaki et al. ................ 365/226 |

FOREIGN PATENT DOCUMENTS

| | | |
|---|---|---|
| DE | 198 15 887 A1 | 3/1999 |
| JP | 6-237164 | 8/1994 |
| JP | 7-86916 | 3/1995 |
| JP | 11-39861 | 2/1999 |

OTHER PUBLICATIONS

"Ultra LSI Memory", by Kiyoo Ito, Advanced Electronics Series, Baifukan, Nov. 5, 1996.
European Search Report.

* cited by examiner

*Primary Examiner*—Huan Hoang
(74) *Attorney, Agent, or Firm*—McDermott, Will & Emery

(57) ABSTRACT

A power supply circuit generating a power supply voltage for refresh-related circuitry and a power supply circuit for column-related/peripheral control circuitry are controlled by a power supply control circuit to be put in different power supply voltage supplying states in a self refresh mode. In the self refresh mode, only self refresh-related circuitry receives a power supply voltage to perform refresh operation. A reduced current consumption can be achieved in the self refresh mode while fast access operation is not deteriorated.

3 Claims, 30 Drawing Sheets

F I G. 2 3
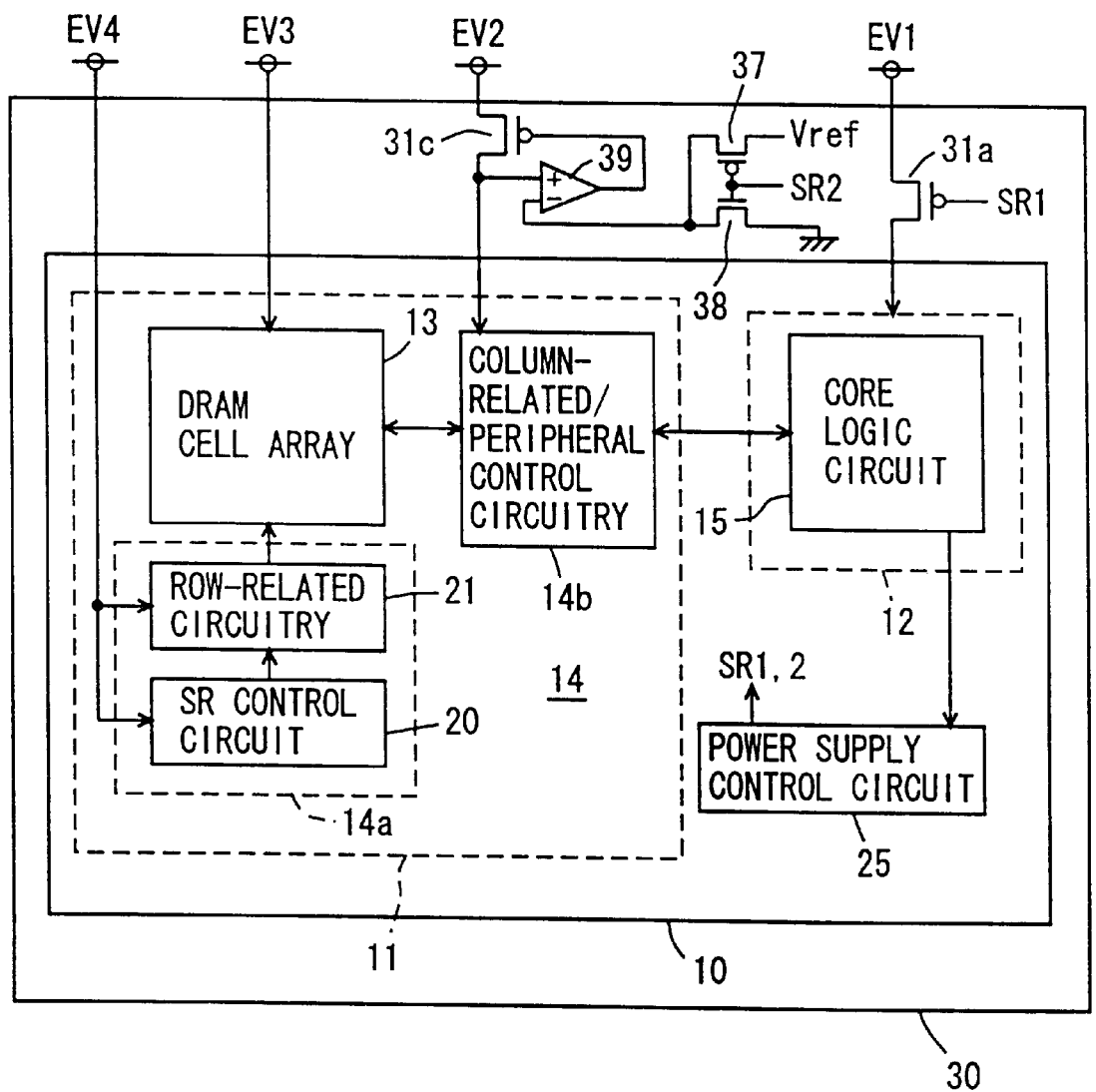

| | RA13 | RA12 | RA11 |
|---|---|---|---|
| R#0 | 0 | 0 | 0 |
| R#1 | 0 | 0 | 1 |
| R#2 | 0 | 1 | 0 |
| R#3 | 0 | 1 | 1 |
| R#4 | 1 | 0 | 0 |
| R#5 | 1 | 0 | 1 |
| R#6 | 1 | 1 | 0 |
| R#7 | 1 | 1 | 1 |

SEMICONDUCTOR MEMORY DEVICE WITH REDUCED CURRENT CONSUMPTION IN DATA HOLD MODE

This application is a divisional of application Ser. No. 09/511,927 filed Feb. 23, 2000.

BACKGROUND OF THE INVENTION

1. Field of the Invention

The present invention relates generally to semiconductor devices, and in particular to configurations for reducing the current consumed in a refresh mode for holding data, such as a sleep mode or a power down mode, without causing an erroneous operation in a semiconductor memory device requiring refreshing of storage data. More specifically, the present invention relates to a configuration for reducing the current consumed in a refresh mode by a logic merged memory with a logic and a dynamic random access memory integrated on a single semiconductor chip.

2. Description of the Background Art

A conventional CMOS semiconductor device is reduced in transistor size, in particular, gate length of a MOS transistor (an insulated gate field effect transistor) to achieve high density and high integration. While a reduced power supply voltage is employed to ensure the reliability of such a microfabricated transistor and reduce the power consumption of the device, in order to achieve fast operation the MOS transistor is required to have a threshold voltage Vth reduced in absolute value as an operating power supply voltage is reduced.

A MOS transistor, however, conducts a current referred to as a sub threshold leakage current (referred to as an "off leak current" hereinafter) between its source and drain even when it is turned off. When a threshold voltage is reduced in absolute value, an increased off leak current flows. Since an absolute value of a threshold voltage has a negative temperature-dependency and thus reduces as temperature rises, an increased operating temperature causes an increased off leak current and hence an increased direct current in the entirety of a large scale integrated circuit. In particular, in a dynamic semiconductor memory device, a current flowing in a standby state (a standby current) is disadvantageously increased.

In order to reduce current consumption in the standby state without degrading high speed operability, there has been conventionally proposed a hierarchical power supply configuration or an MT-CMOS (Multi Threshold-CMOS) configuration, as disclosed, e.g., in Japanese Patent Laying-Open No. 6-237164 and Ultra LSI Memory, by Ito 1994, published by Baihukan.

FIG. 60 shows an example of a conventional MT-CMOS configuration. In FIG. 60, cascaded CMOS inverters IV1–IV5 of five stages are shown as an internal circuit. An input signal IN fed to the first-stage inverter IV1 is at a low level in a standby cycle. CMOS inverters IV1–IV5 have an identical configuration and each includes a p channel MOS transistor PT and an n channel MOS transistor NT. MOS transistors PT and NT each are a low threshold voltage (L-Vth) MOS transistor with its threshold voltage reduced in absolute value.

For inverters IV1–IV5, there are provided a main power supply line 1 receiving a power supply voltage Vcc, a sub power supply line 3 coupled with main power supply line 1 via a leakage-cutting p channel MOS transistor PQ, a main ground line 2 transmitting a ground voltage Vss, and a sub ground line 4 connected to main ground line 2 via a leakage-cutting n channel MOS transistor NQ. Leakage-cutting MOS transistors PQ and NQ are an (M-Vth) MOS transistor which has a threshold voltage greater in absolute value than MOS transistors PT and NT have.

MOS transistor PQ has its gate receiving a control signal /φ and MOS transistor NQ has its gate receiving a control signal φ. Control signal φ attains a high level in an active cycle in which the internal circuit operates, and control signal φ attains a low level in a standby cycle in which the internal circuit is set in a standby state. Control signal /φ attains a low level in the active cycle and a high level in the standby cycle.

In the internal circuit, odd-stage inverters IV1, IV3 and IV5 . . . have sources of their p channel MOS transistors PTs connected to main power supply line 1 and sources of n channel MOS transistors NTs connected to sub ground line 4. Even-stage inverters IV2, IV4, . . . have sources of their p channel MOS transistors PTs connected to sub power supply line 3 and sources of their n channel MOS transistors NTs connected to main ground line 2. An operation of the MT-CMOS configuration shown in FIG. 60 will now be briefly described with reference to the signal waveform diagram shown in FIG. 61.

In the standby cycle, control signal φ is at a low level and control signal /φ is at a high level, and input signal IN is at a low level. In this state, leakage cutting MOS transistors PQ and NQ are turned off. In odd-stage inverters IV1, IV3, and IV5, their p channel MOS transistors PTs are turned on and their n channel MOS transistors NTs are turned off, since input signal IN is at a low level. The p channel MOS transistors PTs have their sources connected to main power supply line 1 and the n channel MOS transistors NTs have their sources connected to sub ground line 4. When p channel MOS transistor PT transmits to a corresponding output node (or drain) a voltage of the power supply voltage Vcc level on main power supply line 1, its source and drain voltages are equalized and the transistor does not conduct.

The n channel MOS transistor NT receiving a low level signal at the gate, causes off leak current. Sub ground line 4 is connected to main ground line 2 via leakage cutting MOS transistor NQ having the relatively high threshold voltage M-Vth. Thus, when off leak currents from inverters IV1, IV3 and IV5 flow to sub ground line 4, leakage cutting MOS transistor NQ cannot discharge all of the off leak currents and a voltage level SVss on sub ground line 4 becomes higher than ground voltage Vss. The level of voltage SVss on sub ground line 4 is ultimately determined by a relationship between the amount of the leakage current discharged by leakage cutting MOS transistor NQ and the sum of all of the off leak currents from the inverter stages included in the internal circuit. When voltage SVss on sub ground line 4 becomes higher than ground voltage Vss, in odd-stage inverters IV1, IV3, IV5 their n channel MOS transistors NTs have their respective gates and respective sources reverse-biased, resulting in a further reduced off leak current.

In even-stage inverters IV2, IV4 . . . , input signal IN is at a high level.

Even-stage inverters IV2, IV4, . . . have their p channel MOS transistors PTs connected at the respective sources to sub power supply line 3 and their n channel MOS transistors NTs connected at the respective sources to main ground line 2. Thus, in even stage inverters IV2, IV4, . . . their n channel MOS transistors have their sources and drains both set at the ground voltage Vss level and thus do not conduct and cause no off leak current. The p channel MOS transistors PTs, however, cause off leak current. Between main power supply line 1 and sub power supply line 3, leakage-cutting MOS transistor PQ is set to have a threshold voltage of a relatively large absolute value (M-Vth). Thus, the amount of the leakage current from main power supply line 1 to sub power supply line 3 is determined by leakage cutting MOS transistor PQ, and voltage SVcc on sub power supply line 3 becomes lower than the power supply voltage Vcc level. The voltage SVcc level on sub power supply line 3 is ultimately determined by a relationship between the leakage current from leakage cutting MOS transistor PQ and the sum of all of the off leak currents in even-stage inverters IV2, IV4, . . . . When voltage SVcc is lower than power supply voltage Vcc, in even-stage inverters IV2, IV4, . . . their p channel MOS transistors PTs have the respective gates and respective sources reverse-biased, resulting in a further reduced off leak current.

In the active cycle, control signal φ attains a high level and control signal /φ attains a low level, leakage cutting MOS transistors PQ and NQ are turned on, main power supply line 1 is connected to sub power supply line 3, and main ground line 2 is connected to sub ground line 4. Thus, voltage SVcc on sub power supply line 3 attains the power supply voltage Vcc level and voltage SVss on sub ground line 4 attains the ground voltage Vss level. In the active cycle, input signal IN varies with an operating state. The MOS transistors of inverters IV1–IV5 . . . configuring the internal circuit are low threshold voltage MOS transistors and thus operate at high speed. Leakage cutting MOS transistors PQ and NQ have their current supplying ability set to a large value, in order to sufficiently guarantee the operation of the internal circuit.

By arranging a power supply line and a ground line in hierarchical configuration of the main and sub power supply lines and the main and sub ground lines, the power supply line/ground line has an impedance thereof increased to reduce a leakage current in the standby cycle, and in the active cycle the power supply line/ground line has an impedance thereof reduced to allow a fast operation owing to the low threshold voltage MOS transistors in the internal circuit. A semiconductor circuit device providing a reduced current consumption in the standby cycle and also operating at high speed in the active cycle is to be implemented.

With the conventional MT-CMOS configuration, when an active cycle starts, control signals φ and/φ are driven to high and low levels, respectively, and responsively leakage cutting MOS transistors PQ and NQ of FIG. 60 turn on. Thus, a period of time is required from the start of the active cycle until voltages SVcc and SVss on sub power supply line 3 and sub ground line 4 respectively reach power supply voltage Vcc and ground voltage Vss and are stabilized. The internal circuit cannot operate while voltages SVcc and SVss on sub power supply line 3 and sub ground line 4 are unstable. Thus, as shown in FIG. 62, a period of time is required before the internal circuit actually operates after an active cycle starts, and fast operation can not be achieved. Operating the internal circuit with unstable voltages SVcc and SVss would result in an erroneous operation, and accordingly a period of time required for stabilizing voltages SVcc and SVss and additional margin must be considered in determining a timing at which the internal circuit starts to operate.

Furthermore, as shown in FIG. 60, the conventional MT-CMOS configuration requires input signal IN to be set at a predetermined logic level in the standby cycle. According to the logic level of input signal IN in the standby cycle, it must be determined where the internal circuit's power supply and ground lines are connected. For a random logic and a register circuit storing data indicative of operating conditions and such, however, input signals IN cannot have a predetermined logic level in the standby cycle, and the MT-CMOS configuration as shown in FIG. 60 can not be employed.

If a semiconductor device is a dynamic semiconductor memory device (referred to as a DRAM hereinafter), when no access is made for a relatively long period of time and a sleep mode is set, DRAM is set to a self refresh mode. In the self refresh mode, the DRAM internally, periodically refreshes the data stored in memory cells.

When self refresh operation is in effect performed, the DRAM enters an active cycle, and when the refresh operation completes, the DRAM enters a standby cycle. That is, the DRAM in the self refresh mode enters the active cycle at predetermined intervals. Thus, in the self refresh mode the data in memory cells are internally refreshed to merely hold the data. This results in a disadvantageous current consumption. In order to reduce current consumption, a longer refresh interval is required. However, an unnecessarily long refresh interval results in the data in memory cells being destroyed before refresh operation is performed, and the data cannot be held.

SUMMARY OF THE INVENTION

An object of the present invention is to provide a semiconductor device capable of reducing a current consumption in a standby state without degrading its fast operability.

Another object of the present invention is to provide a semiconductor device capable of reducing a current consumption in a self refresh mode.

Still another object of the present invention is to provide a semiconductor device capable of reducing a current consumption in a standby mode without negatively affecting its normal operation and data holding capability.

In one aspect, the semiconductor device according to the present invention includes a plurality of memory cells requiring refreshing of the storage data within a predetermined period of time, refresh-related circuitry for performing an operation of refreshing the data stored in the plurality of memory cells in a refresh mode, peripheral circuitry different from the refresh-related circuitry and performing at least an operation related to accessing to the plurality of memory cells, a first power supply circuit for supplying an operating power supply voltage to the refresh-related circuitry, a second power supply circuit provided separately from the first power supply circuit for supplying an operating power supply voltage to the peripheral circuitry, and a power supply control circuit responsive to an operation mode designation signal for adjusting an impedance of at least the second power supply circuit. The power supply control circuit includes a circuit for setting the first and second power supply circuits into different voltage supplying states when the operation mode designation signal designates the refresh mode and for setting the first and second power supply circuits in the same voltage supplying state when the operation mode designation signal designates a normal mode different from the refresh mode.

In a second aspect, the semiconductor device includes a plurality of memory cells having their storage data refreshed within a predetermined period of time, a register circuit receiving a power supply voltage of a power source node for storing information related to an operation of accessing the plurality of memory cells, a register capacitor provided corresponding to the register circuit for holding information stored in the register circuit, and a control circuit for periodically refreshing information stored in the register capacitor when an operation mode designation signal designates a refresh mode.

In a third aspect, the semiconductor device includes a memory cell array of a plurality of memory cells having a predetermined storage capacity and having the data stored therein refreshed within a predetermined period of time, a circuit for receiving and storing an address designating a refresh region to be refreshed when a refresh mode of performing a refresh operation is designated in response to an operation mode designation signal, a refresh address generation circuit for generating a refresh address to address a memory cell to be refreshed in a region designated by the refresh region designating address when the operation mode designation signal designates the refresh mode, a refresh timer outputting a refresh request requesting refreshing of the data stored in the memory cells at a predetermined period, and refresh-related circuitry responsive to the refresh request from the refresh timer for refreshing the data stored in the memory cells of the refresh address.

In the refresh mode, supply of a power source voltage to the peripheral circuitry can be stopped to save the current consumed by the peripheral circuitry in the refresh mode. In the normal mode, the refresh-related circuitry and the peripheral circuitry can both receive a power supply voltage to prevent the power supply voltage from varying upon switching between an active cycle and a standby cycle, so that an internal circuit can start to operate at a fast timing.

In the refresh mode, periodical refreshing of the information stored in the register capacitor holding the data of the register circuit allow power supply to the register circuit to be intermittently stopped in the refresh mode, resulting in reduced current consumption in the refresh mode.

In the refresh mode, refreshing of memory cells only in a predetermined address region allows the number of memory cell rows refreshed or the frequency of refresh operations to be reduced to implement a reduced current consumption.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 23 schematically shows a configuration of a second modification of the second embodiment of the present invention.

DESCRIPTION OF THE PREFERRED EMBODIMENTS

First Embodiment

Figure 1:
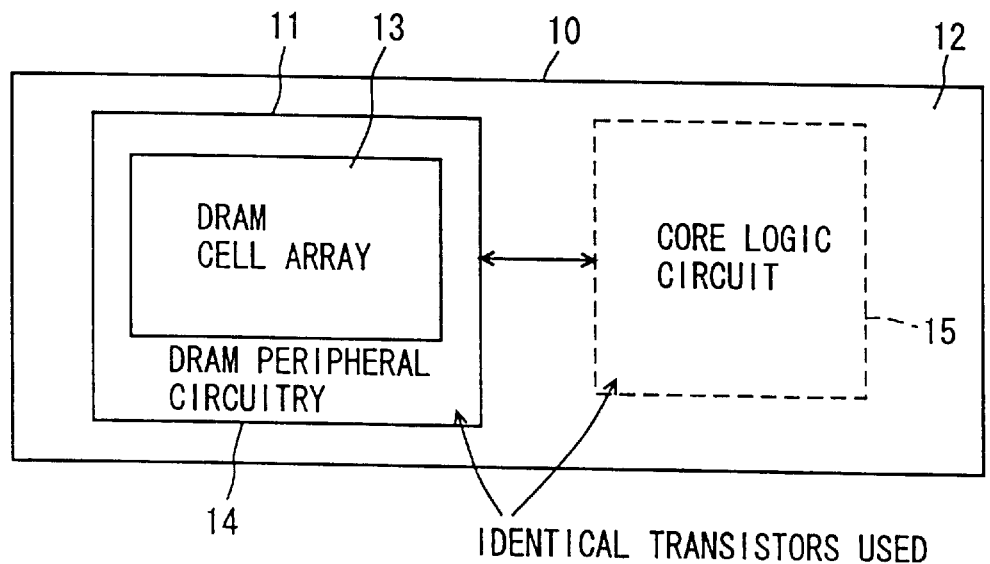
FIG. 1 schematically shows an entire configuration of a semiconductor device according to the present invention.

FIG. 1 schematically shows an entire configuration of a semiconductor device with the present invention applied thereto. In FIG. 1, a semiconductor device 10 according to the present invention includes a DRAM macro 11 including 1 transistor-1 capacitor type dynamic memory cells, and a logic circuit 12 transmitting and receiving data to and from DRAM macro 11. DRAM macro 11 and logic circuit 12 are integrated on a single semiconductor clip.

DRAM macro 11 includes a DRAM cell array 13 having dynamic memory cells, and DRAM peripheral circuitry 14 basically for selecting a memory cell included in DRAM cell array 13 and for reading/writing data.

Logic circuit 12 includes a core logic circuit 15 reading data from DRAM macro 11 and performing a predetermined processing on the data, and also writing the processed data into a memory cell of DRAM macro 11. Peripheral circuits for transmitting and receiving a signal between logic circuit 12 and an external device are arranged dispersedly on the chip of semiconductor device 10 (with pin terminals arranged along the four sides of the chip of semiconductor device 10), although core logic circuit 15 implementing a central function of the logic circuit is representatively shown.

DRAM peripheral circuitry 14 is configured of a CMOS circuit and core logic circuit 15 is also configured of a CMOS circuit. DRAM peripheral circuitry 14 and core logic circuit 15 basically employ MOS transistors having the same threshold voltage and the same gate insulation film thickness.

If any process is not performed in semiconductor device 10 for a relatively long period of time, core logic circuit 15 enters a sleep mode to stop generation of a clock signal and operation of an internal circuit. When core logic circuit 15 enters the sleep mode, core logic circuit 15 sets DRAM macro 11 in a self refresh mode. When DRAM macro 11 enters the self refresh mode, DRAM macro 11, using an incoporated timer, refreshes the data in the memory cells at predetermined time intervals.

Figure 2:
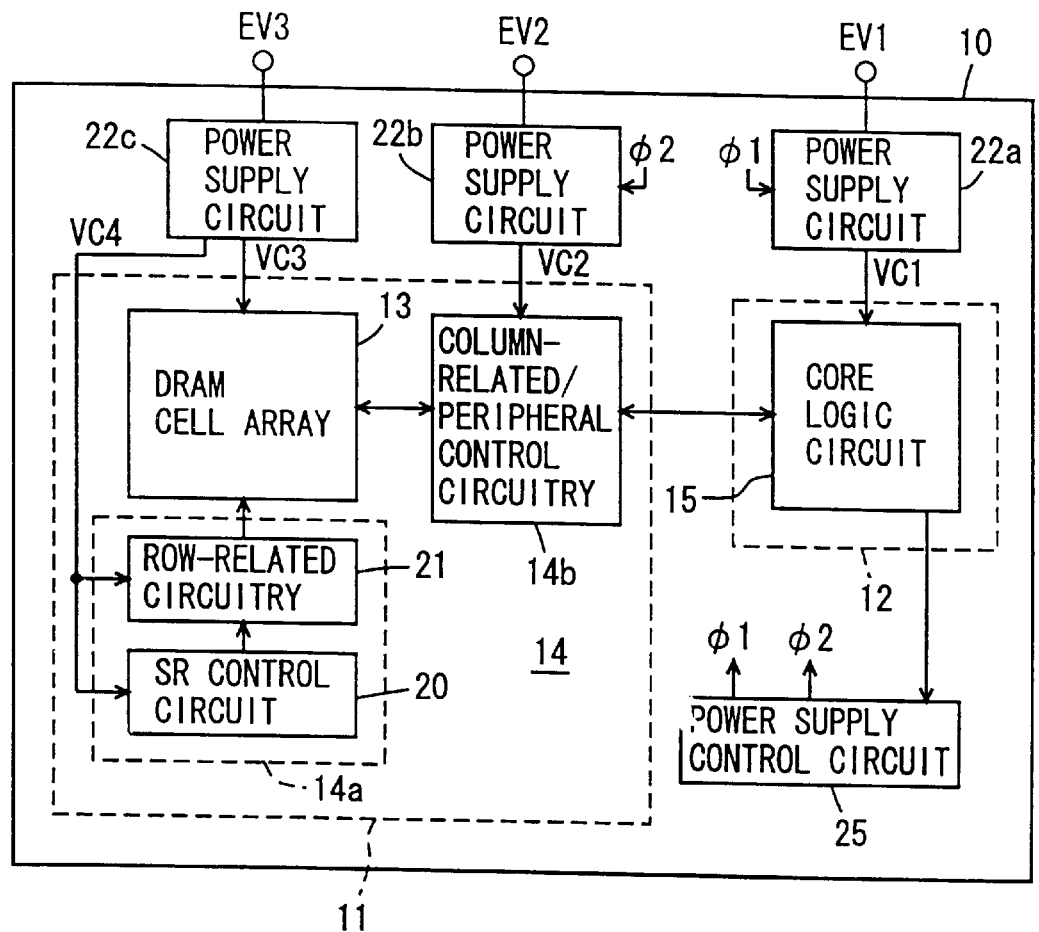
FIG. 2 schematically shows a configuration of a semiconductor device according to a first embodiment of the present invention.

FIG. 2 shows a configuration of a main portion of the semiconductor device according to the first embodiment of the present invention in further detail. In FIG. 2, DRAM macro 11 includes refresh-related circuitry 14a for refreshing the data in a memory cell of DRAM cell array 13 when the self refresh mode is designated, and column-related/peripheral control circuitry 14b for selecting a column of memory cells in DRAM cell array 13 to read/write data and for controlling an operation in the normal mode. Column-related/peripheral control circuitry 14b and refresh-related circuitry 14a are included in DRAM peripheral circuitry 14 shown in FIG. 1. In the self refresh mode, column-related/peripheral control circuitry 14b is controlled by refresh-related circuitry 14a to stop operating.

Refresh-related circuitry 14a includes a self refresh control circuit (SR control circuit) 20 performing a controlling operation required for self refresh operation in the self refresh mode, and row-related circuitry 21 operate under control of SR control circuit 20 to select a row of memory cells in DRAM cell array 13 for reading/restoring the data in a memory cell of a selected row in the self refresh mode. Row-related circuitry 21 in the normal mode of operation is controlled by the peripheral control circuit included in column-related/peripheral control circuitry 14b, to perform an operation related to selecting a row of DRAM cell array 13. SR control circuit 20 includes a self refresh mode detection circuit, a refresh address counter generating a refresh address, a timer counting a self refresh period, and a multiplexer applying to row-related circuitry 21a refresh address from the refresh address counter in place of an external row address in the self refresh mode.

Row-related circuitry 21 includes a row decoder decoding a row address and a refresh address, a word line drive circuit responsive to a signal output from the row decoder for driving a word line of DRAM cell array 13 to a selected state, a sense amplifier circuit provided for each column of DRAM cell array 13 to sense and amplify the data stored in a memory cell on each column, and a bit line precharge/equalization circuit precharging/equalizing each column (each bit line pair).

Semiconductor device 10 also includes a power supply circuit 22a receiving an external power supply voltage EV1 and producing an internal power supply voltage VC1 as the operating power supply voltage to logic circuit 12, a power supply circuit 22b receiving an external power supply voltage EV2 and producing an internal power supply voltage VC2 as the operating power supply voltage to column-related/peripheral control circuitry 14b, a power supply circuit 22c receiving an external power supply voltage EV3 and producing and supplying internal power supply voltages VC3 and VC4 to DRAM cell array 13 and refresh-related circuitry 14a, and a power supply control circuit 25 operates under control of core logic circuit 15 in logic circuit 12 to produce power supply control signals φ1 and φ2 for power supply circuits 22a and 22b. When logic circuit 12 enters the sleep mode and the DRAM macro is set in the self refresh mode, power supply control circuit 25 stops power supply circuits 22a and 22b from producing internal power supply voltages VC1 and VC2.

Although power supply circuit 22c is shown supplying internal power supply voltage VC3 to DRAM cell array 13, internal power supply voltage VC3 is utilized to generate a bit line precharging/equalizing voltage and a memory cells' cell plate voltage in DRAM memory cell array 13 and internal power supply voltage VC3 is also utilized in the sense amplifier circuit included in row-related circuitry 21. Internal power supply voltage VC4 is applied to the word line drive circuit and the row decoder included in row-related circuitry 21 and SR control circuit 20.

In the configuration shown in FIG. 2, power supply circuits 22a–22c respectively receive external power supply voltages EV1, EV2, EV3 and produce internal power supply voltages VC1 to VC3. It should be noted, however, that power supply circuits 22a–22c each also produce a ground voltage, as will be described in detail later. Hereinafter, a "power supply voltage" means a high level power supply voltage Vcc and a "power source voltage" refers to both of the power supply voltage and the ground voltage.

Power supply control circuit 25 normally operates receiving the power source voltage. While power supply control circuit 25 is shown to be provided common to power supply circuits 22a and 22b, separate power supply control circuits 25 may be provided for power supply circuits 22a and 22b, respectively. Furthermore, power supply circuit 22a may be provided in logic circuit 12 and power supply circuits 22b and 22c may be provided in DRAM macro 11.

In the first embodiment of the present invention, power supply circuits 22a and 22b in the self refresh mode stops producing their internal power source voltages. In the normal mode, power supply circuits 22a, 22b and 22c are all operated. The operation modes of semiconductor device include a normal mode, in which DRAM macro 11 and logic circuit 15 operate, and a sleep mode corresponding to a low current consumption, standby state. As states of DRAM macro 11 in the normal mode, there are an active cycle for actually selecting and accessing a memory cell, and a standby cycle for waiting a subsequent access. In the sleep mode, DRAM macro 11 is set to the self refresh mode. In the self refresh mode, DRAM macro 11 uses a signal output from an internal timer to provide a refresh cycle to perform a refresh operation.

In the normal mode, logic circuit 15 and DRAM macro 11 are allowed to consume a current of several tens mA even with internal circuitry set in the standby state. In the sleep mode, however, current is consumed in order to hold the data in DRAM macro 11 and must be as small as possible. In the refresh cycle, refresh operation is only performed internal to the DRAM macro and the DRAM macro is not accessed, so that there is not any problem related to delay of access time or cycle time. Thus, as shown in FIG. 2, only the power supply circuit 22c for refresh-related circuitry 14a related to self refresh operation is operated in the self refresh mode while power supply circuits 22a and 22b is stopped from producing their internal power source voltages, to reduce current consumption.

Figure 3:
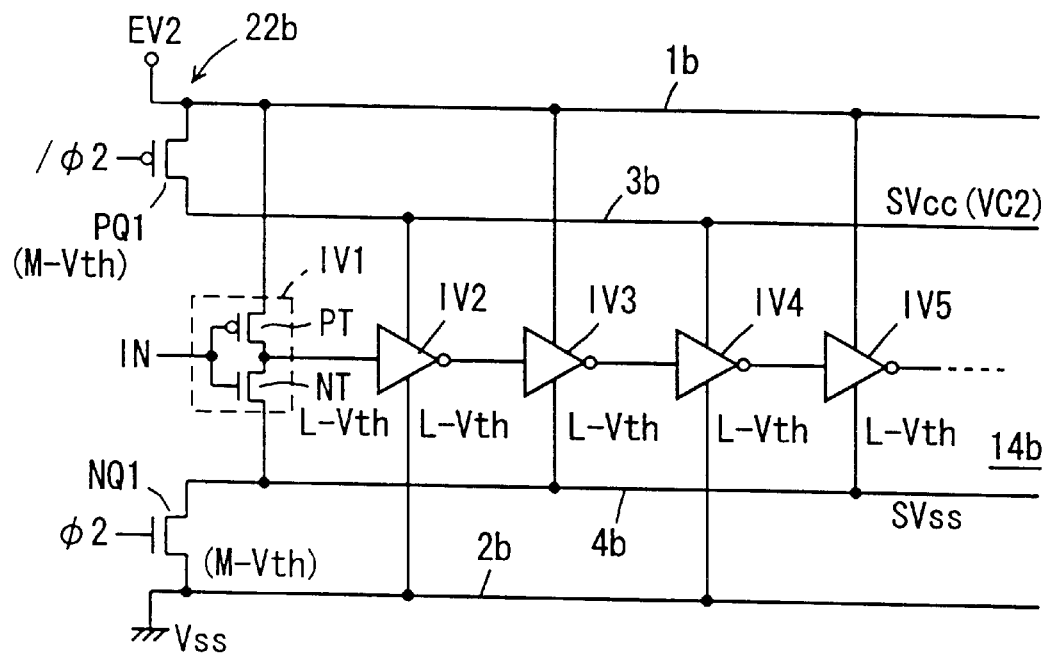
FIG. 3 schematically shows a configuration of a power supply circuit for the column-related/peripheral control circuitry shown in FIG. 2.

FIG. 3 shows a configuration of power supply circuit 22b for column-related/peripheral control circuitry 14b shown in FIG. 2. Power supply circuit 20b includes a main power supply line 1 for transmitting external power supply voltage EV2, a main ground line 2 for transmitting ground voltage Vss, a sub power supply line 3 associated with main power supply line 1, a sub ground line 4 associated with main ground line 2, a p channel MOS transistor PQ responsive to control signal /φ2 for turning on to connect main and sub power supply lines 1 and 3 together, and an n channel MOS transistor NQ1 responsive to the activated control signal φ2 for turning on to connect main ground line 2 to sub ground line 4.

Although column-related/peripheral circuitry 14b has its internal configuration varied depending on the function to be implemented, in FIG. 3 it is shown as five stages of inverters IV1–IV5 by way of example. Inverters IV1–IV5 each are of a CMOS configuration and include a p channel MOS transistor PT and an n channel MOS transistor NT. Column-related/peripheral control circuitry 14b includes an MOS transistor the same in gate insulation film and threshold voltage as the MOS transistor included in logic circuit 12, and is configured of a low threshold voltage (L-Vth) MOS transistor.

Leakage cutting MOS transistors PQ1 and NQ1 are MOS transistors having a threshold voltage larger in absolute value than the threshold voltage of low threshold voltage MOS transistors PT and NT, or (M-Vth) MOS transistors. Control signals φ2 and /φ2 are fed from power supply control circuit 25 shown in FIG. 2 and have their logic levels switched depending on the normal mode and the self refresh mode.

Figure 4:
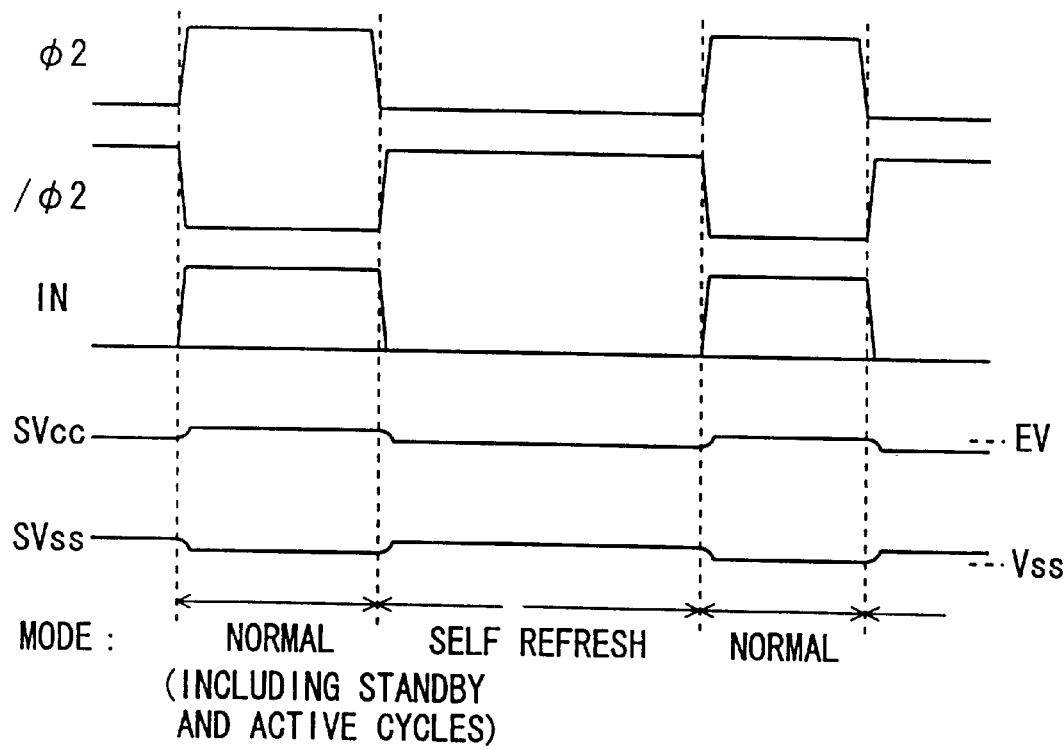
FIG. 4 is a signal waveform diagram representing an operation of the power supply circuit shown in FIG. 3.

Column-related/peripheral control circuitry 14b can previously know the logic level of input signal IN at the standby state, with DRAM macro 11 performing a dynamic operation. In response to the logic level of input signal IN at the standby state, it is determined where the inverters IV1–IV5 have their power source nodes connected. In FIG. 3, inverters IV1, IV3 and IV5 are coupled with main power supply line 1 and sub ground line 4, and inverters IV2 and IV4 with sub power supply line 3 and main ground line 2. In this condition, input signal IN in the standby state is set at a low level. Description will now be made of an operation of power supply circuit 22b shown in FIG. 3 with reference to the signal waveform diagram shown in FIG. 4.

In the normal mode for accessing the DRAM macro (including the standby cycle and the active cycle), control signal φ2 are set to a high level and control signal /φ2 to a low level, and leakage cutting MOS transistors PG1 and NG1 are both set to an on state. In this state, power supply voltage EV2 on main power supply line 1 is transmitted on sub power supply line 3 and ground voltage Vss on main ground line 2 is transmitted on sub ground line 4. Power supply voltage SVcc (VC2) on sub power supply line 3 and power supply voltage SVss on sub ground line 4 are equal to external power supply voltage EV2 and ground voltage Vss, respectively, and column-related/peripheral control circuitry 14b operates at a high speed owing to its low threshold voltage MOS transistor.

If input signal IN has its logic level fixed at a low level at a standby cycle in the normal mode, control signals φ2 and /φ2 are set at high and low levels, respectively, main power supply line 1 is connected to sub power supply line 3, and sub ground line 4 is connected to main ground line 2. In the normal mode, even at the standby cycle a current of several tens mA can be consumed. Thus, at the standby cycle, column-related/peripheral control circuitry 14b and refresh-related circuitry 14a consume current, the consumed current falls within an acceptable range and is not disadvantageous. This also applies to logic circuit 12.

When logic circuit 12 does not perform any process for more than a predetermined period of time, logic circuit 12 enters the sleep mode and DRAM macro 11 is set to the self refresh mode. In this state, control signals φ2 and /φ2 from power supply control circuit 25 are set to low and high levels, respectively, and leakage cutting MOS transistors PQ1 and NQ1 are turned off. Thus, sub power supply line 3 and sub ground line 4 are set at a high impedance state and column-related/peripheral control circuitry 14b consumes a current having a value determined by a leakage current of leakage cutting MOS transistors PQ1 and NQ1, to implement a low current consumption mode. It should be particularly noted that since the threshold voltage of leakage cutting MOS transistors PQ1 an NQ1 is larger in absolute value than that of the MOS transistor included in column-related/peripheral control circuitry 14b, leakage cutting MOS transistors PQ1 and NQ1 are deeply turned off and thus reliably suppress leakage current.

When the self refresh mode is shifted to the normal mode, control signals φ2 and /φ2 transition to high and low levels, respectively. A period of time is required for voltages SVcc (VC2) and SVss respectively on sub power supply line 3 and sub ground line 4 return to predetermined voltage levels. In shifting from the self refresh mode to the normal modes however, it must be ensured that a self refresh cycle is completely finished and the internal circuitry is completely set in a standby state. Accordingly, any actual circuit operation is performed after a predetermined period of time determined according to the specification elapses in shifting from the self refresh mode to the normal mode or from the sleep mode to the normal mode. Thus, it is not disadvantageous even if in shifting from the self refresh mode to the normal node, a certain period of time is required for the power supply voltages on sub power supply line 3 and sub ground line 4 to return to their original voltage levels, since any circuit operation is not performed during that period of time.

In the self refresh mode, power supply circuit 22c shown in FIG. 2 normally produces internal power supply voltages VC3 and VC4 (and also supplies an operating current) and refresh-related circuitry 14a operates to periodically refresh a memory cell in DRAM cell array 13. Thus, access operation is not at all negatively affected while current consumption can be reduced.

Figure 5:
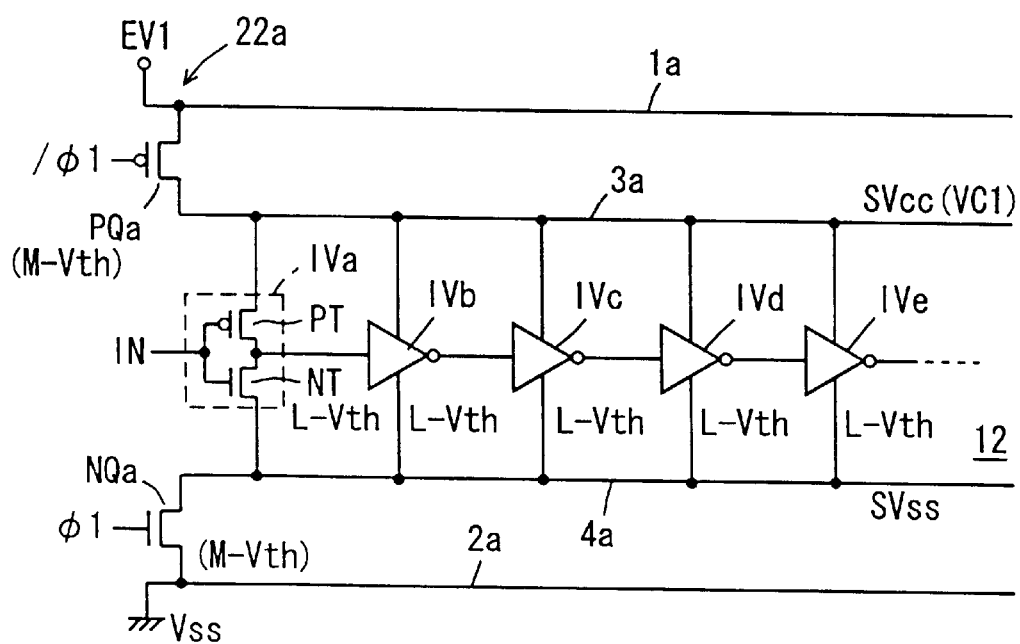
FIG. 5 schematically shows a configuration of a power supply circuit for the logic circuit shown in FIG. 2.

FIG. 5 shows a configuration of the power supply circuit 22a for the logic circuit. In FIG. 5, power supply circuit 22a includes a main power supply line 1a for transmitting external power supply voltage EV1, a sub power supply line 3a associated with main power supply line 1a, a leakage cutting p channel MOS transistor PQa responsive to the low level of control signal /φ1 for turning on to connect main power supply line 1a with sub power supply line 3a, a main ground line 2a for transmitting ground voltage Vss, a sub ground line 4a associated with main ground line 2a, and an n channel MOS transistor NQa responsive to control signal φ1 at high level for turning on to connect main ground line 2a with sub ground line 4a. Leakage cutting MOS transistors PQa and NQa are adapted to have a threshold voltage relatively larger in absolute value than the MOS transistor of a component of the logic circuit.

Although logic circuit 12 has its internal configuration varied depending on its implementing logic, logic circuit 12 in FIG. 5 is shown as five stages of inverters IVa–IVE. Inverters IVa–IVe are each a CMOS inverter including low threshold voltage MOS transistors PT and NT. Inverters IVa–IVe operate, with voltage SVcc (VC1) on sub power supply line 3a and voltage SVss on sub ground line 4a being both operating power supply voltages.

Figure 6:
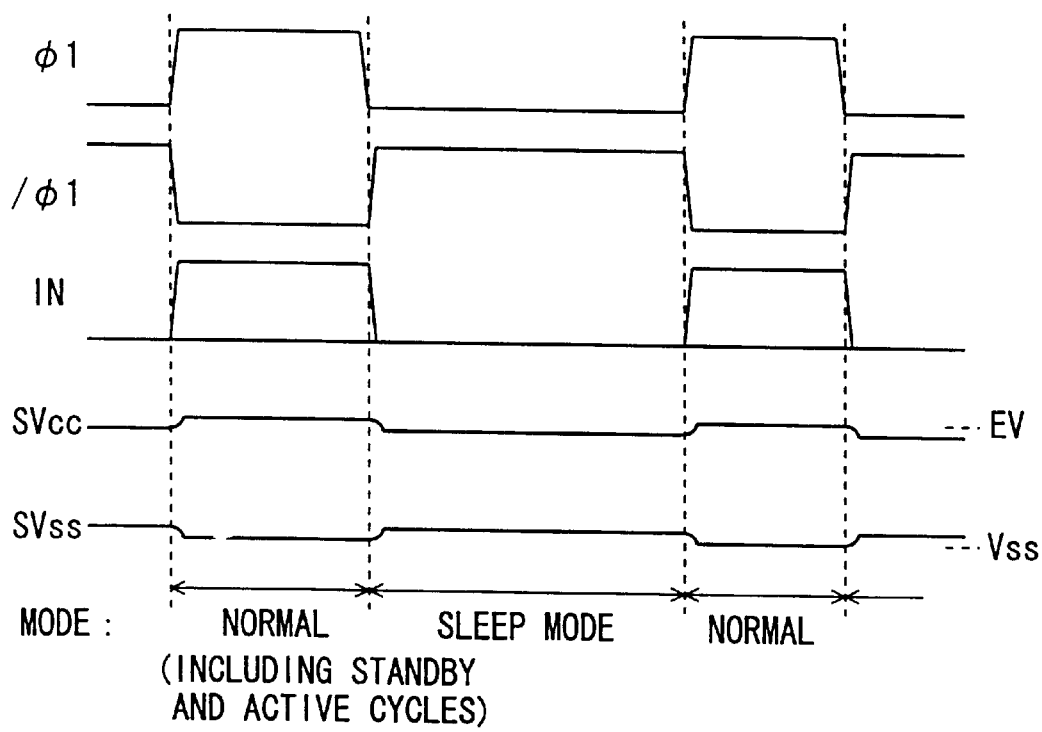
FIG. 6 is a signal waveform diagram representing an operation of the power supply circuit shown in FIG. 5.

As for logic circuit 12 performing a predetermined logical process, the voltage level of input signal IN cannot be predicted. Voltages SVcc and SVss on sub power supply line 3a and sub ground line 4a are used to reduce current consumption in the sleep mode regardless of the voltage level of input signal IN. An operation of power supply circuit 22a shown in FIG. 5 will now be described with reference to the signal waveform diagram shown in FIG. 6.

In the normal mode, control signals /φ1 and φ1 are set to low and high levels, respectively, leakage cutting MOS transistors PQa and NQa are turned on, and main power supply line 1a and main ground line 2a with low impedance are respectively connected to sub power supply line 3a and sub ground line 4a. In this state, logic circuit 12 operates fast owing to its low threshold voltage MOS transistor, and performs the predetermined logical process.

When the sleep mode is set, control signal /φ1 attains a high level and control signal φ1 attains a low level. Leakage cutting MOS transistors PQa and NQa are turned off, and sub power supply line 3a and sub ground line 4a are connected through high impedance to main power supply line 1a and main ground line 2a, respectively. Since leakage cutting MOS transistors PQa and NQa conduct small leakage current, logic circuit 12 in the sleep mode can provide a reduced current consumption. It should be particularly noted that logic circuit 12 in the sleep mode only consumes the current corresponding to a leakage current, since the data held are not refreshed in the sleep mode in the logic circuit.

When the sleep mode is turned into the normal mode, control signals φ1 and /φ1 are driven to high and low levels, respectively. Sub power supply line 3a and sub ground line 4a are connected through low impedance to main power supply line 1a and main ground line 2a, respectively. A period of time is required for voltage SVcc (VC1) on sub power supply line 3a and voltage SVss on sub ground line 4a to return to predetermined voltage levels, since the parasitic capacitances of power supply line 3a and sub ground line 4a are charged and discharged. In shifting from the sleep mode to the normal mode, however, the logic circuit is not allowed to start to operate until a predetermined period of time has elapsed after the sleep mode is exited. Thus, if a period of time is required for voltages SVcc and SVss on sub power supply line 3a and sub ground line 4a to return to the predetermined voltage levels, the timing at which logic circuit 12 starts to operate is not at all delayed. Thus any problem does not occur and its high speed operability is not degraded.

Figure 7:
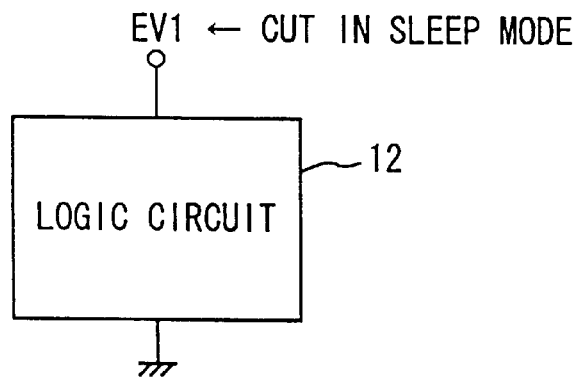
FIG. 7 schematically shows another configuration of the power supply circuit for the logic circuit shown in FIG. 2.

In the configuration shown in FIG. 5, logic circuit 12 is described as not allowing the prediction of the logic level of internal signal IN in the sleep mode. However, if logic circuit 12 can have its internal state reset to its initial state and each internal signal's state can be predicted when the sleep mode is set, the connection of a power supply node of each circuit (each inverter) and a power source line can be determined depending on the logic level of the internal signal (input signal) IN, as shown in FIG. 3. (A configuration similar to the power supply configuration shown in FIG. 3.) FIG. 7 shows another configuration of a power supply circuit for logic circuit 12. In the configuration shown in FIG. 7, logic circuit 12 receives external power supply voltage EV1 at a power supply node thereof. In the normal mode, external power supply voltage EV1 is set to a predetermined voltage level. In the sleep mode, power supply is cut (under control of an external processor). Since logic circuit 12 does not receive external power supply voltage EV1 in the sleep mode, there is no current consuming path in the internal circuit and it can thus provide no current consumption at all. The configuration shown in FIG. 7 is not particularly provided with a power supply circuit. (It is only a power supply line and control signal φ1 is not used.)

Power supply circuit 22c for the refresh-related circuitry normally transmits power supply voltages VC3 and VC4 to the refresh-related circuitry and the DRAM cell array. This power supply circuit includes a circuit producing necessary voltages (the bit line precharging voltage and the cell plate voltage), and an internal voltage down converter, if required, and it produces internal power supply voltages VC3 and VC4 in the normal mode and the sleep mode.

Power supply circuit 22c for the refresh-related circuitry may have a hierarchical power supply configuration, although it should be noted that the leakage cutting MOS transistors are turned on during the refresh cycle in the self refresh mode.

While in the description provided above, voltage SVcc of sub power supply lines 3a and 3b in the sleep and self refresh modes are set at a voltage level slightly lower than the power supply voltage, the sub power supply lines 3a and 3b may be discharged down to the ground voltage level.

First Modification

Figure 8:
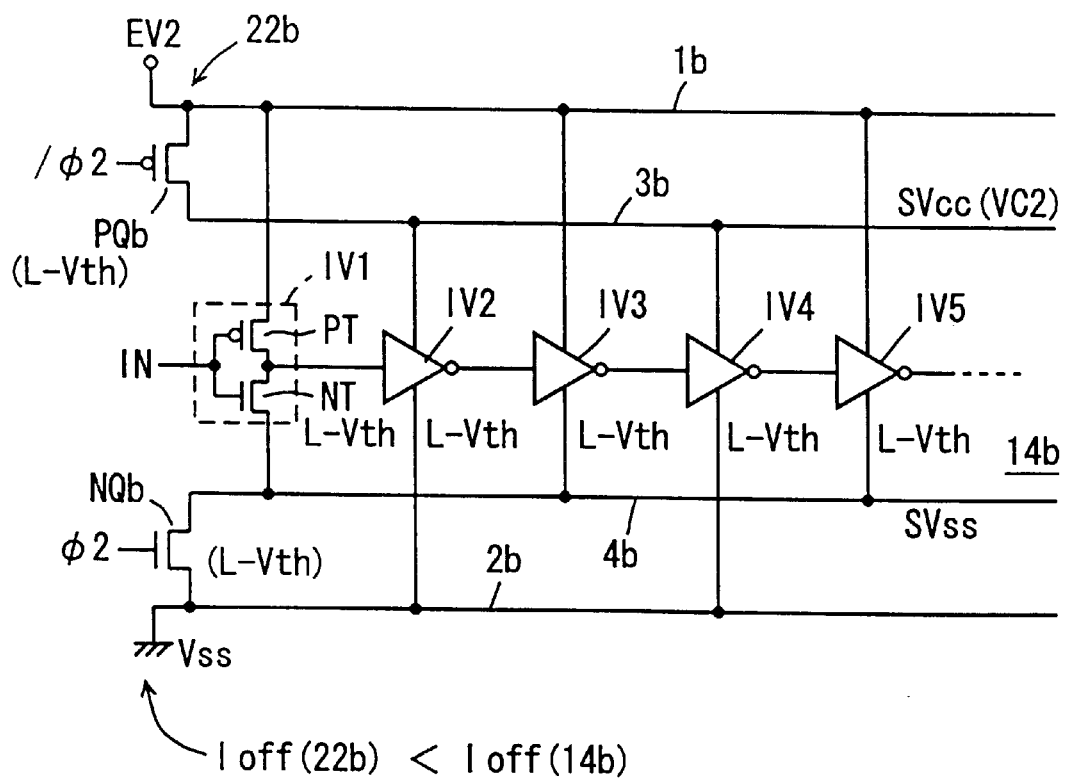
FIG. 8 shows a configuration of a first modification of the power supply circuit for the peripheral circuitry according to the first embodiment of the present invention.

FIG. 8 shows a configuration of a first modification of the first embodiment of the present invention. FIG. 8 shows a configuration of power supply circuit 22b for column-related peripheral control circuitry 14b. Power supply circuit 22b shown in FIG. 8 uses MOS transistors PQb and NQb of a low threshold voltage (L-Vth) as the leakage cutting MOS transistors. P channel MOS transistor PQb is connected between main power supply line 1b and sub power supply line 3b and n channel MOS transistor NQb is connected between main ground line 2b and sub ground line 4b. Leakage cutting MOS transistors PQb and NQb has the same threshold voltage (L-Vth) as MOS transistors PT and NT of column-related/peripheral control circuitry 14b. Leakage cutting MOS transistors PQb and NQb have their respective gates receiving control signals /φ2 and φ2 inactivated in the self refresh mode to turn leakage cutting MOS transistors PQb and NQb off.

Leakage cutting MOS transistors PQb and NQb have a gate width adjusted so that an off leak current Ioff (22b) flowing when leakage cutting MOS transistors PQb and NQb are turned off, is smaller than a total leakage current Ioff (14b) flowing through sub power supply line 3b and sub ground line 4b. An off leak current flowing in column-related/peripheral control circuitry 14b through sub power supply line 3b is equal to an off leak current of p channel MOS transistor PQb, and when column-related/peripheral control circuitry 14b causes an off leak current larger than MOS transistor PQb, voltage SVcc on sub power supply line 3b drops in voltage level, column-related/peripheral control circuitry 14b MOS transistor PT has its gate and source put in a stronger, reverse-biased state, the off leak current is reduced, and as a result the circuit's leakage current is determined by the off leak current of MOS transistor PQb. This also applies to leakage cutting n channel MOS transistor NQb.

In the normal mode, leak age cutting MOS transistors PQb and NQb are both turned on. In column-related/peripheral control circuitry 14b of FIG. 8, inverters IV1–IV5 do not all charge or discharge simultaneously but operate with a predetermined delay time. Thus, reducing the gate width of MOS transistors PQb and NQb to decrease their off leak currents does not adverse any negative effect on circuit operation in the normal mode.

Figure 9:
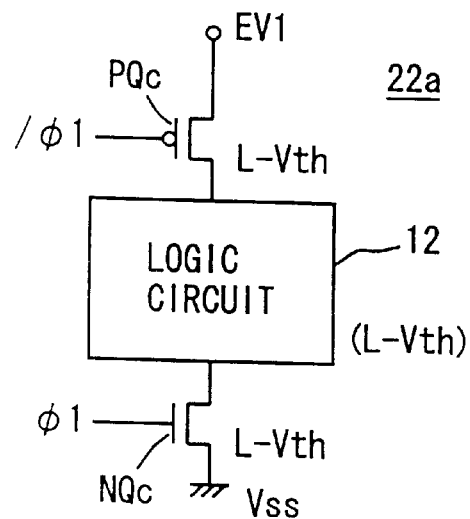
FIG. 9 schematically shows a configuration of a first modification of the power supply circuit for the logic circuit according to the first embodiment of the present invention.

FIG. 9 shows a configuration of power supply circuit 22a for logic circuit 12. Power supply circuit 22a shown in FIG. 9 includes a p channel MOS transistor PQc responsive to control signal /φ1 of low level for turning on to transmit external power supply voltage EV1 to logic circuit 12 as an operating power supply voltage, and an n channel MOS transistor NQc responsive to control signal φ1 of high level for turning on to supply ground voltage Vss to logic circuit 12 as the other operating power supply voltage. Logic circuit 12 includes a MOS transistor of a low threshold voltage (L-Vth) as a component thereof, and leakage cutting MOS transistors PQc and NQc are similar to the MOS transistors included in logic circuit 12, corresponding to low threshold voltage (L-Vth) MOS transistors.

In the configuration shown in FIG. 9, MOS transistors PQc and NQc provide an off leak current smaller than a total off leak current in logic circuit 12. Thus, in the configuration of power supply circuit 22a shown in FIG. 9, when logic circuit 12 is stopped from operating in the sleep mode, its off leak current is determined by leakage cutting MOS transistors PQc and NQc. Thus, in the sleep mode a reduced off leak current can be provided and a low current consumption can be achieved.

In the normal mode, leakage cutting MOS transistors PQc and NQc are turned on to stably supply the logic circuit 12 with an operating current.

It should be noted that a power supply circuit having the same configuration as shown in FIG. 8 can be employed if logic circuit 12 in the sleep mode has an internal circuit's node set to its initial state and each internal circuit's node in the sleep mode has a voltage level which can be predetermined.

Second Modification

Figure 10:
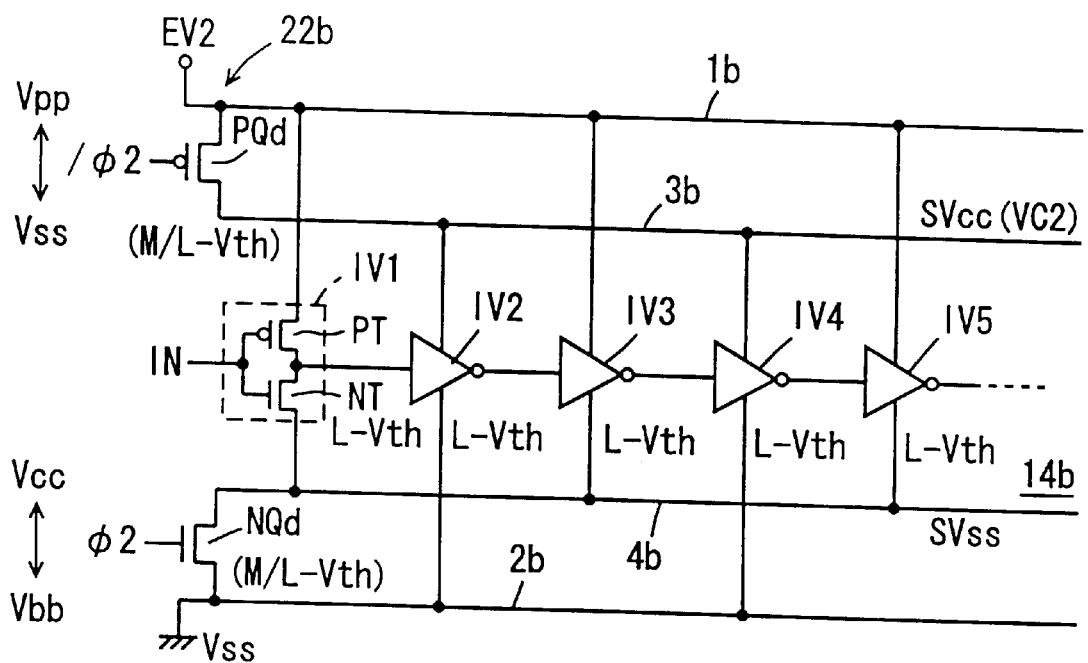
FIG. 10 shows a configuration of a second modification of the power supply circuit for the peripheral circuitry of the first embodiment of the present invention.

FIG. 10 shows a configuration of a second modification of the first embodiment of the present invention. FIG. 10 shows a configuration of power supply circuit 22b for a column-related/peripheral control circuitry. In power supply circuit 22b, a leakage cutting p channel MOS transistor PQd is connected between main power supply line 1b and sub power supply line 3b, and a leakage cutting n channel MOS transistor NQd is provided between main ground line 2b and sub ground line 4b. Leakage cutting MOS transistors PQd and NQd may be low threshold voltage ((L-Vth) MOS transistors or intermediate threshold voltage ((M-Vth) MOS transistors having a threshold voltage larger in absolute value than the (L-Vth) MOS transistors. Leakage cutting MOS transistor PQd receives at its gate a control signal /ϕ2 varying between ground voltage Vss and a boosted voltage Vpp higher than external power supply voltage EV2. Leakage cutting n channel MOS transistor NQd receives at its gate a control signal ϕ2 varying between power supply voltage Vcc and a negative voltage Vbb lower than ground voltage Vss. Power supply voltage Vcc may be equal in voltage level to external power supply voltage EV2.

In the self refresh mode, control signal /ϕ2 is set to the boosted voltage Vpp level and control signal ϕ2 is set to the negative voltage Vbb voltage level. Thus, leakage cutting MOS transistors PQd and NQd can be set their respective gates and sources and thus turn off more deeply in a deep, reverse-biased state to provide a further reduced off leak current.

In the normal mode, control signal /ϕ2 is set to the ground voltage Vss level and control signal ϕ2 is set to the power supply voltage Vcc (or external power supply voltage EV2) voltage level. Thus, in the normal mode, sub power supply line 3b and sub ground line 4b are connected through low impedance to main power supply line 1b and main ground line 2b, and column-related/peripheral control circuitry 14b operates at high speed.

It should be noted that power supply circuit 22a for the logic circuit may have a configuration similar to that shown in FIG. 10 or FIG. 9. By providing control signals ϕ1 and /ϕ1 of an increased amplitude, the leakage cutting MOS transistors are set in a deeper off state in the sleep mode.

Figure 11:
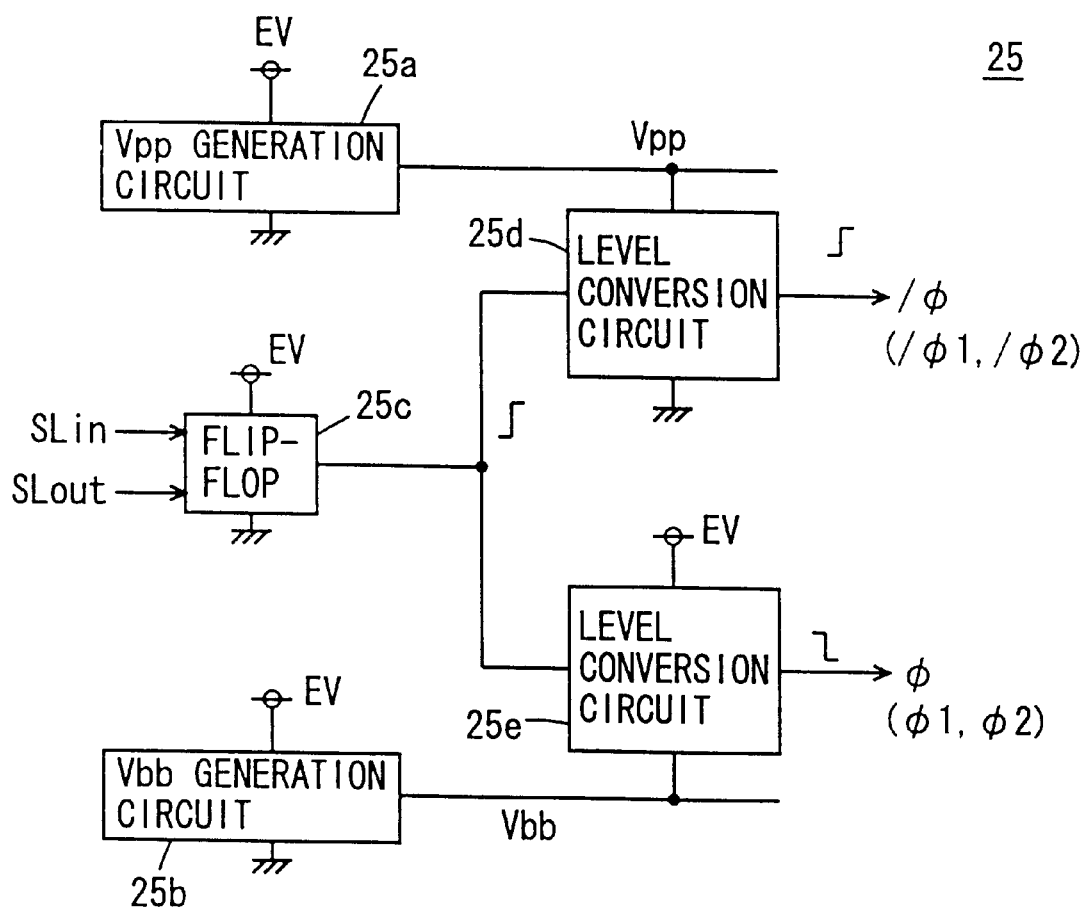
FIG. 11 schematically shows a configuration of a power supply control circuit for the power supply circuit shown in FIG. 10.

FIG. 11 schematically shows a configuration of power supply control circuit 25 in the second modification. In FIG. 11, power supply control circuit 25 includes a Vpp generation circuit 25a receiving external power supply voltage EV (EV1, EV2) and generating a boosted voltage Vpp higher than external power supply voltage EV, a Vbb generation circuit 25b receiving external power supply voltage EV and generating a negative voltage Vbb lower than ground voltage Vss, a flipflop 25c set in response to a sleep mode start instructing signal SLin and reset in response to a sleep mode end instructing signal SLout, a level conversion circuit 25d converting a signal output from flip-flop 25c in level to output control signal /ϕ (/ϕ1, /ϕ2), and a level conversion circuit 25e converting a signal output from flip-flop 25c in level to produce control signal ϕ (ϕ1, ϕ2).

Flip-flop 25c operates with external power supply voltage EV being one operating power supply voltage. When flip-flop 25c outputs a signal of high level, level conversion circuit 25d converts the high level to the boosted voltage Vbb level for output. Level conversion circuit 25e converts a signal output from flip-flop 25c to the negative voltage Vbb level to produce control signal ϕ. The low level of control signal /ϕ is the ground voltage Vss level and the high level of control signal ϕ is the external power supply voltage EV level.

In power supply control circuit 25 of FIG. 11, the portion generating control signals ϕ2, /ϕ2 for the power supply circuit for the DRAM macro and the circuit generating control signals /ϕ1 and ϕ1 for the power supply circuit for the logic circuit may be provided separately and their respective levels of external power supply voltage may be adjusted.

Figure 12:
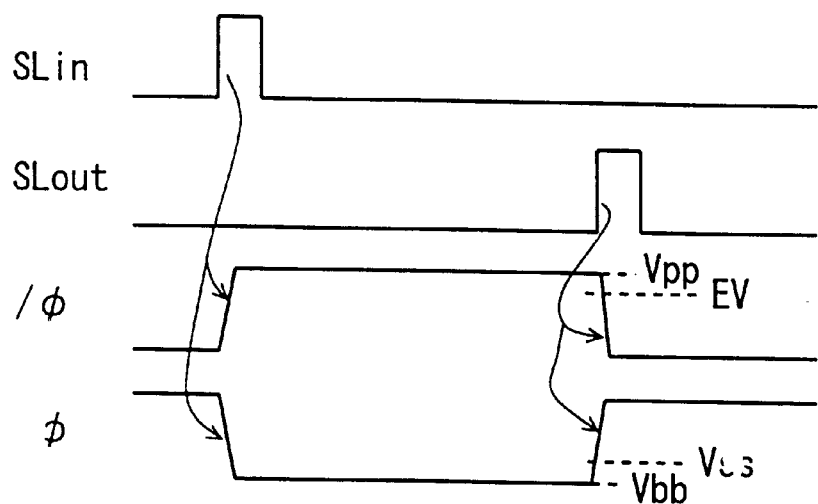
FIG. 12 is a signal waveform diagram representing an operation of the power supply control circuit shown in FIG. 11.

If the DRAM macro and the logic circuit are provided with their respective power supply control circuits 25 separately, the power supply control circuit provided for the DRAM macro may be configured to use a word line boosting, high voltage Vpp used in the DRAM macro and a backgate bias Vbb for biasing an array substrate region. An operation of power supply control circuit 25 shown in FIG. 11 will now be described with reference to the signal waveform diagram shown in FIG. 12.

When the sleep mode is entered, sleep mode start instructing signal SLin is applied in the form of a one shot pulse, flip-flop 25c is set and outputs a signal of high level. Responsively, control signal /ϕ (/ϕ1, /ϕ2) from level conversion circuit 26d is driven to boosted voltage Vpp higher in level than external power supply voltage EV. Level conversion circuit 25e responds to the rise of the signal output from flip-flop 25 for driving control signal ϕ to the negative voltage Vbb level.

Flip-flop 25c, receiving external power supply voltage EV, maintains its state. When the sleep mode is completed, sleep mode end instructing signal SLout is applied in the form of a one shot pulse and flip-flop 25c outputs a signal of low level. Responsively, control signal /ϕ (/100 1, /ϕ2) from level conversion circuit 25d attains a low level corresponding to the ground voltage Vss level. Level conversion circuit 25e responds to the rise of the signal output from flip-flop 25 for driving control signal ϕ to the external power supply voltage EV level.

In the sleep mode (the self refresh mode), the leakage cutting MOS transistors can be set in a deeper off state to provide a further reduced off leak current and hence a further reduced current consumption.

It should be noted that if level conversion is not performed in the first embodiment, complementary control signals can be extracted from flip-flop 25c to produce control signals ϕ (ϕ1, ϕ2) and /ϕ (/ϕ1, /ϕ2) for the leakage cutting MOS transistors.

Level conversion circuits 25d and 25e are configured, e.g., of a well-known, latch-type CMOS conversion circuit.

Third Modification

Figure 13:
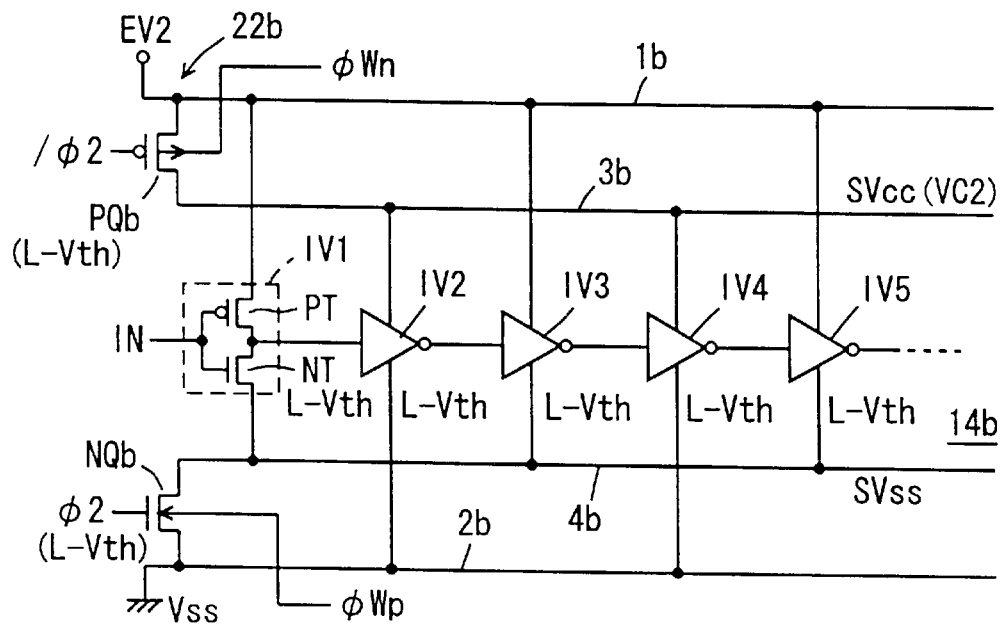
FIG. 13 shows a configuration of a third modification of the power supply circuit for the peripheral circuitry according to the first embodiment of the present invention.

FIG. 13 schematically shows a configuration of a third modification of the first embodiment of the present invention. In the configuration shown in FIG. 13, leakage cutting p channel MOS transistor PQb provided between main and sub power supply lines 1b and 3b has a backgate (an n well) receiving a voltage ϕwn, and leakage cutting n channel MOS transistor NQb provided between main and sub ground lines 2b and 4b has a backgate (a p well) receiving a well voltage ϕwp. Leakage cutting MOS transistors PQb and NQb are low threshold voltage (L-Vth) MOS transistors.

Well voltages ϕwn and ϕwp of leakage cutting MOS transistors PQb and NQb are varied depending on the mode of operation. More specifically, in the sleep mode (the self refresh mode), leakage cutting MOS transistor PQb backgate (n well) receives the well voltage ϕwn set to the boosted voltage Vpp level higher than external power supply voltage EV2 and leakage cutting n channel MOS transistor NQb (p well) receives at the backgate the well voltage ϕwp set to the negative voltage Vbb level. Thus, leakage cutting MOS transistors PQb and NQb has a deep back-gate bias and a threshold voltage increased in absolute value, resulting in a suppressed leakage current.

In the normal mode, well voltage $\phi$wn is set to the external power supply voltage EV2 voltage level and well voltage $\phi$wp to the ground voltage Vss level. Thus, in the normal mode, leakage cutting MOS transistors PQb and NQb can operate as low threshold voltage MOS transistors, set in a deep ON state to supply a sufficient operating current.

Figure 14:
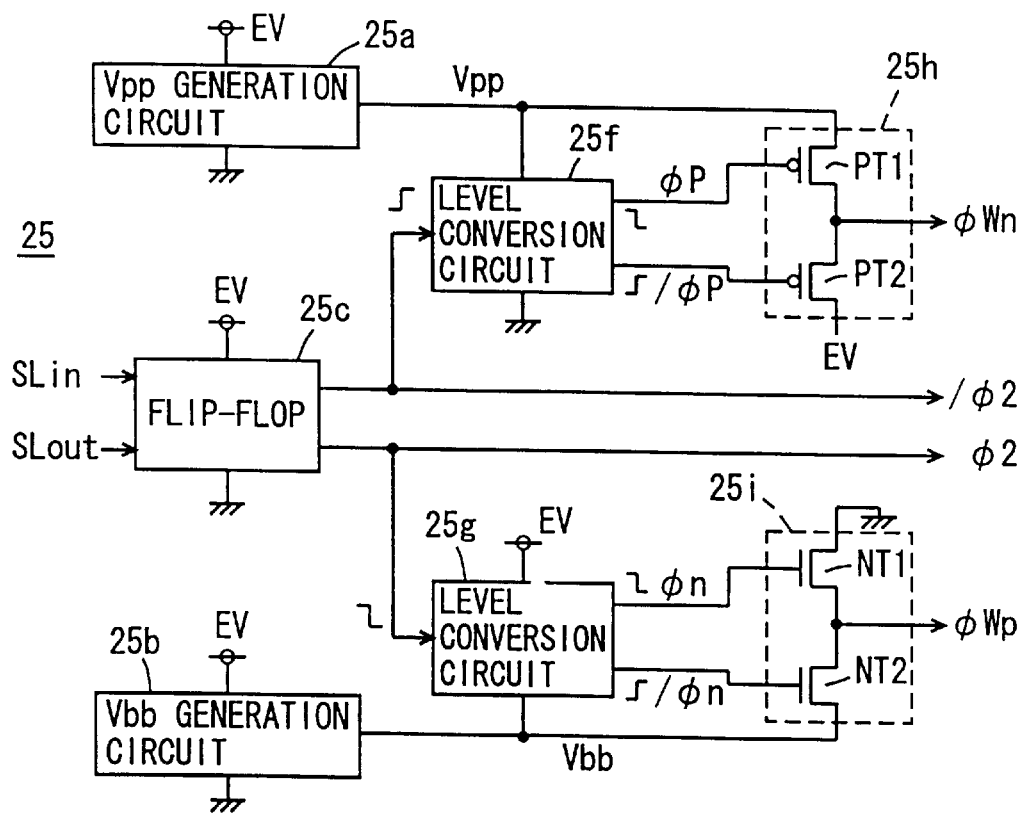
FIG. 14 schematically shows a configuration of a power supply control circuit for the power supply circuit shown in FIG. 13.

FIG. 14 schematically shows a configuration of power supply control circuit 25 of the third embodiment of the first embodiment of the present invention. In FIG. 14, power supply control circuit 25 includes a Vpp generation circuit 25a receiving external power supply voltage EV and ground voltage Vss and generating boosted voltage Vpp higher than external power supply voltage EV, a Vbb generation circuit 25b receiving external power supply voltage EV and ground voltage Vss and generating negative voltage Vbb lower than ground voltage Vss, a flipflop 25c set in response to sleep mode start instructing signal SLin from the logic circuit and reset in response to sleep mode end instructing signal SLout from the logic circuit to generate control signals /$\phi$ and $\phi$ having an amplitude of external power supply voltage EV, a level conversion circuit 25f receiving boosted voltage Vpp from Vpp generation circuit 25a and the ground voltage as an operating power supply voltage, for converting a level of control signal /$\phi$ from flip-flop 25c to generate a switching control signals $\phi$p and /$\phi$p complementary to each other, a level conversion circuit 25g receiving external power supply voltage EV and negative voltage Vbb from Vbb generation circuit 25b as an operating power supply voltage, for converting a level of control signal $\phi$ from flip-flop 25c to produce switching control signals $\phi$n and /$\phi$n complementary to each other, a switch circuit 25h responsive to switching control signals $\phi$p and /$\phi$p from level conversion circuit 25f for selecting one of boosted voltage Vpp and external power supply voltage EV to produce well potential $\phi$wn, and a switch circuit 25i responsive to control signals $\phi$ and /$\phi$ and from level conversion circuit 25e for selecting one of ground voltage Vss and negative voltage Vbb to produce well voltage $\phi$wp.

When control signal /$\phi$ from flip-flop 25c attains a high level, level conversion circuit 25f sets switching control signal $\phi$p to the ground voltage level and switching control signal /$\phi$p to the boosted voltage Vpp level. When control signal $\phi$ from flip-flop 25c falls to a low level, level conversion circuit 25g sets switching control signal $\phi$n to the negative voltage Vpp level and switching control signal /$\phi$n to the external power supply voltage EV level.

Switch circuit 25h includes a p channel MOS transistor PT1 responsive to switching control signal $\phi$p2 of low level for turning on to transmit boosted voltage Vpp, and a p channel MOS transistor PT2 responsive to switching control signal /$\phi$p of low level from the level conversion circuit for turning on to transmit external power supply voltage EV.

Figure 15:
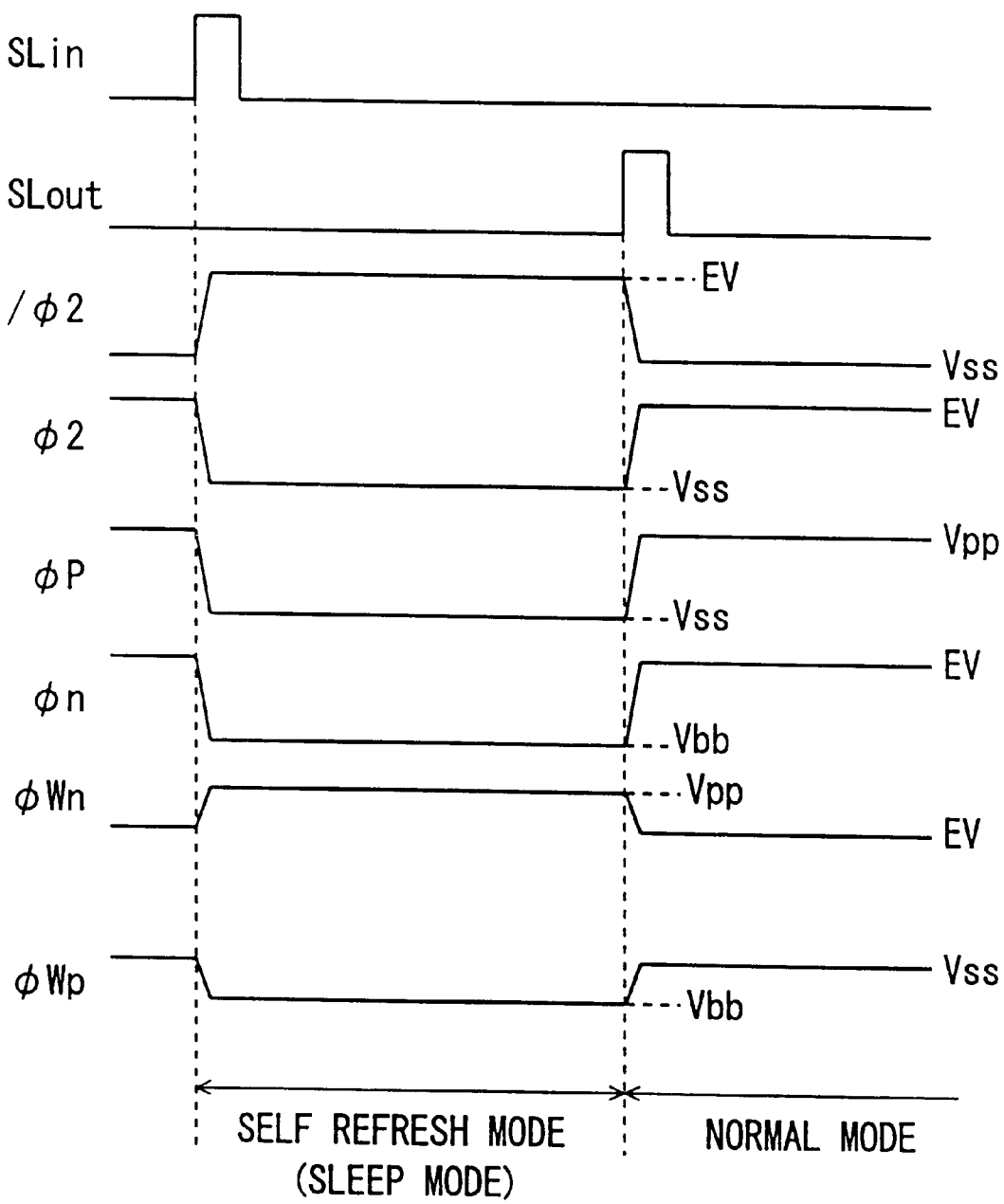
FIG. 15 is a signal waveform diagram representing an operation of the power supply control circuit shown in FIG. 14.

Switch circuit 25i includes an n channel MOS transistor NT1 responsive to control signal $\phi$n of high level from level conversion circuit 25e for turning to transmit ground voltage Vss, and an n channel MOS transistor NT2 responsive to switching control signal /$\phi$n of high level from level conversion circuit 25e for turning on to transmit negative voltage Vbb. An operation of power supply control circuit 25 shown in FIG. 14 will now be described with reference to the signal waveform diagram shown in FIG. 15.

When the self refresh mode (the sleep mode) is entered, sleep mode start instructing signal SLin is activated in the form of a one shot pulse. Responsively, flip-flop 25c raises control signal /$\phi$ from the ground voltage Vss level to the external power supply voltage EV level and lowers control signal $\phi$ from the external power supply voltage EV level to the ground voltage Vss level. When control signal /$\phi$ goes high, level conversion circuit 25f drives switching control signal $\phi$p from the boosted voltage Vpp level to the ground voltage Vss' level. Level converting circuit 25f responds to the fall of control signal $\phi$ from flip-flop 25c for dropping switching control signal On from the external power supply voltage EV level to the negative voltage Vbb level.

Responsively, in switch circuit 25h, MOS transistor PT1 is turned on and MOS transistor PT2 is turned off, and boosted voltage Vpp is transmitted as well voltage $\phi$wn to p channel MOS transistor PT1. While boosted voltage Vpp is output as the well voltage Awn, MOS transistor PT2 also has the same voltage at its gate and source, and is maintained off.

In switch circuit 25i, MOS transistor NT1 is turned off and MOS transistor NT2 is turned on, and negative voltage Vbb is output as the well voltage $\phi$wp. This state is maintained while the self refresh mode (the sleep mode) is maintained.

When the self refresh mode or sleep mode is completed, sleep mode end instructing signal SLout is driven to a high level in the form of a one shot pulse and flip-flop 25c raises control signal $\phi$ to the external power supply voltage EV level and lowers control signal /$\phi$ to the ground voltage Vss level. Responsively, in level conversion circuit 25f, switching control signal $\phi$p attains the boosted voltage Vpp level and the complementary switching control signal /$\phi$p attains the ground voltage Vss level. Thus, in switch circuit 25h, MOS transistor PT1 is turned off and MOS transistor PT2 is turned on and external power supply voltage EV is output as the well voltage $\phi$w2 via MOS transistor PT2. In this state, MOS transistor PT1 has the same voltage at its source and gate, and is maintained off.

Level conversion circuit 25b responds to the rise of control signal $\phi$ for raising switching control signal $\phi$n from negative voltage Vbb to the external power supply voltage EV level and dropping complementary, switching control signal /$\phi$n from external power supply voltage EV to the negative voltage Vbb level. Thus, in switch circuit 25i, MOS transistor NT1 is turned on and MOS transistor NT2 is turned off and ground voltage Vss is transmitted as the well voltage $\phi$wp via MOS transistor NT1. While well voltage $\phi$wp is set at the ground voltage level, MOS transistor NT2 also has the same voltage at its gate and source receiving, and is maintained off.

In the normal mode, well voltages $\phi$wn and $\phi$wp attain the external power supply voltage EV level and the ground voltage Vss level, respectively, to allow leakage cutting MOS transistors PQb and NQb to operate as low threshold voltage MOS transistors.

It should be noted that with the configuration of the power supply control circuit shown in FIG. 14 also, the DRAM macro and the logic circuit may be provided with separate power supply control circuits.

In the logic circuit, the circuit generating signals SLin and SLout for controlling a mode of operation must receive an instruction signal from an external processor and normally operates and this circuit portion thus normally receives an external power supply voltage.

It should be noted that the second and third modifications may be combined to convert a voltage level of a control signal and a well voltage level in the self refresh mode.

As described above, according to the first embodiment of the present invention, in the sleep mode a power source voltage can be supplied only to the portion related to the operation of refreshing the data stored in a memory cell while the other circuits can be prevented from receiving the power source voltage (an operating current), so that current consumption can be reduced in the standby state while access time is not increased.

Second Embodiment

Figure 16:
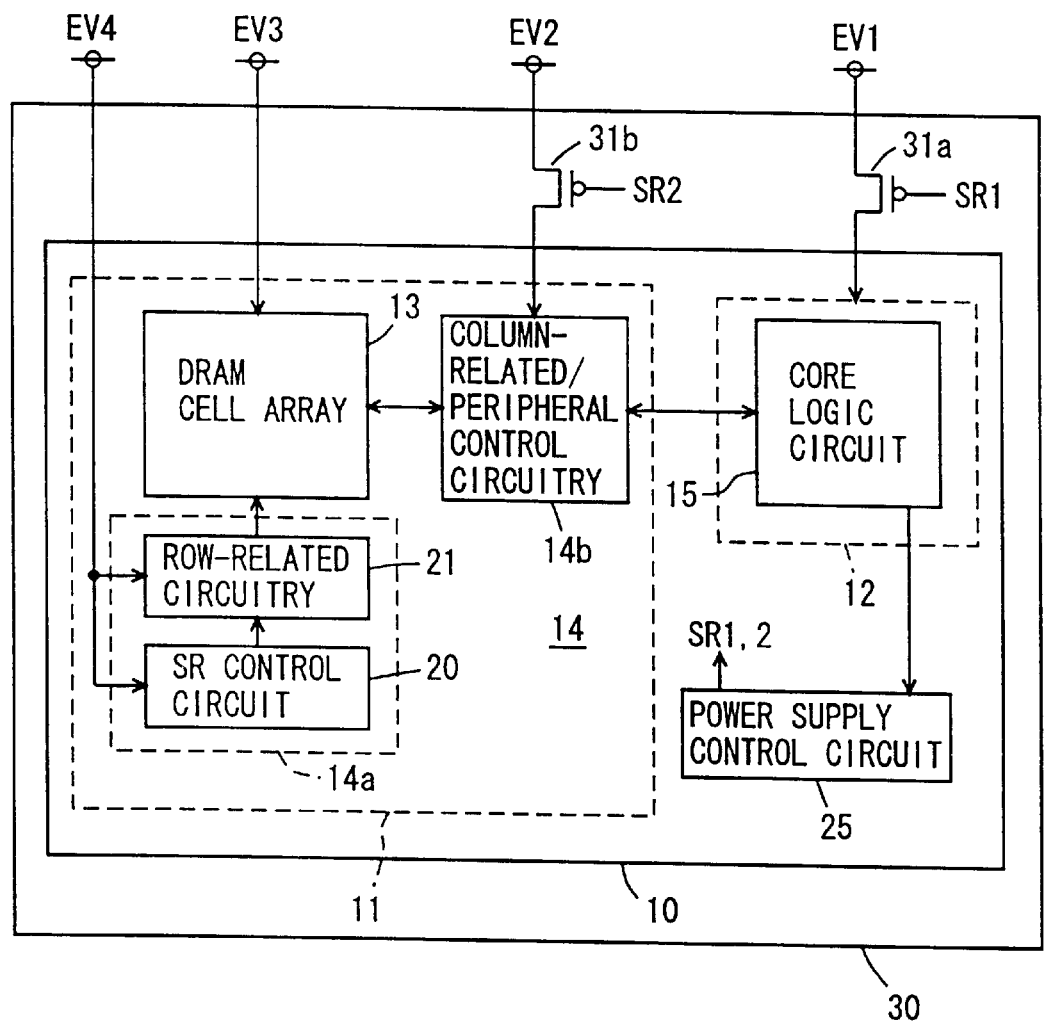
FIG. 16 schematically shows an entire configuration of a semiconductor device according to a second embodiment of the present invention.

FIG. 16 schematically shows an entire configuration of a semiconductor device according to a second embodiment of the present invention. In FIG. 16, a semiconductor device 10 is formed on an LSI chip 30. Logic circuit 12 surrounds DRAM macro 11. A power supply transistor 31a for logic circuit 12 and a power supply transistor 31b for column-related/peripheral control circuitry 14b of DRAM macro 11 are provided external to logic circuit 12 on LSI chip 30. Power supply transistors 31a and 31b are p channel MOS transistors responsive to self refresh mode designation signals SR1 and SR2 from power supply control circuit 25 for selectively turning on to supply external power supply voltages EV1 and EV2 to logic circuit 12 and column-related/peripheral control circuitry 14b, respectively.

DRAM cell array 13 normally receives external power supply voltage EV3 and refresh-related circuitry 14a normally receives external power supply voltage EV4. External power supply voltages EV1–EV4 may each have a different power supply voltage level, or some of the external power supply voltages may have the same voltage level.

Figure 17:
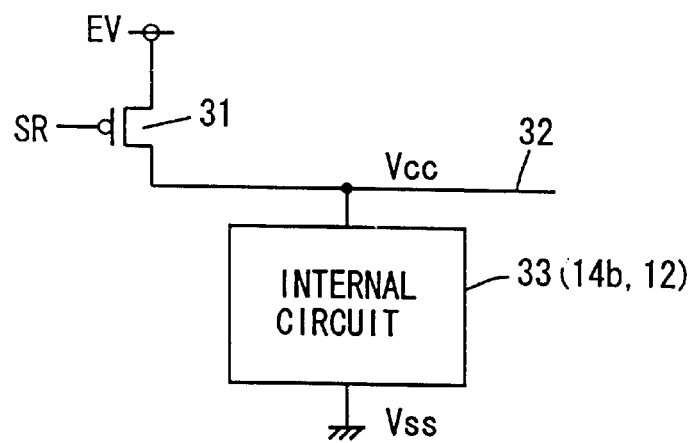
FIG. 17 schematically shows a configuration of an internal power supply line in the second embodiment of the present invention.
Figure 18:
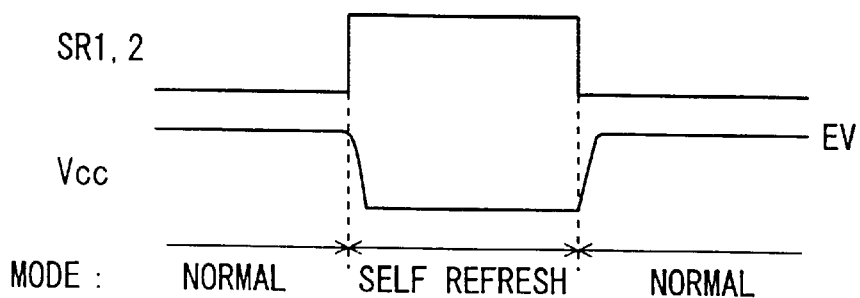
FIG. 18 is a signal waveform diagram representing an operation of the power supply control circuit of the semiconductor device shown in FIG. 16.

FIG. 17 schematically shows a power supply configuration for logic circuit 12 and column-related/peripheral control circuitry 14b. In FIG. 17, logic circuit 12 and column-related/peripheral control circuitry 14b are represented as an internal circuit 33. A power supply line 32 for internal circuit 33 receives external power supply voltage EV via power supply transistor 31. The other power source node of internal circuit 33 is a ground node receiving ground voltage Vss. An operation of the device shown in FIGS. 16 and 17 will now be described with reference to the signal waveform diagram shown in FIG. 18.

In the normal mode of operation, in which logic circuit 12 operates and also accesses DRAM macro 11, self refresh mode (sleep mode) designation signal SR (SR1 and SR2) is at a low level and power supply transistors 31a and 31b are turned on. In this state, logic circuit 12 receives external power supply voltage EV1 and column-related/peripheral control circuitry 14b receives external power supply voltage EV2. DRAM cell array 13 and refresh-related circuitry 14a are supplied with external power supply voltages EV3 and EV4, respectively. With components internal to the semiconductor device being low threshold voltage MOS transistors, high speed operation is achieved.

In the self refresh mode (the sleep mode), self refresh mode (sleep mode) designation signal SR (SR1, SR2) attains a high level corresponding to the external power supply voltage level and power supply transistors 31a and 31b are turned off. In this state, logic circuit 12 and column-related/peripheral control circuitry 14b are not supplied with power supply voltage and operating power supply voltage Vcc supplied thereto drops to the ground voltage level. In this state, logic circuit 12 and column-related/peripheral control circuitry 14b hardly consume current.

Refresh-related circuitry 14a and DRAM cell array 13 perform refresh operation at predetermined time intervals only in the refresh mode and thus current consumption is reduced. In shifting from rle self refresh mode (the sleep mode) to the normal mode of operation, a period of time is required before operating power supply voltage Vcc for logic circuit 12 and column-related/peripheral control circuitry 14b returns to a voltage level, while it is also determined by the specification that in shifting from the self refresh mode (the sleep mode) to the normal mode of operation, after the self refresh mode (the sleep mode) is completed a period of time be provided before the semiconductor device internally starts to operate (i.e., a specification value). Thus the fast operability of the device is not negatively affected even if a period of time is required for recovering power supply voltage Vcc of logic circuit 12 and column-related/peripheral control circuitry 14b.

It should be noted that in the configuration shown in FIG. 16, in place of power supply transistors 31a and 31b, an external processor or the like may be used to stop the supply of external power supply voltages EV1 and EV2.

It should be noted that external power supply voltage EV3 is, e.g., 2.5V and is used to produce boosted voltage Vpp and negative voltage Vbb and also used as a power supply voltage for a sense amplifier. External power supply voltages EV1, EV2 and EV4 are, e.g., 1.5V. Logic circuit 12 receives at a signal input/output portion thereof a voltage of 2.5V as an operating power supply voltage. It should be noted that in the configuration shown in FIG. 16, the two power supply voltages for logic circuit 12 are represented as a single, external power supply voltage EV1.

First Modification

Figure 19:
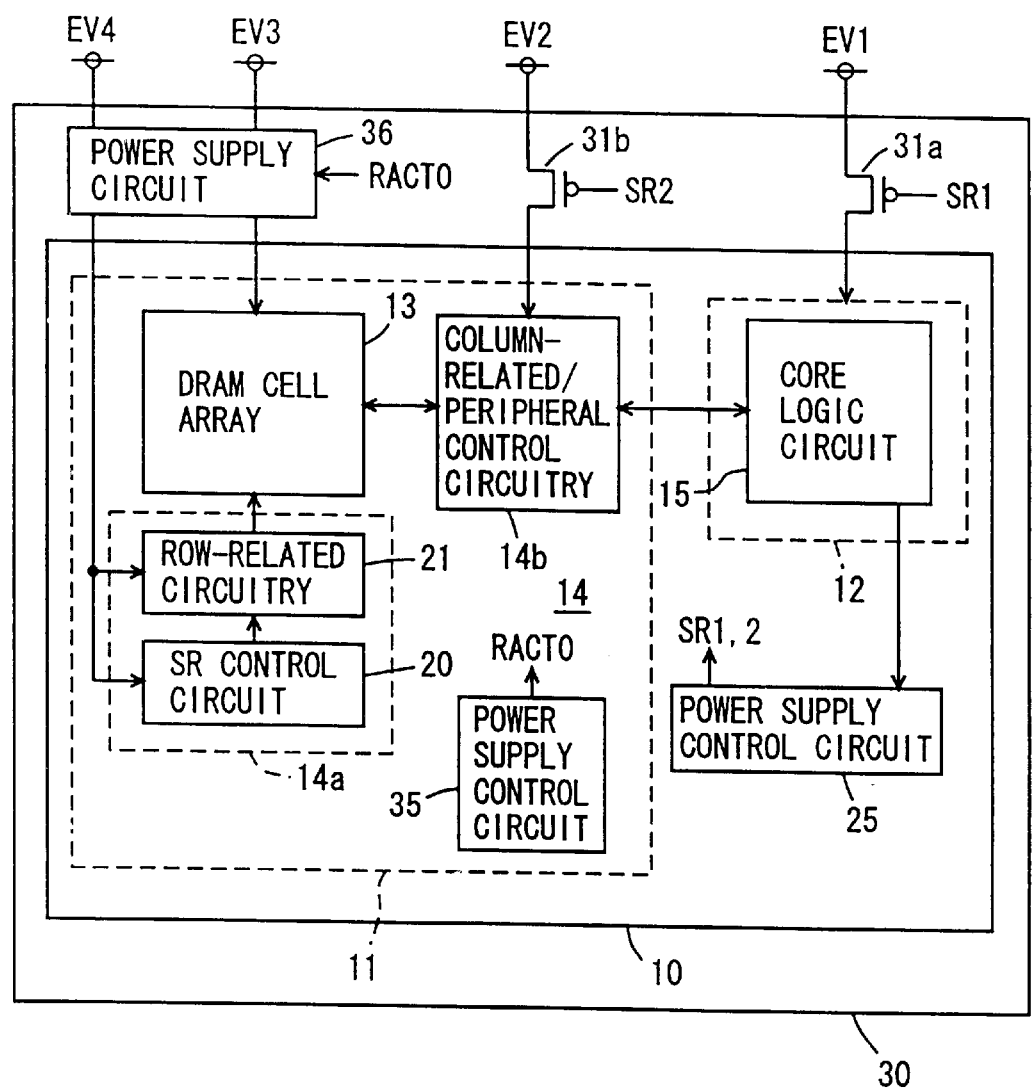
FIG. 19 schematically shows a configuration of a first modification of the second embodiment of the present invention.

FIG. 19 schematically shows a configuration of a first modification of the second embodiment of the present invention. In the configuration shown in FIG. 19, DRAM cell array 13 and refresh-related circuitry 14a are provided with a power supply circuit 36 having its state (or impedance) switched in response to an activation control signal RACT from a power supply control circuit 35. The other configuration is the same as in FIG. 16.

Power supply control circuit 35 operates under control of SR control circuit 20 to drive control signal RACT0 to tn active high level when refresh operation is actually performed in the self refresh mode. When activation control signal RACT0 goes high, power supply circuit 36 is put in low impedance state. In the normal mode of operation, power supply circuit 36 maintains the low impedance state.

Figure 20:
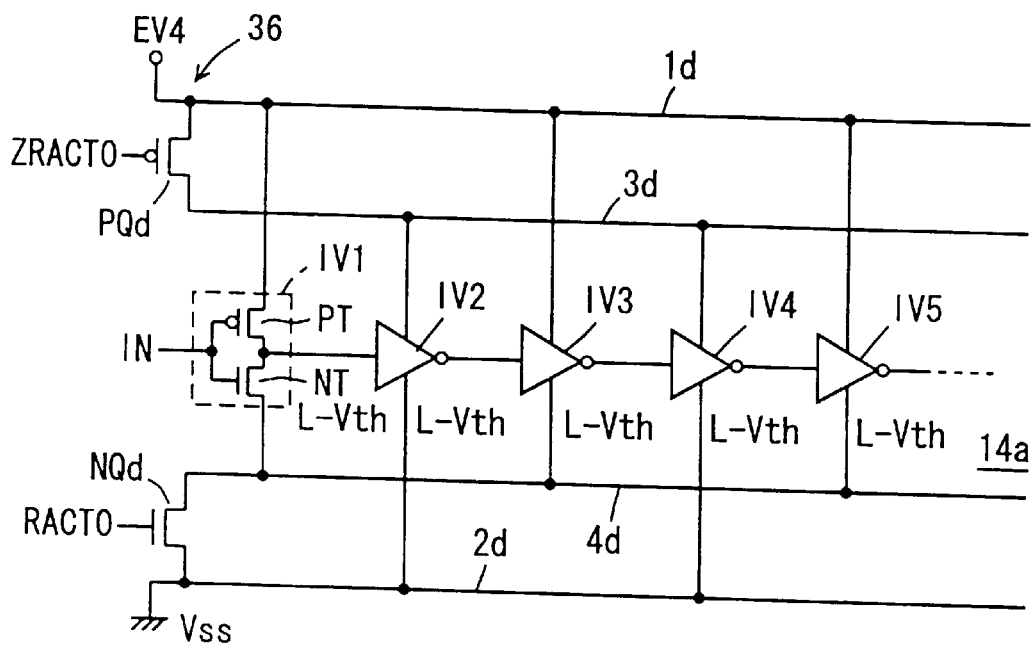
FIG. 20 shows a configuration of the power supply circuit shown in FIG. 19.
Figure 21:
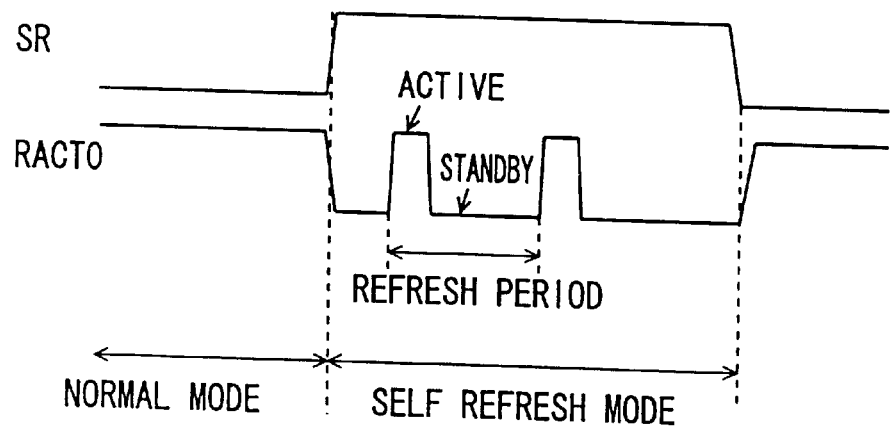
FIG. 21 is a signal waveform diagram representing an operation of the power supply circuit shown in FIG. 20.

FIG. 20 schematically shows a configuration of power supply circuit 36 shown in FIG. 19. In FIG. 20, power supply circuit 36 includes a p channel MOS transistor PQd responsive to a control signal ZRACT0 of low level for turning on to connect main power supply line 1d with sub power supply line 3d, and an n channel MOS transistor NQd responsive to control signal RACT of high level for turning on to connect main ground line 2d and sub ground line 4d together.

Where refresh-related circuitry 14a has a power supply node thereof connected is determined depending on the logic level of input signal IN in the standby state. In FIG. 20 also, 5-stage inverters IV1–IV5 are representatively shown as refresh-related circuitry 14a. Leakage cutting MOS transistors PQd and NQd have a threshold voltage adapted to be relatively higher than (L-Vth) MOS transistors PT and NT. An operation of the configuration shown in FIGS. 19 and 20 will now be described with reference to the signal waveform diagram shown in FIG. 21.

In the normal mode of operation, control signal RACT0 is at a high level and control signal ZRACT0 is at a low level. Leakage cutting MOS transistors PQd and NQd are both turned on and sub power supply line 3d and sub ground line 4d are respectively connected to main power supply line 1d and main ground line 2e. In this state, refresh-related circuitry 14a receives power supply in the low impedance state and operates fast.

When the self refresh mode is entered, control signal RACT0 attains a low level and control signal ZRACT0 attains a high level. In the self refresh mode, refresh operation is periodically performed under control of SR control circuit 20. In refresh operation, control signal RACT0 attains a high level and control signal ZRACT0 attains a low level and leakage cutting MOS transistors PQd and NQd are both turned on. Thus in self refresh operation a stable current can be supplied to perform refresh operation. According to a refresh period, an active cycle and a standby cycle are provided in refresh-related circuitry 14a, and in the active cycle, power supply circuit 36 has its impedance lowered. Thus a further reduced current consumption can be achieved in the standby state. Column-related/peripheral control circuitry 14b and logic circuit 12 are provided with a power supply circuit similar in configuration to that shown in FIG. 16.

Figure 22:
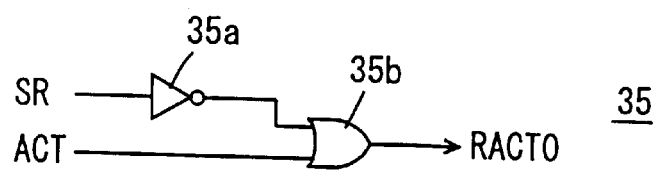
FIG. 22 shows an exemplary configuration of a power supply control circuit for the power supply circuit shown in FIG. 19.

FIG. 22 shows an exemplary configuration of power supply control circuit 35 shown in FIG. 19. In FIG. 22, power supply control circuit 35 includes an inverter 35a receiving self refresh mode designation signal SR and an OR circuit 35b receiving a signal output from inverter 35a and an array activation instructing signal ACT to produce control signal RACT0. Self refresh mode designation signal SR attains high level in the self refresh mode. Array activation instructing signal ACT is held at a high level while row-related circuitry 21 operates. Thus, control signal RACT0 in the normal mode of operation attains a high level normally and in the self refresh mode attains a high level in response to array activation signal ACT.

In the configuration shown in FIG. 19, the power supplies for SR control circuit 20 and row-related circuitry 21 are both controlled. However, with SR control circuit 20 including a timer for determining the refresh period to insure a stable operation of the timer, SR control circuit 20 may normally receive a power supply voltage while only row-related circuitry 21 may utilize the hierarchical power supply configuration as shown in FIG. 20.

Second Modification

FIG. 23 schematically shows a configuration of a second modification of the second embodiment of the present invention. In the configuration shown in FIG. 23, column-related/peripheral control circuitry 14b is provided with an internal voltage down converter for down-converting external power supply voltage EV2. More specifically, a power supply circuit for column-related/peripheral control circuitry 14b includes a comparator 39 comparing an internal power supply voltage with a predetermined voltage, a p channel MOS transistor 31c responsive to a signal output from comparator 39 for supplying a current from a power supply node receiving external power supply voltage EV2 to a power supply line to column-related/peripheral control circuit y 14b, a p channel MOS transistor 37 responsive to self refresh mode (sleep mode) designation signal SR2 of low revel for turning on to select and pass a reference voltage Vref as a predetermined voltage to comparator 39, and an n channel MOS transistor 38 responsive to self refresh mode (sleep mode) designation signal RS2 of high level for turning on to transmit ground voltage Vss as a predetermined voltage to comparator 39. The remaining of the configuration is the same as shown in FIG. 16.

In the configuration shown in FIG. 23, in the normal mode of operation self refresh mode (sleep mode) designation signal SR (SR1, SR2) has a low level, n channel MOS transistor 38 is turned off, p channel MOS transistor 37 is turned on, and reference voltage Vref is supplied to comparator 39. As such, the feed back loop of comparator 39 and p channel MOS transistor 31c produces an internal power supply voltage substantially equal in voltage level to reference voltage Vref and supplies the internal power supply voltage to column-related/peripheral control circuitry 14b.

In the self refresh (sleep) mode, MOS transistor 37 is turned off, MOS transistor 38 is turned on, and the ground voltage is supplied to comparator 39. Thus, comparator 39 sets an internal power supply voltage of column-related/peripheral control circuitry 14b to the ground voltage level. It should be noted that comparator 39 operates with external power supply voltage EV2.

In the configuration shown in FIG. 23, power supply control circuit 25 produces signals SR2 and SR1 controlling a power supply voltage for logic circuit 12 and an operation of the internal voltage down converter for column-related/peripheral control circuitry 14b. However, the circuit generating signal SR2 for controlling the operation of the internal voltage down converter for column-related/peripheral control circuitry 14b and the power supply control circuit generating signal SR1 controlling the operation of the power supply transistor for logic circuit 12, may be provided separately.

In column-related/peripheral control circuitry 14b, its internal power supply voltage is set to the ground voltage level in the self refresh mode and current is thus not consumed. Current is consumed simply in the comparison operation performed by comparator 39. The circuit for producing reference voltage Vref, which is produced from external power supply voltage EV2, is not required to have large current driving capability and thus only consumes a small amount of current.

As described above, according to the second embodiment of the present invention, in the self refresh mode (the sleep mode) a portion which stops its circuit operation can be prevented from receiving power supply, to significantly reduce current consumption in the self refresh mode (the sleep mode). In the normal mode of operation, an external power supply voltage can be normally supplied to implement fast operation owing to a low threshold voltage MOS transistor.

Third Embodiment

Figure 24:
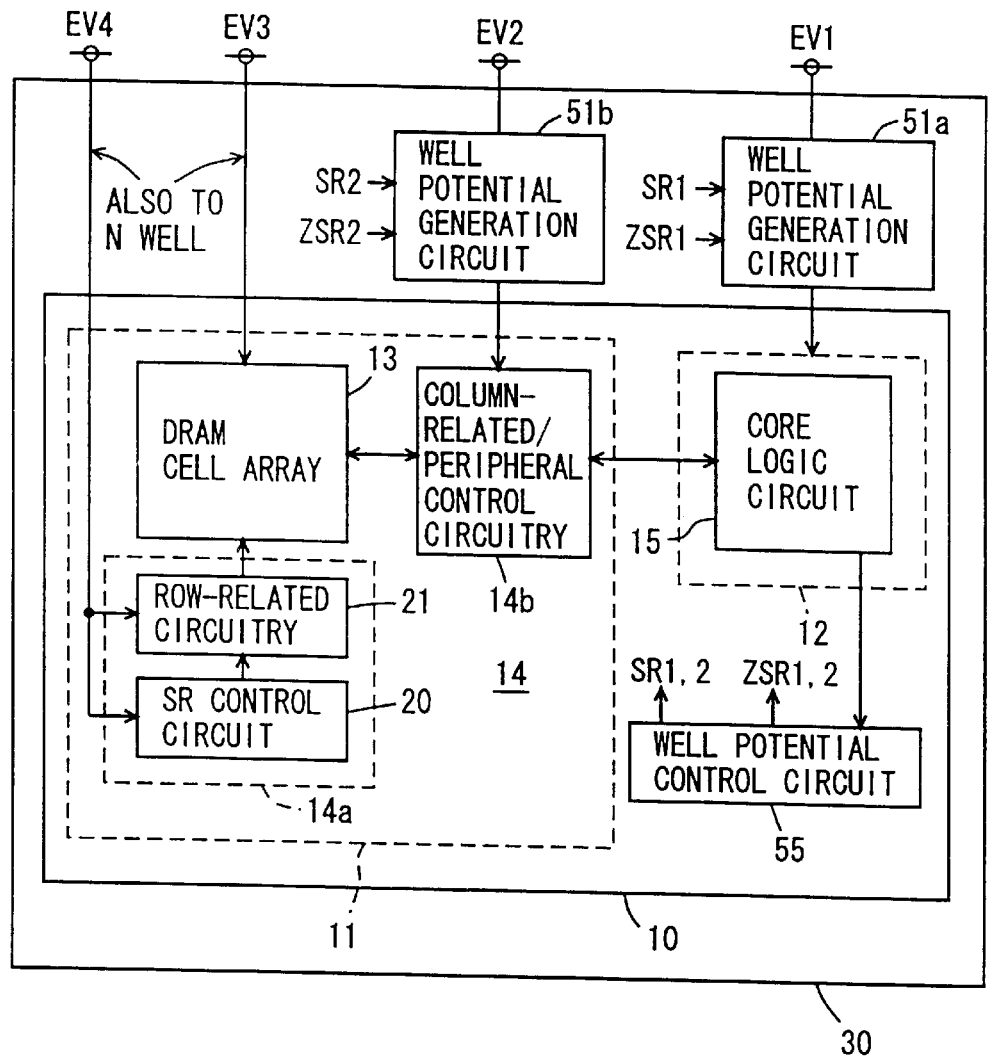
FIG. 24 schematically shows a configuration of a third embodiment of the present invention.

FIG. 24 schematically shows a configuration of a semiconductor device of a third embodiment of the present invention. In FIG. 24, logic circuit 12 is provided with a well potential generation circuit 51a for generating a substrate bias voltage, and column-related/peripheral control circuitry 14b of DRAM macro 11 is provided with a well potential generation circuit 51b for generating a substrate bias voltage. Well potential generation circuits 51a and 51b apply the bias voltages to their corresponding substrate regions, with the generated potentials switched by well potential control signals SR1, SR2 and ZSR1, ZSR2 from a well potential control circuit 55.

DRAM cell array 13 and refresh-related circuitry 14a normally receive, at an n well region, external power supply voltages EV3 and EV4 as their respective n well voltages, and also receive a ground voltage (not shown) at a p well region. Here, DRAM cell array 13 may have the p well (a substrate region) receiving negative voltage Vbb as a substrate bias voltage.

Figure 25:
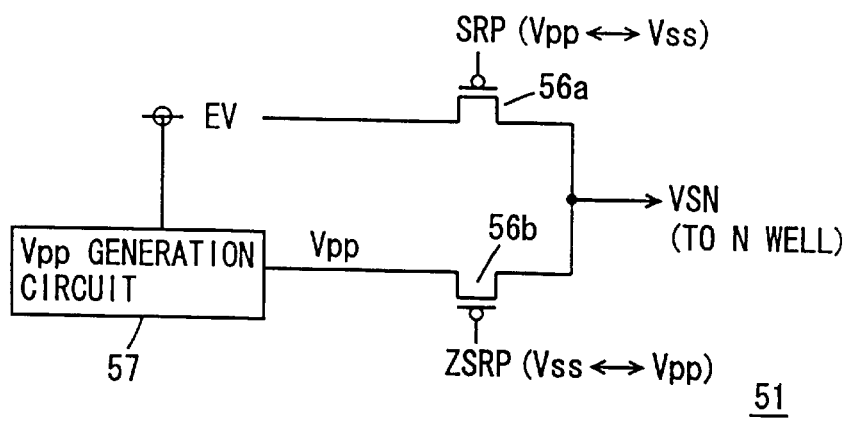
FIG. 25 shows an exemplary configuration of the well potential generation circuit shown in FIG. 24.

FIG. 25 schematically shows a configuration of well potential generation circuits 51a and 51b shown in FIG. 24. Since well potential generation circuits 51a and 51b are identical in circuit configuration, FIG. 25 representatively shows a single well potential generation circuit 51.

FIG. 25 shows a configuration of a portion generating a voltage VSN received by an n well (a substrate region) at which a p channel MOS transistor is formed. In FIG. 25, well potential generation circuit 51 includes a Vpp generation circuit 57 producing from external power supply voltage EV a boosted voltage Vpp higher than external power supply voltage EV, a p channel MOS transistor 56a responsive to a control signal SRP of low level for turning on to pass external power supply voltage EV, and a p channel MOS transistor 56b responsive to a control signal ZSRP of low level for turning on to pass boosted voltage Vpp from Vpp generation circuit 57. The voltages from MOS transistors 56a and 56b are applied as voltage VSN to the well region (the substrate region) of the p channel MOS transistor formed in the corresponding circuit. Control signal SRP changes in voltage level between external power supply voltage EV and ground voltage Vss, and control signal ZSRP changes between ground voltage Vss and boosted voltage Vpp.

Figure 26:
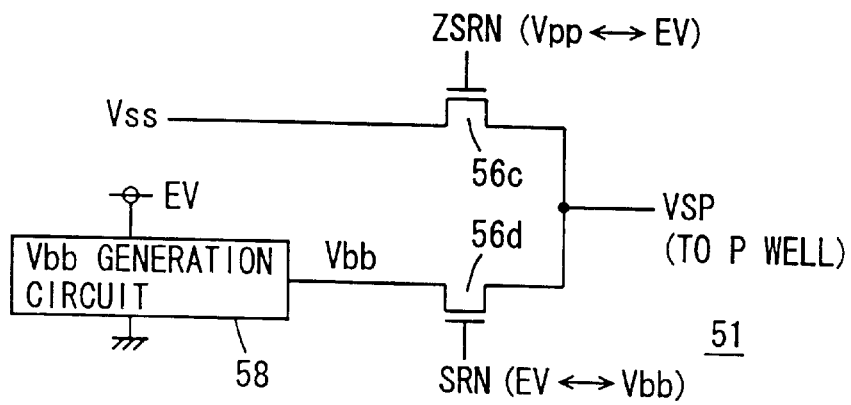
FIG. 26 shows an exemplary configuration of the well potential generation circuit shown in FIG. 24.

FIG. 26 schematically shows a configuration of well potential generation circuit 51 generating a well potential VSP applied to a p well (a substrate region) at which an n channel MOS transistor in the corresponding circuit is formed in the circuit shown in FIG. 24. In FIG. 26, well potential generation circuit 51 includes a Vbb generation circuit 58 generating negative voltage Vbb from external power supply voltage EV, a p channel MOS transistor 56c responsive to a control signal ZSRN of high level for turning to pass ground voltage Vss, and an n channel MOS transistor 56d responsive to a control signal SRN of high level for turning on to pass negative voltage Tbb from Vbb generation circuit 58. Voltage VSP from MOS transistors 56c and 56d is applied as a substrate bias voltage to the p well (the substrate region) at which an n channel MOS transistor in the corresponding circuit is formed. Control signals SRN and ZSRN changes between power supply voltage EV and negative voltage Vbb.

In the self refresh mode, control signal ZSRP attains the ground voltage Vss level and control signal SRP attains the boosted voltage Vpp level, and MOS transistor 56b is turned on and MOS transistor 56a is turned off, and the n well receives boosted voltage Vpp. Thus, the p channel MOS transistor has a threshold voltage increased in absolute value to suppress a leakage current.

Also as shown in FIG. 26, in the self refresh mode, control signal SRN attains the external power supply voltage EV level and control signal ZSRN attains the negative voltage Vbb level, MOS transistor 56d is turned on and MOS transistor 56c is turned off, and p well potential VSP attains the negative voltage Vbb level. Thus, in the self refresh mode, the n channel MOS transistor has a deep substrate bias and has an increased threshold voltage to provide a reduced leakage current.

In the normal mode of operation, control signal SRP attains the ground voltage Vss level and control signal ZSRP attains the boosted voltage Vpp level, MOS transistor 56a is turned on and MOS transistor 56b is turned off, and n well potential VSN and attains the external power supply voltage EV level.

Similarly, in FIG. 26, control signal SRN attains the negative voltage Vbb level and control signal ZSRN attains the external power supply voltage EV level, MOS transistor 56d is turned off and MOS transistor 56c is turned on, and p well potential VSP attains the ground voltage Vss level.

Thus, a low threshold voltage MOS transistor can be provided to achieve fast operation.

It should be noted that the configuration shown in FIG. 14 can be applied to the configuration of the portion that generates control signals for well potential generation circuit 51 shown in FIGS. 25 and 26. Furthermore, the power supply circuit is also powered-on/off or has its impedance adjusted in the self refresh mode (the sleep mode) and the normal mode (using the first or second embodiment). It should be noted that if an external power supply voltage is cut off in the self refresh mode (the sleep mode), it is not particularly necessary to control the well voltage, since there is not any leakage path.

As described above, according to the third embodiment of the present invention, in the self refresh mode (the sleep mode) a circuit portion in which its circuit operation is stopped is adapted to have a well (a substrate region) potential increased in absolute value. Thus, a low threshold voltage MOS transistor as a component in a circuit can have a threshold voltage increased in absolute value to provide a reduced off leak current and hence a reduced current consumption.

Fourth Embodiment

Figure 27:
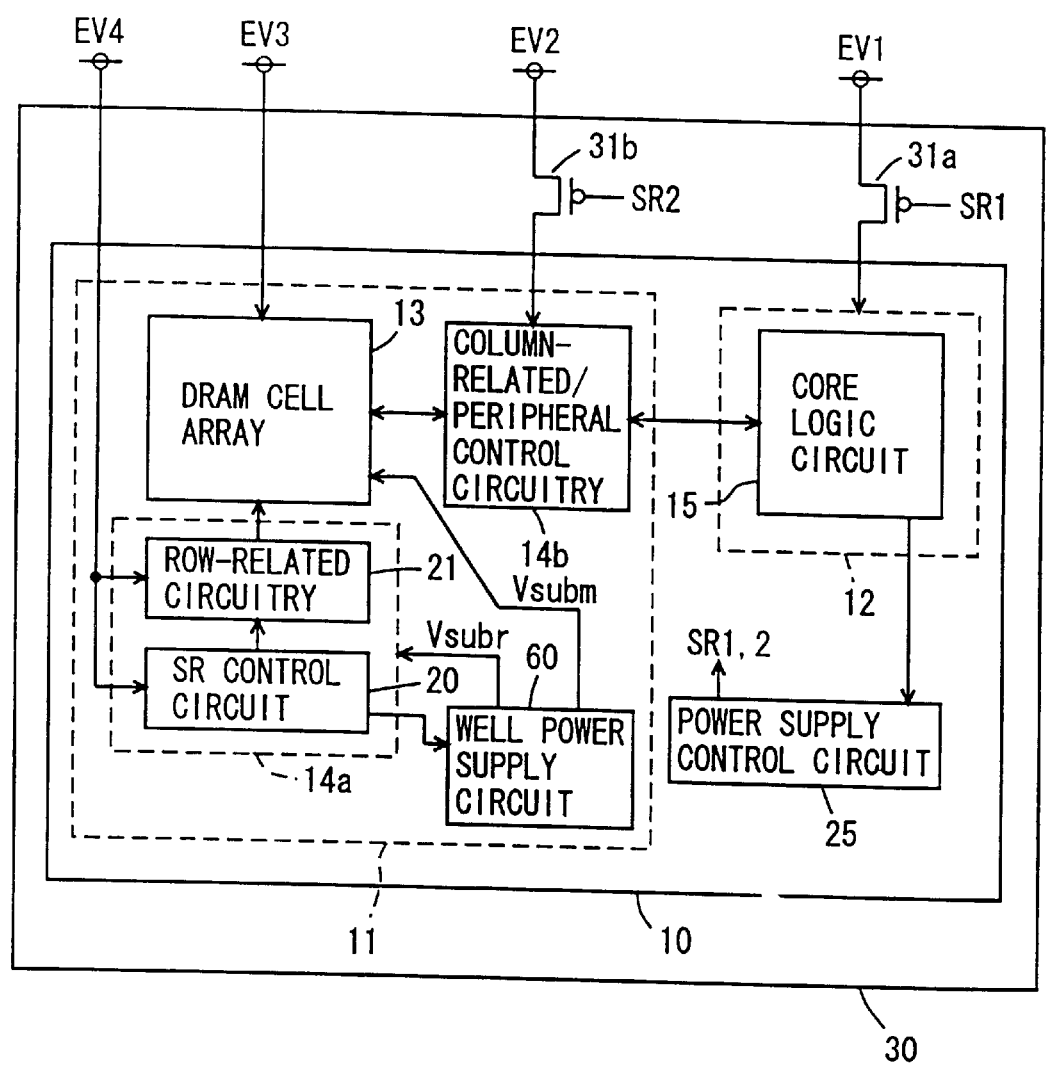
FIG. 27 schematically shows a configuration of a fourth embodiment of the present invention.

FIG. 27 schematically shows an entire configuration of a semiconductor device according to a fourth embodiment of the present invention. In the configuration shown in FIG. 27, DRAM cell array 13 receives external power supply voltage EV3 and refresh-related circuitry 14a receives external power supply voltage EV4. Logic circuit 12 receives external power supply voltage EV1 as an operating power supply voltage via power supply transistor 31a responsive to control signal SR1. Column-related/peripheral control circuitry 14b receives external power supply voltage EV2 as an operating power supply voltage via power supply transistor 31b responsive to control signal SR2.

DRAM macro 11 is also provided with a well power supply circuit 60 controlling respective voltage levels of well voltages (substrate-region voltages) Vsubr and Vsubm of refresh-related circuitry 14a and DRAM cell array 13. The remaining of the configuration is the same as shown in FIG. 16 and corresponding portions are denoted by the same reference characters. While power supply control circuit 25 produces both control signals SR1 and SR2, separate power supply control circuits 25 may be provided for power supply transistors 31a and 31b, respectively.

A specific configuration of well power supply circuit 60 is, for example, the same as the configuration shown in FIG. 14, and the absolute values of well voltages Vsubr and Vsubm applied to respective circuit substrate regions are increased in response to self refresh mode designation signal SR from SR control circuit 20 included in refresh-related circuitry 14a. The circuit of FIG. 14 with well voltages φwn and φwp respectively substituted with n well potential VSN and p well potential VSP provides the configuration of well power supply circuit 60 shown in FIG. 27. DRAM cell array 13 and refresh-related circuitry 14a have their respective well voltages Vsubr and Vsubm set to appropriate absolute values depending on their respective circuit characteristics.

Modification

Figure 28:
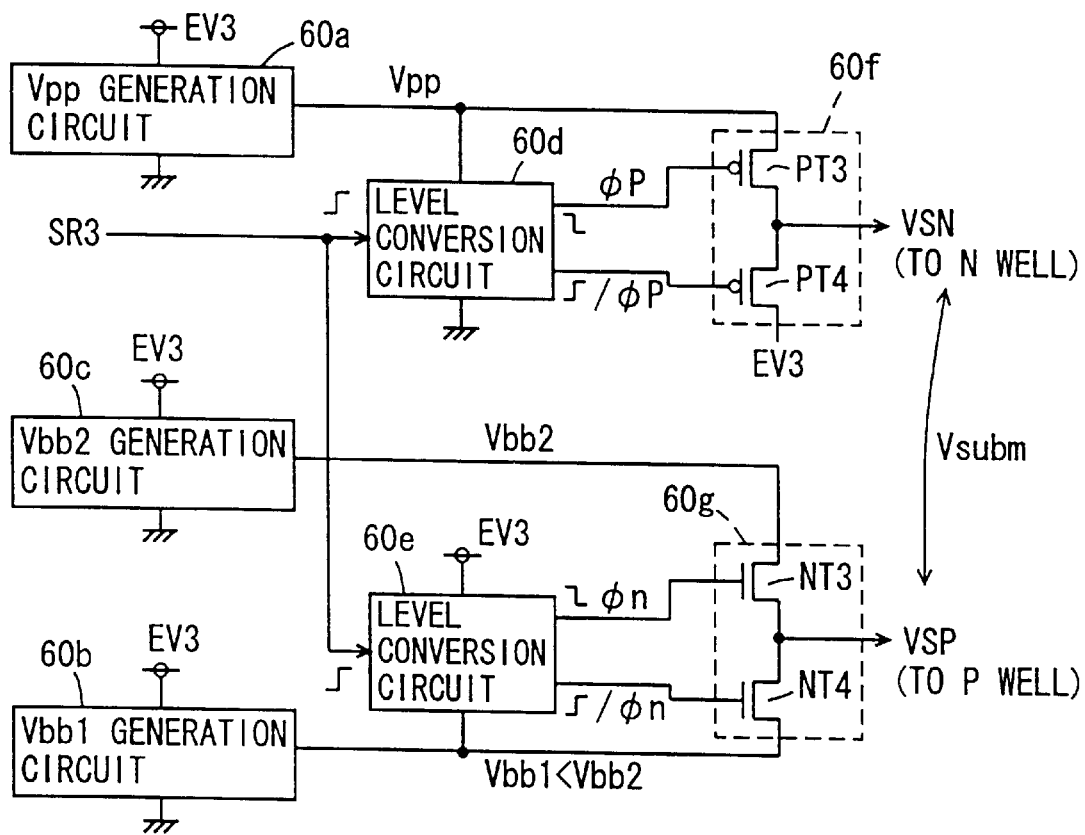
FIG. 28 schematically shows a configuration of the well power supply circuit shown in FIG. 27.

FIG. 28 shows a configuration of a modification of well power supply circuit 60 shown in FIG. 27. The well power supply circuit shown in FIG. 28 adjusts voltage VSP of a p well at which a memory cell of DRAM cell array 13 is formed, for example.

In FIG. 28, well power supply circuit 60 for DRAM cell array 13 includes a Vpp generation circuit 60a generating boosted voltage Vpp according to external power supply voltage EV3, a Vbb1 generation circuit 60b receiving external power supply voltage EV3 as one operating power supply voltage and operating to generate a negative voltage Vbb1 lower than a ground voltage, a Vbb2 generation circuit 60c receiving external power supply voltage EV3 as an operating power supply voltage and operating to generate a negative voltage Vbb2 smaller in absolute value than negative voltage Vbb1, a level conversion circuit 60d receiving boosted voltage Vpp and ground voltage Vss as both operating power supply voltages and operating to convert a voltage level of a self refresh mode designation signal SR3 to produce control signals φp and /φp, a level conversion circuit 60e operating with external power supply voltage EV3 and negative voltage Vbb1 being both operating power supply voltages to convert a level of self refresh mode designation signal SR3 to produce switching control signals φn and /φn, a switch circuit 60f responsive to switching control signals φp and /φp from level conversion circuit 60d for selecting one of external power supply voltage EV3 and boosted voltage Vpp to produce n well voltage VSN applied to an n well, and a switch circuit 60g responsive to switching control signals φn and /φn from level conversion circuit 60e for selecting one of negative voltages Vbb1 and Vbb2 to produce p well voltage VSP applied to a p well.

Switch circuit 60f includes a p channel MOS transistor PT3 responsive to switching control signal φp of low level for turning on to transmit boosted voltage Vpp, and a p channel MOS transistor PT4 responsive to switching control signal /φp of low level for turning on to transmit external power supply voltage EV3. One of MOS transistors PT3 and PT4 produces n well voltage VSN.

Switch circuit 60g includes an n channel MOS transistor NT3 responsive to switching control signal φn of high level to turn on to transmit negative voltage Vbb2, and an n channel MOS transistor NT4 responsive to switching control signal /φn and of high level to turn on to transmit negative voltage Vbb1. The voltages transmitted by MOS transistors NT3 and NT4 serve as p well voltage VSP.

Figure 29:
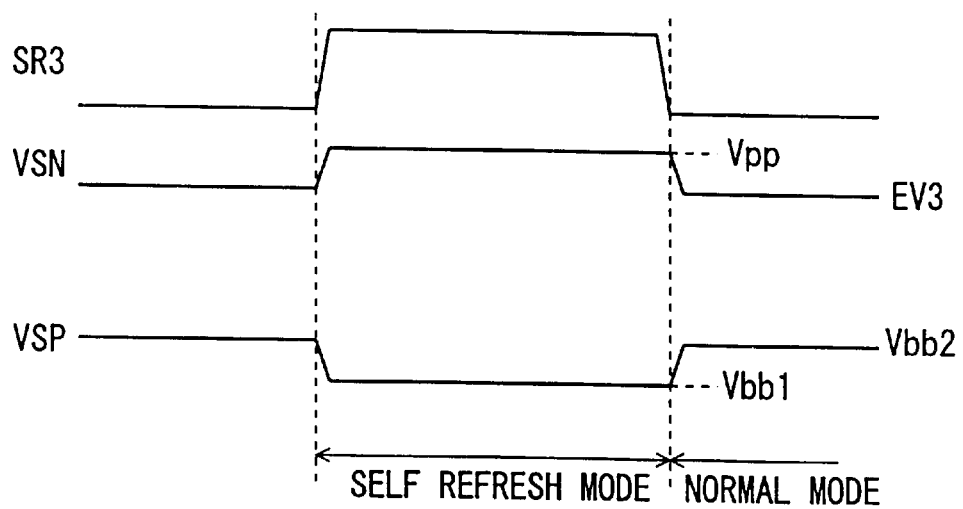
FIG. 29 is a signal waveform diagram representing an operation of the well power supply circuit shown in FIG. 28.

It should be noted that Vpp generation circuit 60a, Vbb1 generation circuit 60b and Vbb2 generation circuit 60c each produce a desired voltage through a circuit utilizing charge pump operation of a capacitor. An operation of the circuit shown in FIG. 28 will now be described with reference to the signal waveform diagram shown in FIG. 29.

In the self refresh mode, self refresh mode designation signal SR3 attains a high level, and switching control signal φp attains a low level and switching control signal /φp attains a high level. Thus, in switch circuit 60f, MOS transistor PT3 is turned on and MOS transistor PT4 is turned off, and n well voltage VSN attains the boosted voltage Vpp level. Level conversion circuit 60e responds to the rise of self refresh mode designation signal SR3 to set switching control signal φn to a low level corresponding to the negative voltage Vbb1 level and switching control signal φn to a high level corresponding to external power supply voltage EV3. Thus, in switch circuit 60g, MOS transistor NT3 is turned off and MOS transistor NT4 is turned on, and negative voltage Vbb1 is transmitted as p well voltage VSP. MOS transistor NT3 has a gate set at the negative voltage Vbb1 level and a source potential equal in voltage level to p well voltage VSP, and is maintained off.

In the normal mode of operation, self refresh mode designation signal SR3 attains a low level, switching control signal φp attains a high level corresponding to the boosted voltage Vpp level and switching control signal /φp attains a low level corresponding to the ground voltage level, and n well voltage VSN attains the external power supply voltage EV3 voltage level owing to turned-on MOS transistor PT4 of switch circuit 60f.

Level conversion circuit 60e also sets switching control signal φn to a high level corresponding to external power supply voltage EV3 and switching control signal /φn to a low level corresponding to the negative voltage Vbb1 level. Thus, in switch circuit 60g, MOS transistor NT3 is turned on and MOS transistor NT4 is turned off, and negative voltage Vbb2 is transmitted as p well voltage VSP. Thus, n well voltage VSN and p well voltage VSP each have an absolute value larger in the self refresh mode than in the normal mode of operation, and thus the bias is made deeper to reduce off leak current of the array and a MOS transistor in a circuit.

Configuration of Refresh-related Circuitry

Figure 30:
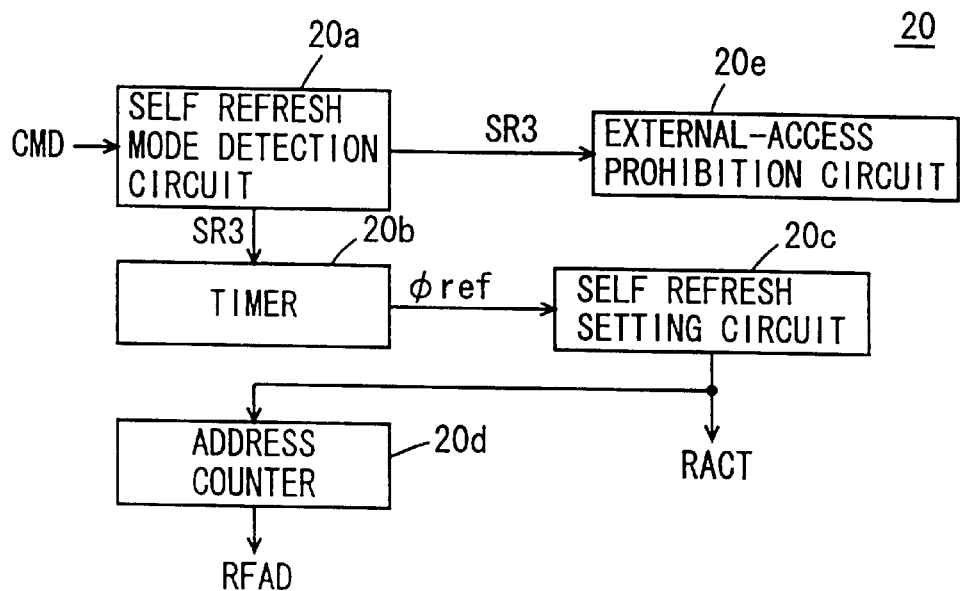
FIG. 30 schematically shows a configuration of the SR control circuit shown in FIG. 27.

FIG. 30 schematically shows a configuration of the refresh-related circuitry shown in FIG. 27. A well potential in the self refresh mode is different from that in the normal mode of operation. This changes a MOS transistor's threshold voltage and drain current and hence a circuit performance. The data in a memory cell may not be refreshed accurately if the row-related circuitry is operated in the self refresh mode at the same timing as in the normal mode of operation. The refresh-related circuitry shown in FIGS. 30 and 31 has a function to correct the change in well potential.

FIG. 30 schematically shows a configuration of SR control circuit 20 included in refresh-related circuitry 14a. In FIG. 30, SR control circuit 20 includes a self refresh mode detection circuit 20a responsive to an externally applied operation mode designation signal (command) CMD to detect that the self refresh mode is designated, a timer 20b initiated in response to a self refresh mode detection signal from self refresh mode detection circuit 20a to generate a refresh request signal φref at predetermined time intervals, a self refresh setting circuit 20c responsive to refresh request signal φref from timer 20b to generate array activation signal RACT (ACT) of one shot having a predetermined time width, an address counter 20d initiated in the self refresh mode in response to inactivated array activation signal RACT (ACT) from self refresh setting circuit 20c to increment its count value by one to output a refresh address RFAD indicative of a row to be refreshed, and an external-access prohibition circuit 20e responsive to the self refresh mode detection signal from self refresh mode detecting circuit 20a to prohibit an external access operation (a column select operation).

SR control circuit 20 shown in FIG. 30 normally receives external power supply voltage EV4 shown in FIG. 27, and a MOS transistor as a component has a well voltage controlled by well power supply circuit 60 shown in FIG. 27. In the self refresh mode, the MOS transistor's threshold voltage changes in absolute value, timer 20 outputs refresh request signal φref at an altered period and self refresh setting circuit 20c outputs array activation signal RACT (corresponding to signal ACT shown in FIG. 22) of a changed active period. This can be done by previously setting operating parameters of timer 20b and self refresh setting circuit 20c depending on the well voltage level set in the self refresh mode, and self refresh request signal φref can be periodically produced and array activation signal RACT can also be generated having a predetermined time width, e.g., of 700 ns. SR control circuit 20 shown in FIG. 30 operates when the self refresh mode is set, and it does not operate in the normal mode of operation. Thus it does not at all influence an access operation in the normal mode of operation.

Figure 31:
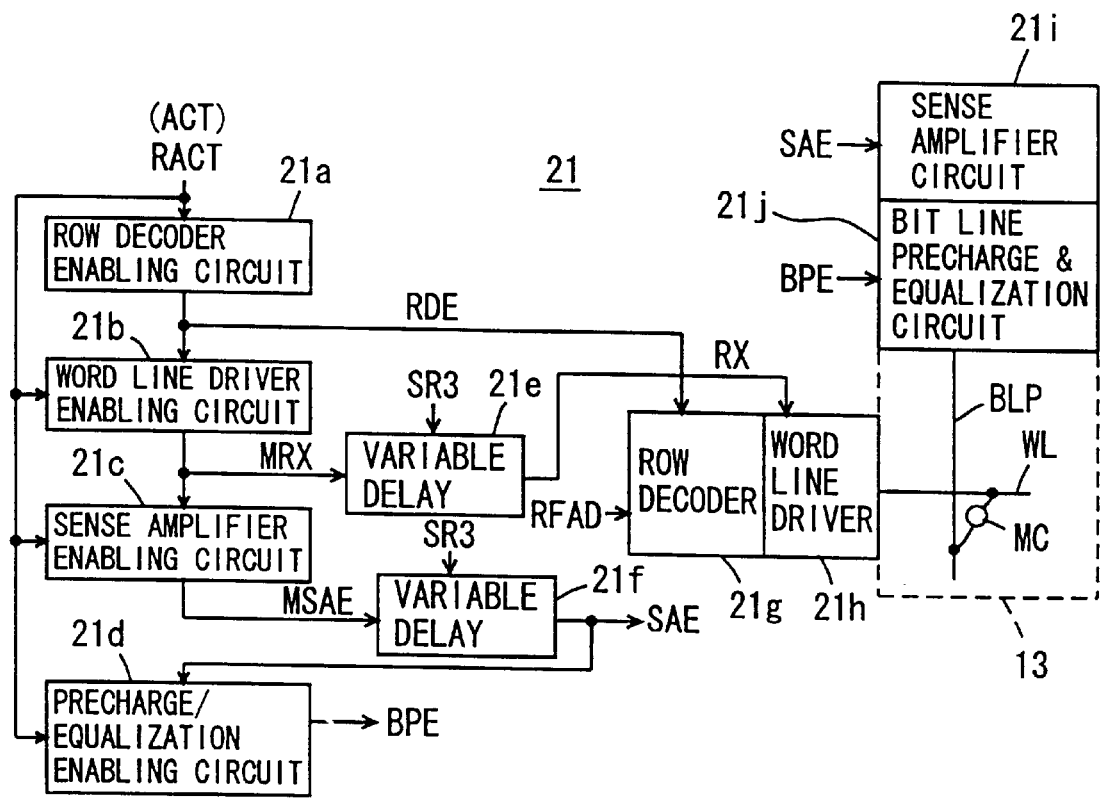
FIG. 31 schematically shows a configuration of the row-related circuitry shown in FIG. 27.

FIG. 31 schematically shows a configuration of row-related circuitry 21 shown in FIG. 27. In FIG. 31, row-related circuitry 21 includes a row decoder enabling circuit 21a responsive to activation of array activation signal RACT from self refresh setting circuit 20c shown in FIG. 30 in the self refresh mode to generate a row decoder enable signal RDE, a word line drive enabling circuit 21b responsive to activation of row decoder enable signal RDE from row decoder enabling circuit 21a to generate a word line drive signal MRX when a predetermined period of time has elapsed since the activation of signal RDE, a sense amplifier enabling circuit 21c responsive to activation of word line drive signal MRX from word line drive enabling circuit 21c to activate a sense amplifier enable signal MSAE when a predetermined period of time has elapsed since the activation of signal MRX, a variable delay circuit 21e having a delay time varied by self refresh mode designation signal SR3, delaying word line drive signal MRX from word line drive enabling circuit 21c by a set time to produce a word line drive signal RX, a variable delay circuit 21f having a delay time adjusted by self refresh mode designation signal SR3, responsive to sense amplifier enable signal MSAE from sense amplifier enabling circuit 21c to produce a sense amplifier enable signal SAE, and a bit line precharge/equalization enabling circuit 21d responsive to inactivation of sense amplifier enable signal SAE from variable delay circuit 21f to activate a bit line precharge/equalization instructing signal BPE.

Word line drive enabling circuit 21c, sense amplifier enabling circuit 21c, and precharge/equalization enabling circuit 21d respond to inactivation of array activation signal RACT to inactivate their respective signals MRX, MSAE and PPE at predetermined timings.

Variable delay circuits 21e and 21f have their delay times increased when self refresh mode designating signal SR3 is active in the self refresh mode, and decreased in the normal mode of operation.

Row-related circuitry 21 further includes a row decoder 21g responsive to activation of row decoder enable signal RDE from row decoder enabling circuit 21a to be enabled to decode refresh address RFAD from the address counter 20d shown in FIG. 30, a word line driver 21h responsive to a decoded signal from row decoder 21g and word line drive signal RX from variable delay circuit 21e to drive to a selected state a word line WL corresponding to an addressed row, a bit line precharge/equalization circuit 21j each provided for a respective column (a bit line pair) BLP of DRAM cell array 13 and responsive to bit line precharge/equalization instructing signal BPE to precharge and equalize bit line pair BLP potentials to a redetermined voltage level, and a sense amplifier circuit 21i enabled when sense amplifier enable signal is activated, to differentially amplify the potentials on bit line pair BLP of DRAM cell array 13.

Sense amplifier circuit 21i provided for DRAM cell array 13 consumes external power supply voltage EV3 of FIG. 27 as an operating power supply voltage, and bit line precharge/equalization circuit 21j precharges bit line pair BLP to an intermediate voltage level produced from external power supply voltage EV3 supplied to DRAM cell array 13 for equalization of bit line pair BLP. The other row-related circuitry components shown in FIG. 31 operate receiving external power supply voltage EV4 of FIG. 27 as an operating power supply voltage.

An operation of refresh-related circuitry 14a shown in FIGS. 30 and 31 will now be described with reference to the signal waveform diagram shown in FIG. 32.

In the self refresh mode, self refresh mode designation signal SR3 attains an active high level. Self refresh mode designation signal SR3 is produced by self refresh mode detection circuit 20a shown in FIG. 30. When self refresh mode designation signal SR3 is active, external access prohibition circuit 20e prohibits external access (or accepting an external access command).

When a predetermined period of time has elapsed in the self refresh mode, time 20b periodically generates refresh request signal φref. When refresh request signal φref is generated (activated), self refresh setting circuit 20c outputs as array activation signal RACT a pulsed signal of one shot having a predetermined time width.

In response to the activation of array activation signal RACT, row decoder enabling circuit 21a shown in FIG. 31 activates row decoder enable signal RDE. Row decoder 21g, receiving refresh address RFAD from the address counter 20d shown in FIG. 30 via a multiplexer (not shown), decodes refresh address RFAD. In parallel with the decode operation, precharge/equalization enabling circuit 21d sets bit line precharge/equalization instructing signal BPE to an inactive low level and bit line precharge/equalization circuit 21j shown in FIG. 31 stops the operation of precharging and equalizing a bit line pair. When row decoder enable signal RDE is activated and a predetermined period of time elapses, word line drive signal MRX from word line (hive enabling circuit 21c is driven to an active state. Variable delay circuit 21e, having an increased delay time in the self refresh mode, delays word line drive signal MRX relative to word line drive enable signal 21c by a predetermined period of time and drives word line chive signal RX to an active state. If a MOS transistor has a threshold voltage increased in absolute value to increase the decoding time of decoder 21g, row decoder 21g can reliably feed word line drive signal RX to word line driver 21h and a word line can be activated after a decoded signal from row decoder 21g is definite.

When a voltage level of selected word line WL is increased in response to activated word line drive signal RX, the data in a memory cell MC is read onto bit line pair BLP. FIG. 32 represents a signal waveform on bit line pair BLP when high level data is read onto bit line pair BLP. In the self refresh anode, the memory cell's substrate region also is deeply biased and the memory cell transistor has an increased threshold voltage. Thus a potential variation appearing on bit line pair BLP in the self refresh mode is slower than that appealing thereon in the normal mode of operation. However, if sense amplifier enabling circuit 21c activates sense amplifier enable signal MSAE, variable delay circuit 21f delays a timing at which sense amplifier enable signal FAE is activated (indicated by an arrow in FIG. 32). After the potential of bit line pair BLP is sufficiently enlarged, sense amplifier circuit 21i is enabled to perform sense operation. Thus the data in the memory cell is reliably refreshed.

When a predetermined period of time has elapsed, array activation signal RACT from the self refresh setting circuit 20c shown in FIG. 30 is driven to an inactive state. In response to the inactivation of array activation signal RACT, address counter 20d increments an address value of refresh address RFAD by one. In response to the inactivation of the signal RACT, row decoder enable signal RDE from row decoder enabling circuit 21a is driven to an inactive state and row decoder 21 is inactivated and a decode operation is completed. In completing the decode operation, a delay may be introduced in precharging of an internal node of row decoder 21g (in the self refresh mode). However, in this case also, word line drive signal RX from variable delay circuit 21e is delayed in attaining an inactive state and a selected word line can be reliably driven to a non-selected state as row decoder 21g is disabled.

Sense amplifier enable signal SAE is also inactivated by variable delay circuit 21f after word line WL (word line drive signal RX) is inactivated, and a sense operation is completed. After the sense operation is completed, in response to inactivated sense amplifier enable signal FAE the precharge/equalize enabling circuit 21d drives bit line precharge/equalization instructing signal BPE to an active state. If the sense amplifier circuit operates slowly in this state, the sense amplifier circuit can reliably complete a sense operation before bit line pair BLP is precharged/equalized.

Figure 32:
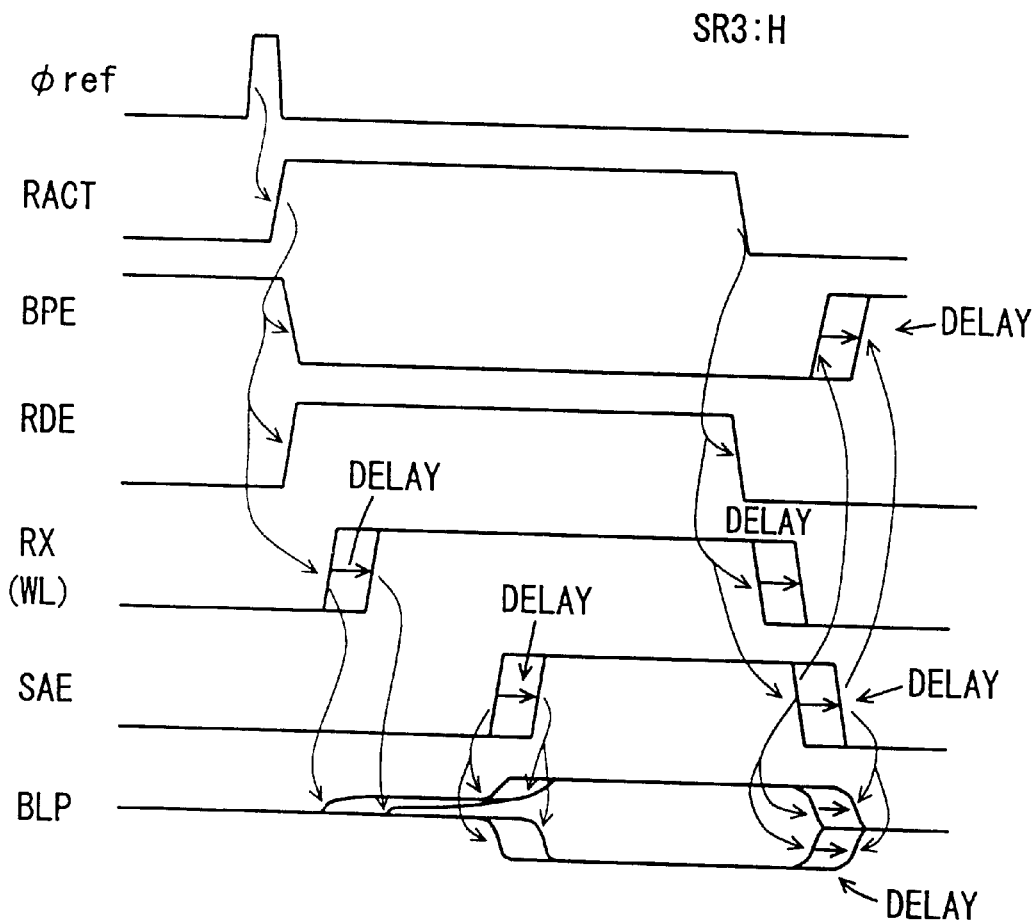
FIG. 32 is a signal waveform diagram representing an operation of the row-related circuitry shown in FIG. 31.

In FIG. 32, an arrow directed rightward in a signal waveform indicates that a timing at which a signal transitions is delayed by variable delay circuits 21e and 21f.

Figure 33:
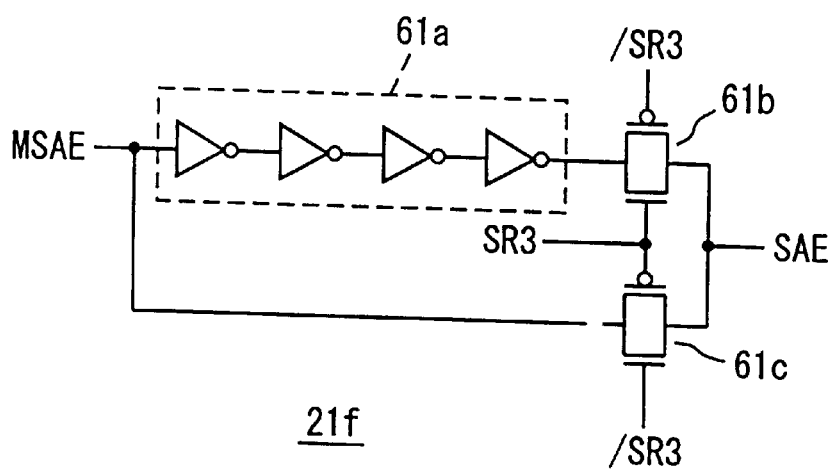
FIG. 33 shows a configuration of the variable delay circuit shown in FIG. 31.

FIG. 33 shows an exemplary configuration of variable delay circuits 21e and 21f shown in FIG. 31. Variable delay circuits 21e and 21f are identical in configuration and are only different in delay time. FIG. 33 shows variable delay circuit 21f provided for sense amplifier enable signal SAE. In FIG. 33, variable delay circuit 21f includes a delay circuit for delaying sense amplifier enable signal MSAE from sense amplifier enabling circuit 21c by a predetermined period of time, a CMOS transmission gate 61b responsive to activation of self refresh mode designation signal SR3 for conducting to pass a signal output from delay circuit 61a, and a CMOS transmission gate 61c responsive to inactivation of self refresh mode designation signal SR3 for conducting to pass sense amplifier enable signal MSAE from sense amplifier enabling circuit 21c.

CMOS transmission gates 61b and 61c output sense amplifier enable signal SAE fed to the sense amplifier circuit. Delay circuit 61a is configured, e.g., of even number of stages of inverters with predetermined delay times.

Variable delay circuit 21e has a configuration similar to that of variable delay circuit 21f shown in FIG. 33 (it is different in actual delay time). If the refresh-related circuitry has its operating speed slowed down in the self refresh mode with a well voltage increased in absolute value and a MOS transistor's threshold voltage increased in absolute value, delaying of a timing at which a timing signal applied for refresh operation is activated can suppress the slow down of the circuitry's operating speed to implement an accurate refresh operation.

In the normal mode of operation, sense amplifier enable signal SAE is produced in response to sense amplifier enable signal MSAE from sense amplifier enabling circuit 21c. Since there is no delay, with a well voltage having a reduced absolute value a fast operation can be achieved, and in the normal mode of operation any negative effect is not produced. In the normal mode, row decoder enabling circuit 21a receives array activation signal (ACT) produced in response to an external signal, rather than array activation signal RACT.

As described above, according to the fourth embodiment of the present invention, in the self refresh mode, only the portion related to refresh operation receives a power supply voltage while the other circuits are powered off, and the circuit portion related to refresh operation receive a well voltage of an increased absolute value, to further reduce current consumption in the standby state.

Fifth Embodiment

Figure 34:
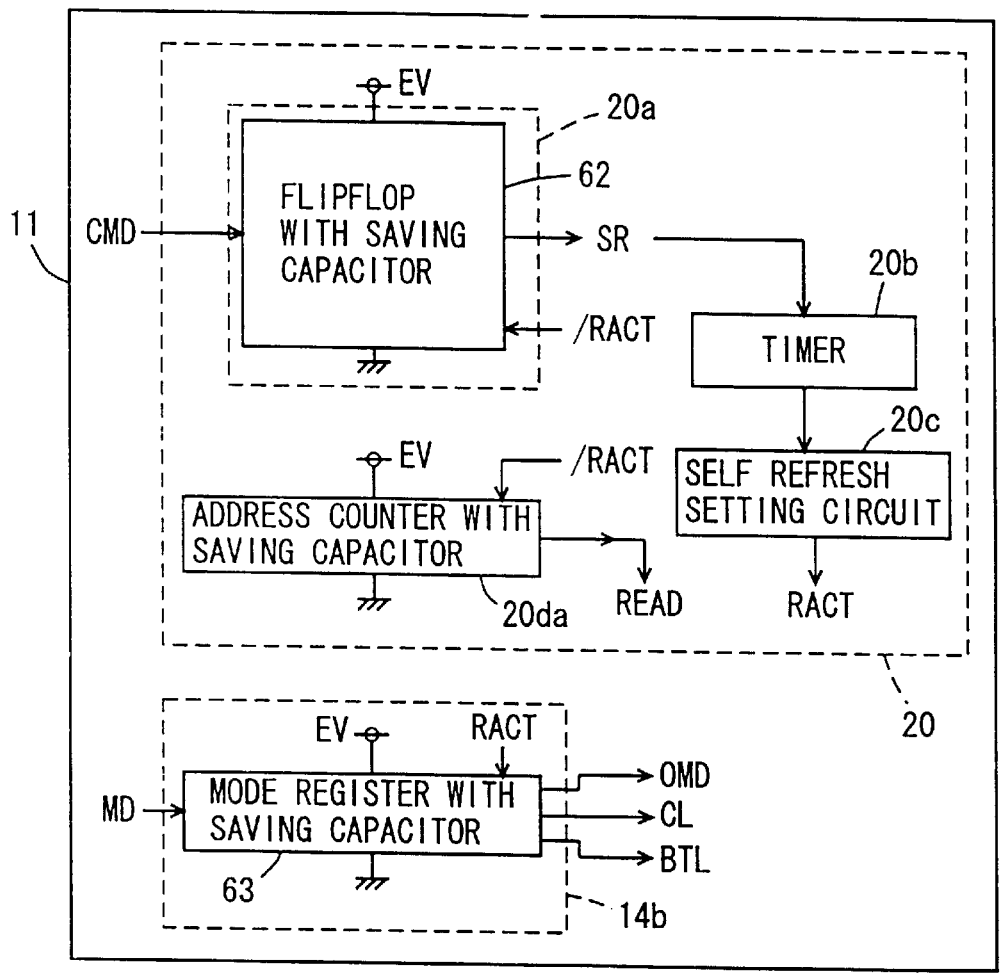
FIG. 34 schematically shows a configuration of a semiconductor device according to a fifth embodiment of the present invention.

FIG. 34 schematically shows a configuration of a semiconductor device according to a fifth embodiment of the present invention. FIG. 34 shows a configuration of the portion corresponding to SR control circuit 20 and column-related/peripheral control circuitry 14b included in DRAM macro 11.

In FIG. 34, SR control circuit 20 includes a self refresh mode detection circuit 20a responsive to an operation mode designation signal (a command) CMD for detecting that the self refresh mode has been designated, a timer 20b responsive to self refresh mode designation signal SR from self refresh mode detection circuit 20a for performing a time counting operation to output refresh request signal φref for each predetermined period, and an address counter with a saving capacitor 20da controlled by a self refresh setting circuit (not shown) (FIG. 30) to increment or decrement a count value to output refresh address RFAD.

Self refresh mode detection circuit 20a includes a flip-flop 62 with a saving capacitor for saving the storage content in the self refresh mode. Address counter with a saving capacitor 20da has its count value saved into the capacitor in the self refresh mode.

Column-related/peripheral control circuitry 14b includes a mode register with a saving capacitor 63 responsive to mode designating signal MD for storing operating parameters designating various modes of operation. Mode register 63 stores and outputs an output mode designation signal OMD setting either one of a transparent output mode, a registered output mode and a latch output mode as a data output mode, a column latency CL indicative of a clock cycle period required after a read/write Instructing signal is applied and before valid data is output, and a burst length data BTL indicative of the number of data successively output according to a single column access command. (The DRAM macro is assumed to be a clock synchronous DRAM.)

In the self refresh mode, the data/signals in flip-flop 62, address counter 20da and mode register 63 must be reliably stored. In normal latch and flip-flop circuits, there are two states of a storage node per bit according to the logic levels of "0" and "1" of the data held therein, and a conventional hierarchical power supply configuration (an off leak current reduction circuit) is not applicable. This is because at either one side of the storage data, there is constantly a path passing an off leak current so that standby current cannot be reduced.

The flip-flop 62 with a saving capacitor, address counter with a saving capacitor 20da and mode register with a saving capacitor 63 shown in FIG. 34 are used to cut power supply voltage EV supplied to these circuits and save stored information in the capacitors when power supply is cut off. When refresh operation is performed, the information saved in the saving capacitors is also refreshed. Thus, an off leak current is reduced in the self refresh mode.

Timer 20b must perform time counting operation in the self refresh mode, and during the self refresh mode an operating power supply voltage is normally supplied to timer 20b.

Figure 35:
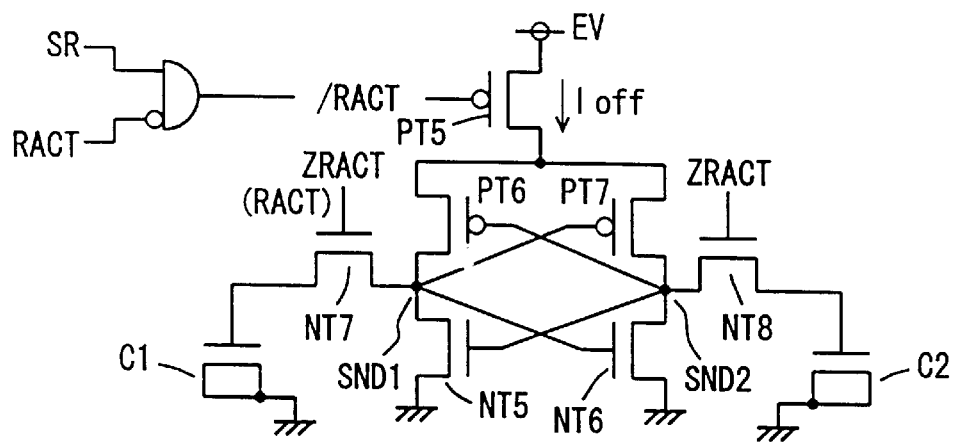
FIG. 35 schematically shows a configuration of the register circuit with a saving capacitor shown in FIG. 34.

FIG. 35 shows an exemplary configuration of the FIG. 34 flip-flop with a saving capacitor 62, address counter with a saving capacitor 20da, and mode register with a saving capacitor 63. FIG. 35 representatively shows a portion corresponding to a register circuit storing 1-bit data.

In FIG. 35, the register circuit with a saving capacitor includes a p channel MOS transistor PT5 turning on when an inverted version of array activation instructing signal RACT or a signal /RACT has a low level, a p channel MOS transistor PT6 connected between MOS transistor PT5 and a storage node SND1 and having its gate connected to a storage node SND2, an n channel MOS transistor NT5 connected between storage node SND1 and a ground node and having its gate connected to storage node SND2, a p channel MOS transistor PT7 connected between MOS transistor PT5 and storage node SND2 and having its gate connected to storage node SND1, and an n channel MOS transistor NT6 connected between storage node SND2 and a ground node and having its gate connected to storage node SND1. MOS transistors PT6, PT7 and NT5, NT6 in operation configure an inverter latch circuit.

The register circuit with a saving capacitor further includes capacitors C1 and C2, and n channel MOS transistors NT7 and NT8 responsive to a transfer control signal ZRACT of high level for turning on to connect capacitors C1 and C2 to storage nodes SND1 and SND2, respectively. Capacitors C1 and C2 each are a MOS capacitor utilizing a gate capacitance of a MOS transistor. An operation of the register circuit with a saving capacitor shown in FIG. 35 will now be described with reference to the signal waveform diagram shown in FIG. 36.

In the normal mode of operation, self refresh mode designation signal SR is at a low level and timer 20b shown in FIG. 34 is not initiated. In this state, in response to an externally applied row access instructing signal, the column-related/peripheral control circuitry produces and feeds array activation signal ACT to the row-related circuitry to perform a row select operation. When array activation signal ACT is active, the DRAM cell array is active(A selected word line is maintained in a selected state.). In the normal mode, signal /RACT attains a low level in response to self refresh mode designation signal SR of low level, MOS transistor PT5 is turned on, the register circuit with a saving capacitor operates, and storage nodes SND1 and SND2 receive and hold data written from a circuit (not shown).

When the voltage levels at storage nodes SND1 and SND2 are stabilized at the levels corresponding to stored information, with MOS transistors PT6, PT7, NT5, NT6 configuring a CMOS inverter latch, off leak current Ioff only flows. Transfer control signal ZRACT is at a low level, and MOS transistors NT7 and NT8 are maintained OFF. Thus, in the normal mode, in the register circuit with a saving capacitor the data held at storage nodes SND1 and SND2 are held by MOS transistors PT6, PT7, NT5, NT6.

In the self refresh mode, self refresh mode designation signal SP attains a high level and signal /RACT becomes an inverted version of array activation signal RACT from self refresh setting circuit 20c shown in FIG. 34. At an array standby cycle in the self refresh mode, signal /RACT attains a high level and MOS transistor PT5 is turned off. Thus, no or an extremely small off leak current flows in this state. Meanwhile, when the self refresh mode is entered, transfer control signal ZRACT is activated for a predetermined period of time (a refresh cycle period), the data stored in storage nodes SND1 and SND2 are transferred to capacitors C1 and C2, and the data in the register circuit is saved into capacitors C1, C2. If MOS transistor PT5 is turned off and storage nodes SND1 and SND2 voltage levels are discharged to the ground voltage level, information is stored in capacitors C1 and C2.

Refresh operation is performed periodically. In the refresh operation, transfer control signal ZRACT initially rises to a high level, MOS transistors NT7 and NT8 are turned on, and the information stored in capacitors C1 and C2 are transmitted to storage nodes SND1 and SND2, respectively. Then, control signal /RACT is driven to a low level in response to array activation signal RACT, p channel MOS transistor PT5 turns on and MOS transistors PT6, PT7, NT5, NT6 operate to latch the information transferred to storage nodes SND1 and SND2. Thus the information stored by capacitors C1 and C2 is refreshed and restored into capacitors C1 and C2. When the refresh operation completes, array activation signal RACT falls to a low level, control signal /RACT responsively attains a high level, a current path of the register circuit is blocked, transferring MOS transistors NT7 and NT8 turn off, and capacitors C1 and C2 are disconnected from storage nodes SND1 and SND2.

With the configuration shown in FIG. 30, in the self refresh mode, the information to be held can be reliably held and refreshed at a refresh period for refreshing the data in a memory cell, and the standby cycle MOS transistor PT5 corresponding to a current source can be turned off to provide a reduced leakage current and a reduced current consumption.

Figure 36:
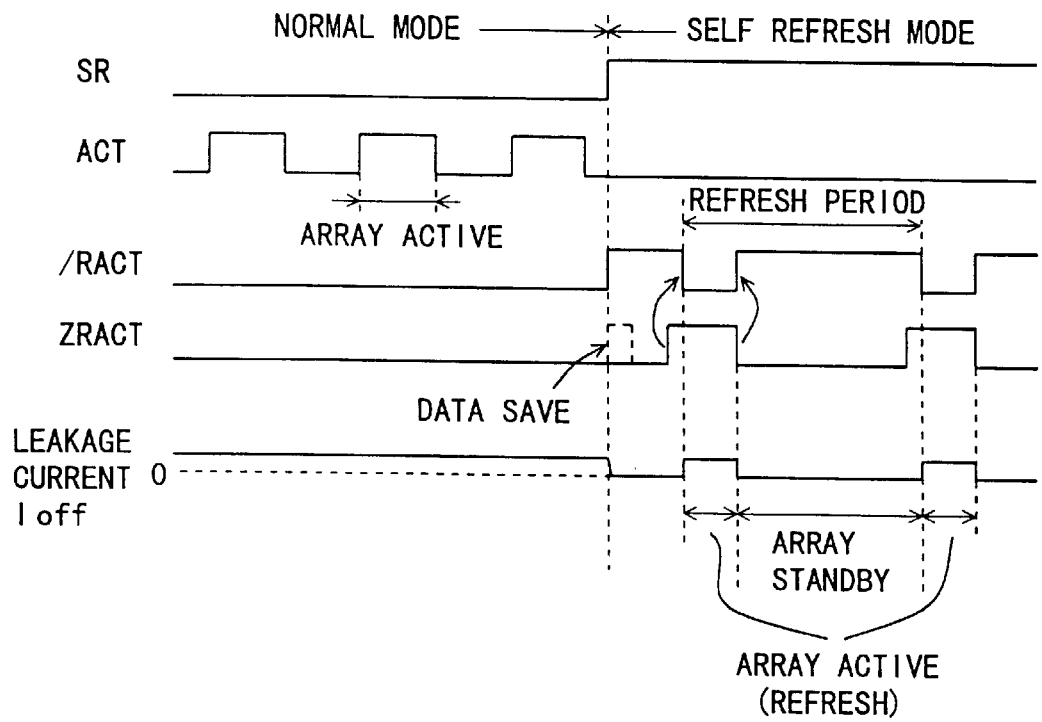
FIG. 36 is a signal waveform diagram representing an operation of the semiconductor device as shown in FIG. 34.

In the signal waveform diagram shown in FIG. 36, MOS transistor PT5 is maintained ON in the normal mode. However, such a configuration may be employed that in the normal mode of operation, control signal /RACT is at a low level only when the array is active, and in the standby cycle control signal /RACT is at a high level, while transfer control signal ZRACT also is at a high level. Off leak current Ioff in the normal mode can be reduced in average value, since off leak current Ioff is caused only when the array is active.

It should also be noted that transfer control signal ZRACT may be replaced by array activation instructing signal RACT from self refresh setting circuit 20c. With a gate circuit shown in FIG. 35, array activation signal RACT attains a high level to turn on MOS transistors NT7 and NT8, and then the gate circuit's delay allows control signal /RACT to attain a low level, so that before the register circuit is operated, the information stored in capacitors C1 and C2 can be reliably transferred to storage nodes SND1 and SND2 to be accurately refreshed.

It should be noted that self refresh setting circuit 20c may also be prevented from receiving a power supply voltage when self refresh mode designation signal SR is at a low level.

Modification

Figure 37:
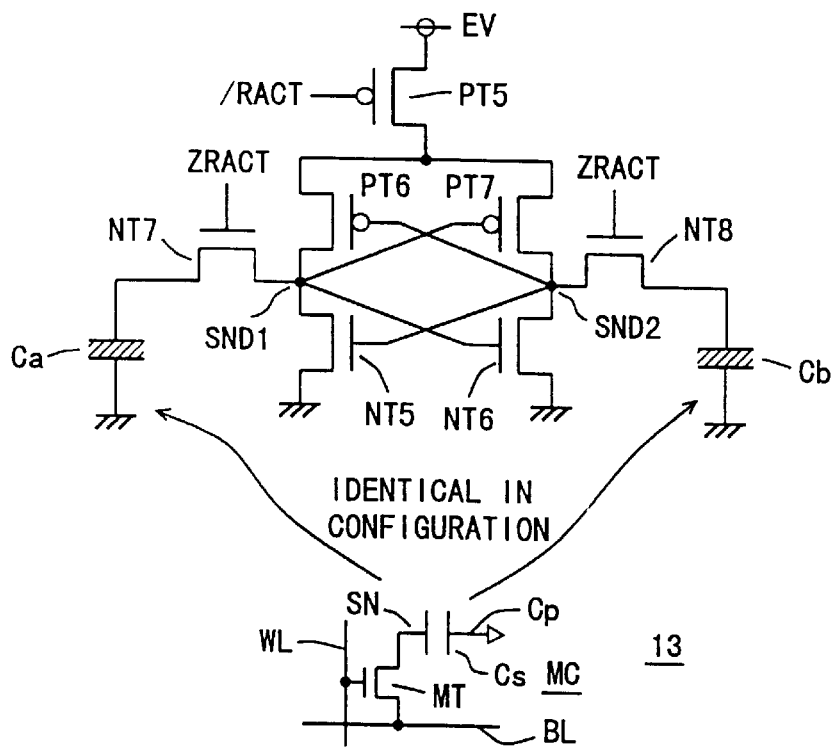
FIG. 37 shows a modification of the fifth embodiment of the present invention.

FIG. 37 shows a configuration of a modification of the fifth embodiment of the present invention. DRAM cell array 13 has memory cells MCs arranged in rows and columns. Memory cell MC includes a memory capacitor Cs for storing information, and an access transistor MT configured of an n channel MOS transistor responsive to a potential of a signal on word line WL for turning on to connect memory capacitor Cs to bit line BL (or bit line /BL (not shown)).

The register circuit with a saving capacitor has capacitors Ca and Cb storing the information of storage nodes SND1 and SND2 which are identical in configuration to memory cell capacitor Cs. Memory cell capacitor Cs has a capacitor insulation film of an extremely reduced thickness, providing a good area utilization efficiency. Capacitors Ca and Cb identical in configuration to memory cell capacitor Cs can be used as a data saving capacitor to reduce the area occupied by the register circuit.

Memory cell capacitor Cs normally receives half an operating power supply voltage at a cell plate electrode CP thereof. If storage nodes SND1 and SND2 receive the external power supply voltage EV voltage level, in order to ensure a breakdown voltage of capacitors Ca and Cb a capacitor identical in configuration to memory cell capacitor Cs may be connected in series to implement capacitors Ca and Cb.

Figure 38:
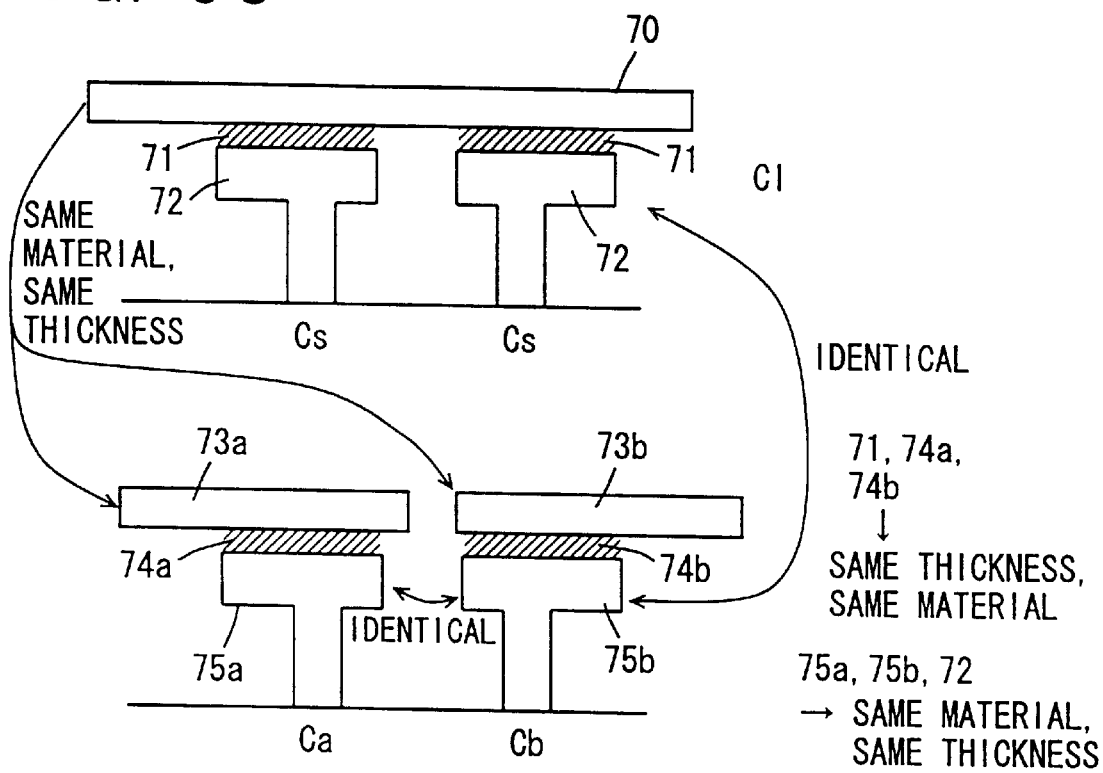
FIG. 38 schematically shows a configuration of the capacitor shown in FIG. 37.

FIG. 38 schematically shows a configuration in cross section of memory cell capacitor Cs and saving capacitors Ca and Cb. In FIG. 38, memory cell capacitor Cs includes a storage node 72 formed on a semiconductor substrate surface and having, e.g., a T-shaped cross section, a memory cell capacitor insulation film 71 formed on a surface of storage node 72, and a cell plate electrode layer 70 arranged common to a plurality of memory cell capacitors Cs and facing to storage node 72 with capacitor insulation film 72 interposed therebetween. An upper flat portion of storage node 72 and a region of cell plate electrode layer 70 facing thereto configure a memory cell capacitor.

Saving capacitors Ca and Cb, identical in configuration to memory cell capacitor Cs, are formed of first electrode layers 75a and 75b formed in the same process of forming the storage node layer on a semiconductor substrate, capacitor insulation films 74a and 74b formed on electrode layers 75a and 75b in the same fabrication process of forming the memory cell capacitor insulation film, and second electrode layers 73a and 73b formed on capacitor insulation films 74a and 74b in the same fabrication process of forming cell plate electrode layer 70. The second electrode layers 73a and 73b are electrically connected to storage nodes SND1 and SND2, respectively. The first electrode layers 75a and 75b receive a ground voltage.

As shown in FIG. 38, cell plate electrode layer 70 and the second electrode layers 73a and 73b are formed in the same fabrication process and they have the same film thickness and are formed of the same material(s). Insulation films 71 and 74a and 74b are also formed in the same fabrication process and they have the same film thickness and are formed of the same material(s). Similarly, storage node electrode layer 72 and the first electrode layers 75a and 75b are formed in the same fabrication process and they have the same film thickness and are formed of the same material(s).

Fabricating data saving capacitors Ca and Cb in the same fabrication process of fabricating the memory cell capacitor can provide a capacitor with a good area utilization efficiency without increasing the number of the fabrication process steps.

Since capacitors Ca and Cb are refreshed at the same period at which memory cell MC is refreshed, capacitors Ca and Cb are only required to have a charge holding characteristic substantially equal to that of memory cell capacitor Cs Since storage nodes SND1 and SND2 are smaller in parasitic capacitance than bit line BL, if capacitors Ca and Cb have a relatively small capacitance value a potential difference which can be satisfactorily latched by transistors PT6, PT7, NT5, NT6 can be produced in storage nodes SND1 and SND2. (The register circuit's inverter latch is identical in configuration to the DRAM cell array's sense amplifier.) In the above description, the address counter, the self refresh mode detection circuit and the data stored in the mode register are refreshed in the self refresh mode. However, the fifth embodiment is applicable to any register circuit or the like requiring the data stored therein to be held in the self refresh mode. It may also be not only a register circuit in a DRAM macro but also a register in a logic circuit.

The fifth embodiment is also applicable to a DRAM having a self refresh mode independently of a hierarchical power supply configuration.

As described above, according to the fifth embodiment of the present invention, in the self refresh mode, saving of storage data in a capacitor and periodical refreshing of the storage data held in capacitor at predetermined intervals allow current consumption to be further reduced in the self refresh mode, since power supply to the register circuit is cut.

Sixth Embodiment

Figure 39:
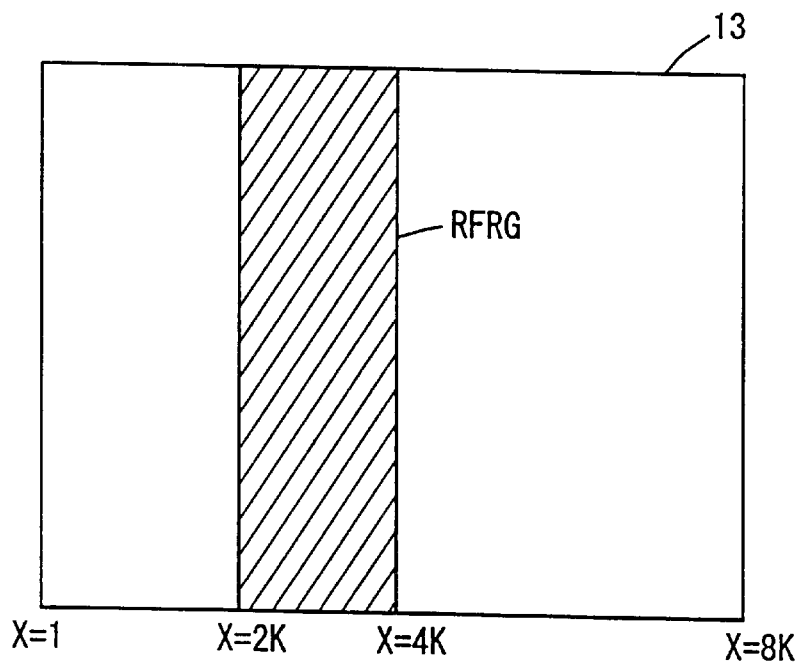
FIG. 39 schematically shows a configuration of a semiconductor conductor device according to a sixth embodiment of the present invention.

FIG. 39 schematically shows a configuration of DRAM cell array 13 according to a sixth embodiment of the present invention. In FIG. 39, DRAM cell array 13 has an X address ranging from X=1 to X=8K. In the region of DRAM cell array 13, data holding opera ion (refresh operation) is performed only at a region RFRG with an X address ranging from X=2K+1 to X=4K in the sleep mode (the self refresh mode). Refresh region RFRG is a region in which data must be held in the sleep mode, and it is not particularly disadvantageous even if the other regions lose data. For example, the situation corresponds to the case where refresh region RFRG is used as a working region for the logic circuit and the data in the working region must be held.

Figure 40:
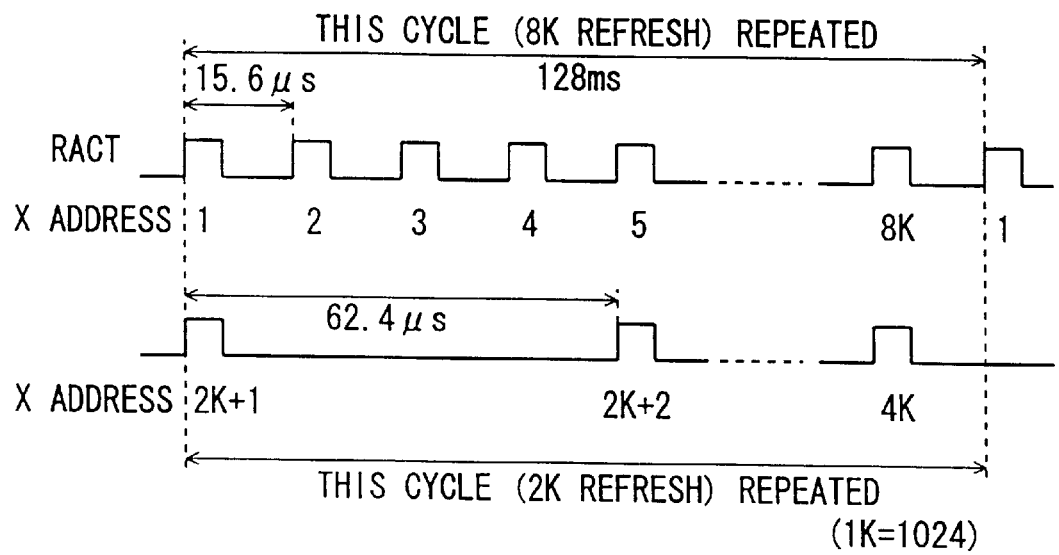
FIG. 40 is a time chart representing an operation of the semiconductor device according to the sixth embodiment of the present invention.

In the configuration of DRAM cell array 13 shown in FIG. 39, if, as shown in FIG. 40, the entirety of an address region with an X address ranging from X=1 to X=8K is refreshed, array activation signal RACT is generated 8K times and the X address is also varied from 1 to 8K to refresh all the data in memory cells of DRAM cell array 13. In this example, a refresh interval time (an interval at which refresh operation is performed) of 15.6 $\mu$s is employed and in total a time period of 128 ms (1K=1024) is required. This cycle (8K refresh) is repeated. Each X address is refreshed every 128 ms.

In contrast, if only refresh region RFRG is refreshed, its X address varies from 2K+1 to 4K. A time required for X addresses in this range to be all refreshed is set at 128 ms. This results in a refresh interval time multiplied by four, or 62.4 $\mu$s. In this example, the interval at which a memory cell of a word line at an X address is refreshed in refresh region RFRG is equal to that employed when the entire region is refreshed, so that the data can be held satisfactorily. Since refresh interval time is increased, a reduced power consumption can be provided in the self refresh mode. For example, if refresh region RFRG has its size multiplied by one n-th in the direction of the X address, basically a refresh interval time is multiplied by n and each word line is refreshed cyclically. The time required for this refresh operation to be performed on one round of word lines cyclically in refresh region RFRG is controlled to be the same as that for refreshing the entirety of DRAM cell array 13. Thus, each word line can be refreshed at unchanged time intervals to ensure a fixed data hold time. Since refresh operation is performed at a frequency of one n-th, current consumption is reduced to one n-th times. For example, for the configuration shown in FIG. 39, refresh region RFRG is one fourth in size of DRAM cell array 13 in the direction of the X address. Thus the average current in the self refresh mode is reduced to one fourth times.

Figure 41:
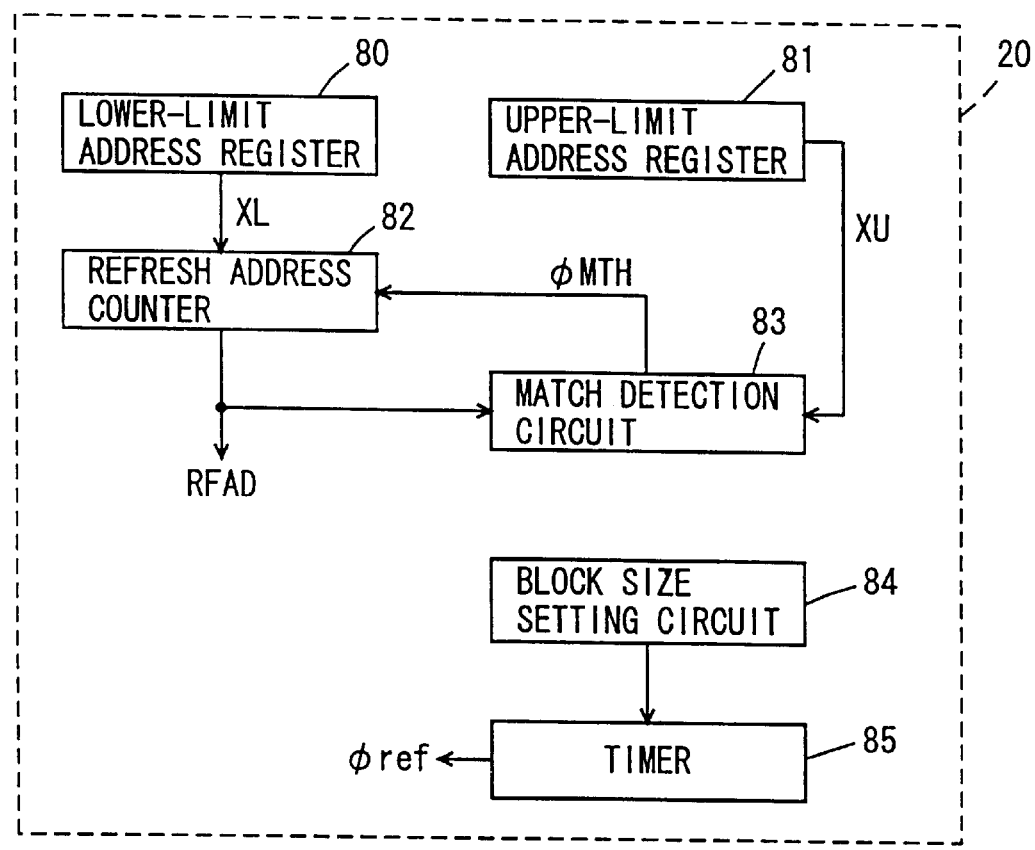
FIG. 41 schematically shows a configuration of a main portion of the semiconductor device according to the sixth embodiment of the present invention.

FIG. 41 schematically shows a configuration of self refresh control circuit 20 according to the sixth embodiment of the present invention. In FIG. 41, self refresh (SR) control circuit 20 includes a lower limit address register 80 storing a lower limit X address of a refresh region, an upper limit address register 81 storing an upper limit X address of the refresh region, a refresh address counter 82 performing a count operation to produce refresh address RFAD with an initial value set at a lower limit X address XL stored in lower limit address register 80, and a latch detection circuit 83 detecting whether refresh address RFAD from refresh address counter 82 matches an upper limit X address XU stored in upper limit address register 81. When match detection circuit 83 detects a match, refresh address counter 82 is reset to its initial value in response to a match detection signal φMTH.

SR control circuit 20 further includes a block size setting circuit 84 storing information indicating a size of the refresh region, and a timer 85 performing a count operation with its count-up cycle set according to the block size indicating information stored in block size setting circuit 84.

Block size setting circuit 84 stores information indicating a ratio of the X address of a refresh region to that of the entire region of DRAM cell array 13. If timer 85 performs a time counting operation according, e.g., to charge and discharge operation of a capacitor for time-counting a time interval, a plurality of capacitors are provided in parallel and the number thereof is set according to the block size indicating information from block size setting circuit 84. This allows adjustment of a charge and discharge time employed when a refresh interval is measured. For example, a refresh region is half in the X address direction of the entire storage region of the entire DRAM cell array, another capacitor having the same capacitance value as a capacitor used when the entire DRAM cell array is refreshed is connected in parallel. Thus, the capacitance value of a charging and discharging capacitor can be doubled and an interval at which refresh request signal φref is generated can be set doubled. Alternatively, a plurality of timer circuits having different time counting periods may be provided, from which one timer is selected according to the block size indicating information from block size setting circuit 84.

The data to lower limit address register 80, upper limit address register 81 and block size setting circuit 84 may be set by using a specific command to set a register input mode and using signals from a specific address signal input node and a data input/output node to set such required information.

Second Configuration of Refresh Address Generation Circuitry

Figures 42, 43:
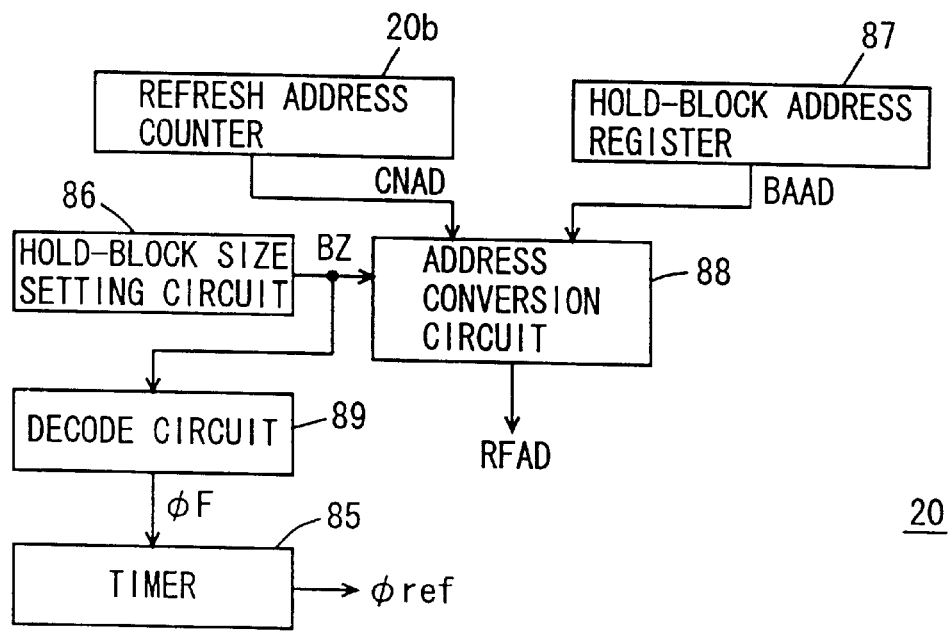
FIG. 42 schematically shows a modification of the sixth embodiment of the present invention.
FIG. 43 represents an X address allotted in the modification shown in FIG. 42.

FIG. 42 schematically shows another configuration of refresh address generation circuitry in SR control circuit 20 of the sixth embodiment of the present invention. In FIG. 42, SR control circuit 20 includes a hold-block size setting circuit 86 storing information indicative of a block size of a refresh region holding data in the self refresh mode, a hold-block address register 87 storing a hold-block address specifying a refresh region on a block basis, an address conversion circuit 88 responsive to a block size specifying signal BZ from hold-block size setting circuit 86 for combining a count address CNAD from refresh address counter 20b and a hold-block address BAAD from hold-block address register 87 to produce a refresh row address RFAD, and a decode circuit 89 decoding hold-block size specifying signal BZ from hold-block size setting circuit 86 to produce a signal OF specifying a refresh interval period and feed signal φF to timer 85.

An address signal bit corresponding to a block size set by hold-block size setting circuit 86 is fixed by hold-block address BAAD from hold-block address register 87. An X address bit in the holding block which addresses a row is substituted with count address CNAD from refresh address counter 20b. Thus, refresh address RFAD from address conversion circuit 88 varies only in a region indicated by hold-block address BAAD stored in hold-block address register 87.

For example, as shown in FIG. 43, consider a DRAM cell array divided into eight row blocks R#0–R#7. One row block R# (R#0–R#7) is specified by 3-bit, most significant row address RA13–RA11. For example, row block R#0 is designated when address bits RA13–RA11 are all 0. Hold-block size setting circuit 86 designates an address bit to be fixed among upper address bits. For example, if the most significant address bit RA13 is fixed, row blocks R#0–R#3 or row blocks R#4–R#7 are specified. With the four row blocks being a refresh region, self refresh operation is performed. Which row block is selected is determined depending on the hold-block address stored in hold-block address register 87. In the configuration shown in FIG. 43 a refresh region can be set on a row block basis. If the number of fixed address bits is further increased, a refresh region can be determined in a row block basis or a word line group basis.

Figure 44:
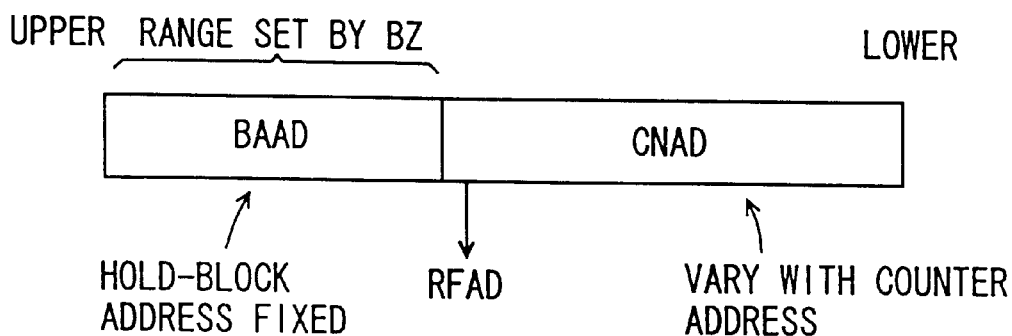
FIG. 44 schematically shows a configuration of an output from the address conversion circuit shown in FIG. 42 and a refresh address.

As shown in FIG. 44, address conversion circuit 88 uses block size specifying information BZ from hold-block size setting circuit 86 to fix the address bit(s) in a designated range with hold-block address BAAD from hold-block address region 87. The remaining lower address bit(s) are set according to count address CNAD from refresh address counter 20b. Thus, in a region specified by hold-block address BAAD, an X address varies according to count address CNAD from refresh address counter 20b, and refresh operation is performed only in a refresh region. A specific configuration will now be described.

Assume that in a 13-bit X address XA <13:1>, most two significant X address bits XA13 and XA12 are fixed. More specifically, an address space of (XA13, XA12)=(0, 1) is set as a refresh region.

Figure 45:
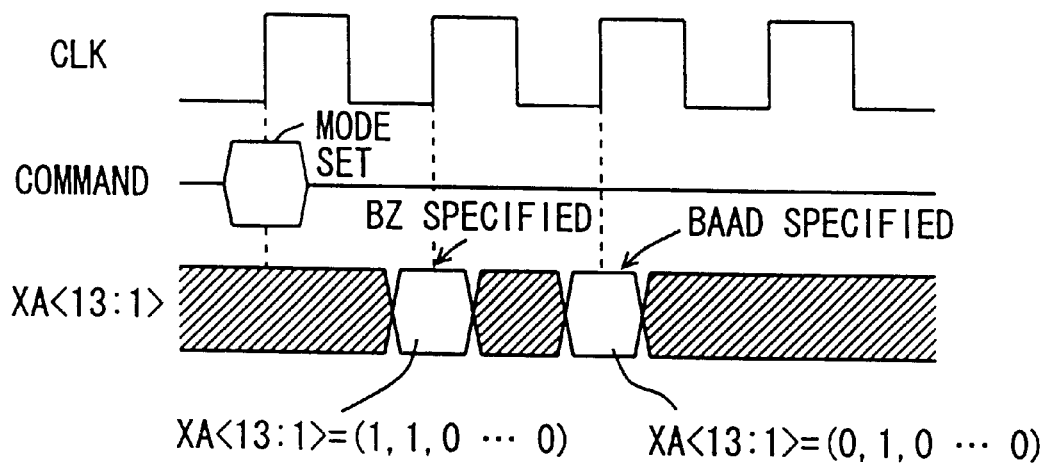
FIG. 45 is a time chart representing an operation of setting data of a size of a held block and an address thereof shown in FIG. 42.

Initially, as shown in FIG. 45, in response to a clock signal CLK a command is applied to designate a refresh region setting mode. When this command is applied and the refresh region setting mode is entered, then in order to set this hold-block size, the most two significant bits XA13 and XA12 are set to "1" and the remaining lower address bits XA11–XA1 are all set to "0". Thus, hold-block size BZ is specified. In other words, it is specified that the uppermost 2 address bits are fixed in the self refresh mode.

Figure 46:
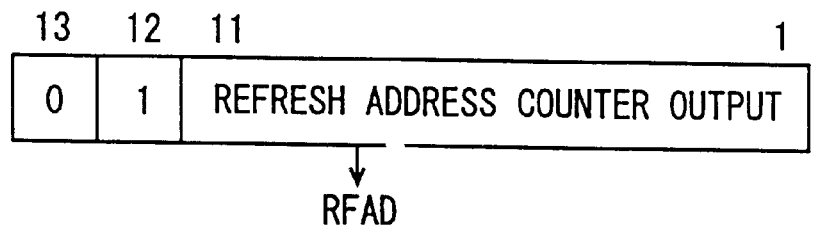
FIG. 46 represents a specific configuration of an address output from the address conversion circuit shown in FIG. 42.

In the subsequent clock cycle, in order to specify a fixed address, the most significant 2 address bits XA13 and XA12 are set to "0" and "1", respectively, and the remaining lower address bits XA11–XA1 are all set to "0". Thus an address space of (XA13, XA12)=(0, 1) is set as a refresh region. In this state, as shown in FIG. 46, refresh address RFAD has the two uppermost bits fixed at (0, 1) and the remaining lower 11 address bits varying depending on the count of the refresh address counter.

Data to hold-block size setting circuit 86 and hold-block address register 87 are set by connecting hold-block size setting circuit 86 when the refresh region setting mode is set, to receive an external address signal bit, and by connecting hold-block address register 87 in the next cycle to receive an external address signal bit.

Figure 47:
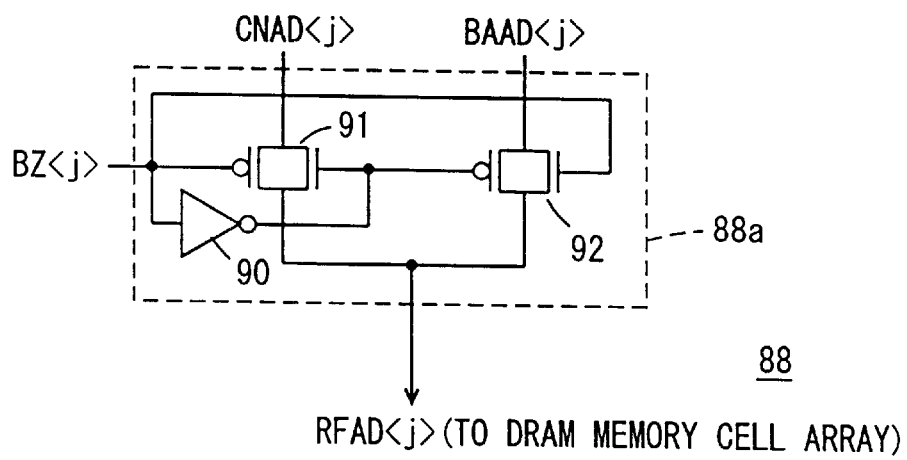
FIG. 47 shows a configuration of the address conversion circuit shown in FIG. 42.

FIG. 47 shows an exemplary configuration of address conversion circuit 88 shown in FIG. 42. Address conversion circuit 88 includes a select circuit provided corresponding to a respective address bit. FIG. 47 representatively shows a configuration of a select circuit 88a provided for a 1bit refresh row address RFAD <j>. That is, select circuit 88a shown in FIG. 47 is provided for each refresh address signal bit.

In FIG. 47, select circuit 88a includes an inverter 90 inverting a hold-block specifying bit BZ <j> from hold-block size setting circuit 86, a CMOS transmission gate 91 responsive to hold-block specifying bit BZ <j> and a signal output from inverter 90 for passing a count address bit CNAD <j> from the refresh address counter, and a CMOS transmission gate 92 responsive to hold-block size specifying bit BZ <j> and a signal output from inverter 90 for passing a hold-block specifying address bit BAM) <j> from hold-block address register 87. CMOS transmission gates 91 and 92 complementarily conduct and a conducting CMOS transmission gate outputs refresh address bit RFAD <j>.

When block size specifying bit BZ <j> is set to "1" (a high level), corresponding refresh address bit RFAD <j> is fixed to a hold-block address bit in the self refresh mode. In this state, CMOS transmission gate 92 is turned on and hold-block address bit BAAD <j> from the hold-block address register is output as refresh address bit RFAD <j>.

In contrast, block size specifying bit BZ <j> of "0" indicates that corresponding refresh address bit RFAD <j> varies depending on refresh count address bit CNAD <j> from the refresh address counter. Thus, in this state, CMOQ transmission gate 91 is turned on and count address bit CNAD <j> from the refresh address counter is output as refresh address bit RFAD <j>. Thus a refresh region can be set.

It should be noted that when a block size is set, hold-block size specifying signal BZ can be decoded by decode circuit 89 (shown in FIG. 42) to identify a size of the refresh region used to set a refresh interval period of timer 85 shown in FIG. 42.

In the sixth embodiment, each register circuit is required to have its data held in the self refresh mode and, as in the fifth embodiment, data may be held in a capacitor and refreshed at predetermined intervals.

The configuration to set a refresh region may be used independently of a hierarchical power supply configuration or power supply control.

As described above, in the sixth embodiment of the present invention, in the self refresh mode only a refresh region that is set can be refreshed to increase the refresh interval, and hence an average current consumption can be reduced in the self refresh mode.

Seventh Embodiment

Figure 48:
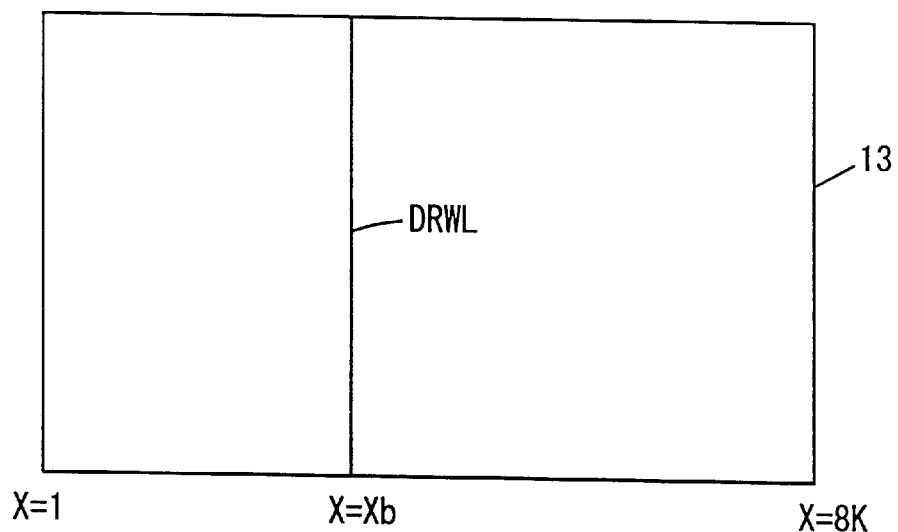
FIG. 48 schematically shows an array configuration of a semiconductor device according to a seventh embodiment of the present invention.

FIG. 48 schematically shows a configuration of DRAM cell array 13 according to a seventh embodiment of the present invention. In FIG. 48, DRAM cell array 13 has X addresses 1 to 8K. A defective refresh word line DRWL exist in DRAM cell array 13 at an X address Xb. A memory cell connected to defective refresh word line DRWL is inferior in data holding characteristic to that connected to the other normal word lines. However, the data stored in defective refresh word line DRWL is held by a refresh operation of a short period, e.g., of half a refresh cycle for other normal word lines, such as 64 ms. Thus, a refresh interval for defective refresh word line DRWL is adapted to be shorter than that for other normal word lines.

Figure 49:
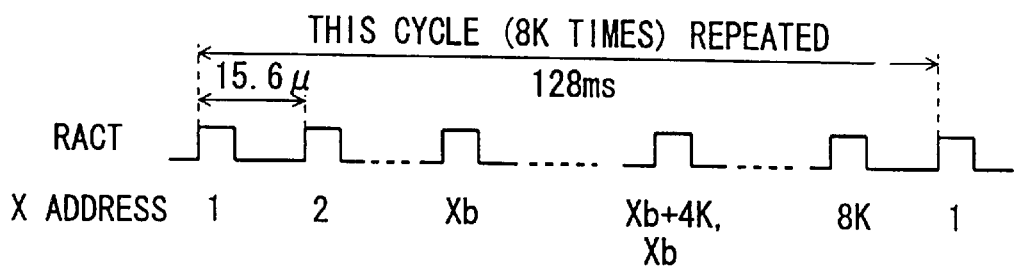
FIG. 49 is a time chart representing an operation of the semiconductor device having the array configuration shown in FIG. 48.

More specifically, as shown in FIG. 49, in refresh operation, a refresh address designates Xb+4K, and the row of address Xb is also refreshed simultaneously. Thus, in 8K refresh cycle, address Xb is refreshed twice, and the data in a memory cell is reliably held. A defective refresh word line is detected in a charge holding characteristic test, such as a disturb test in the final test of a wafer process.

Figure 50:
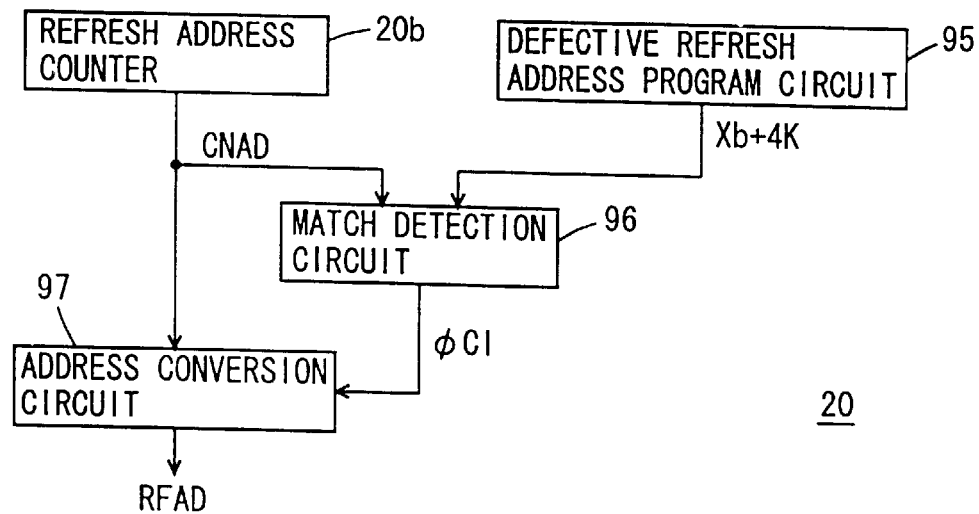
FIG. 50 schematically shows a configuration of a main portion of the semiconductor device of the seventh embodiment of the present invention.

FIG. 50 schematically shows a configuration of address generator of SR control circuit 20 in the seventh embodiment of the present invention. In FIG. 50, SR control circuit 20 includes a refresh address counter 20b generating count address CNAD, a defective refresh address program circuit 95 storing an address of a defective refresh word line plus 4K, a match detection circuit 96 detecting a matching of count address CNAD from refresh address counter 20b with a program address of defective refresh address program circuit 95, an address conversion circuit 97 responsive to a match detection signal φCI from match detection circuit 96 for putting the uppermost bit of count address CNAD from refresh address counter 20b in both selected states (a degenerated state) and outputting refresh row address RFAD.

Defective refresh address program circuit 95 includes, e.g., a fuse element to store an address indicative of a defective refresh word line plus 4K by the fuse programming. The DRAM cell array has an X address of 1 to 8 K, as shown in FIG. 48, and a value corresponding half the range of the X address of the entirety of a refresh region is added to an address of a defective refresh word line.

Figure 51:
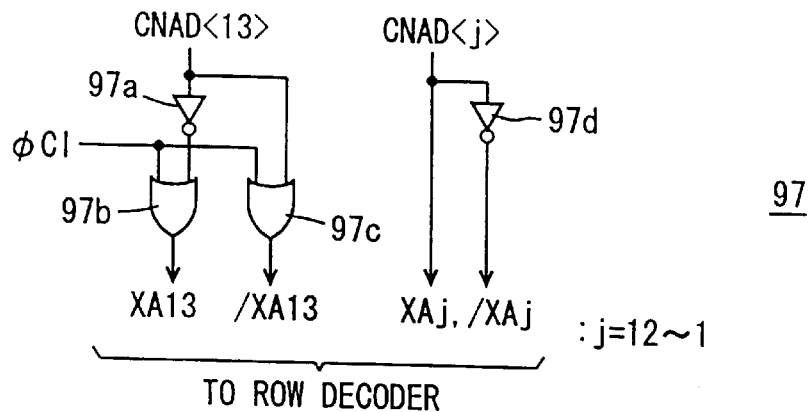
FIG. 51 shows an exemplary configuration of the address conversion circuit shown in FIG. 50.

FIG. 51 schematically shows a configuration of address conversion circuit 97 shown in FIG. 50. In FIG. 51, address conversion circuit 97 includes an inverter 97a inverting the uppermost bit CNAD <13> of count address CNAD, an OR circuit 97b receiving match detection signal φCI from match detection circuit 96 and a signal output from inverter 97a to produce refresh row address bit XA13, an OR circuit 97c receiving match detection signal φCI and the uppermost count address bit CNAD <13> to produce refresh row address bit /XA13, and an inverter 97d inverting a lower count address bit CNAD <j>.

Figure 52:
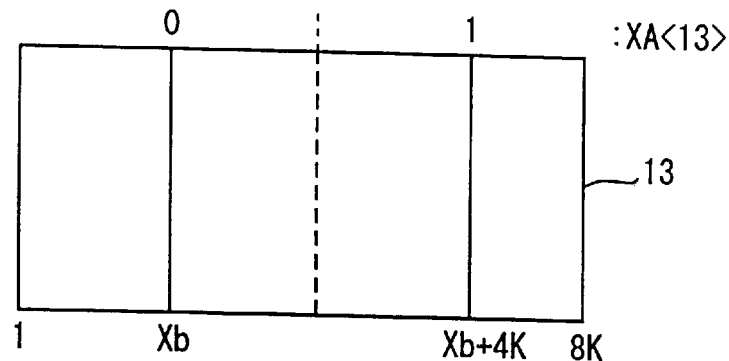
FIG. 52 shows an exemplary address converted by the address conversion circuit shown in FIG. 51.

The row decoder provided for the DRAM cell array receives complementary address signal bits. When match detection signal φCI is at a high level indicating a match, complementary address signal bits XA13 and /XA13 both attain both selected states (a degenerated state) of "1". The remaining lower address bits XAj, /XAj (wherein j=12–1) are count address CNAD <j> and an inverted version thereof. Thus, if DRAM cell array 13 is divided by the uppermost bit XA <13> into two large blocks, as shown in FIG. 52, setting of the address bits XA13 and /XA13 shown in FIG. 51 both to "1" allows the two large blocks to be simultaneously selected and the word lines of addresses Xb and Xb+4K to be simultaneously selected (FIG. 43).

With DRAM cell array 13 divided into a plurality of row blocks each provided with a sense amplifier circuit, even if a plurality of word lines are simultaneously selected, the data in a memory cell can be refreshed reliably.

In the above configuration, an X address is described to have a maximal value of 8K. However, when DRAM cell array 13 has an X address with a maximal value of M·K, an address Xb+M·K/2 is programmed in defective refresh address program circuit 95 shown in FIG. 50.

Furthermore, if there are a plurality of defective refresh word lines, provision of a plurality of defective refresh address program circuits 95 allows each defective refresh word line to be repaired.

If defective refresh address program circuit 95 has an inversion of value of the second highest bit Xb <12> of a defective refresh address (a defective refresh word line address) programmed therein and match detection circuit 96 detects whether a lower 12-bit address matches when addresses Xb+2K, Xb+4K, Xb+6K are selected, the defective refresh address Xb is also selected. More specifically, in adding an address for address programming, the addition of module 8K is performed. For example, when Xb+6K>8K, an address Xb–2K is designated. A refresh interval for a defective refresh word line can be further reduced.

As described above, in accordance with the seventh embodiment of the present invention, a refresh interval for a defective refresh word line is adapted to be reduced to repair a defective refresh word line so that an increased yield can be achieved. Furthermore, it is not necessary to consider a defective refresh word line in determining a refresh interval, so that a refresh interval can be set considering a normal word line to provide a minimized frequency of refresh operations per unit time and hence a reduced current consumption.

Eighth Embodiment

Figure 53A:
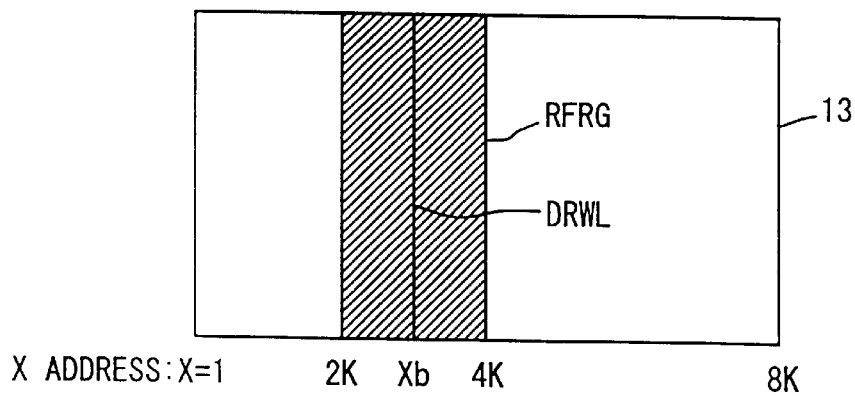
FIG. 53A schematically shows an array configuration of a semiconductor device according to an eighth embodiment of the present invention.

FIG. 53A schematically shows a configuration of DRAM cell array 13 according to an eighth embodiment of the present invention. In FIG. 53A, DRAM cell array 13 has a refresh region RFRG refreshed in the self refresh mode and a defective refresh word line DRWL included in refresh region RFRG. DRAM cell array 13 has an X address ranging from 1 to 8K, refresh region RFRG has an X address ranging from 2K+1 to 4K, and defective refresh word line DRWL has an X address Xb.

Figure 53B:
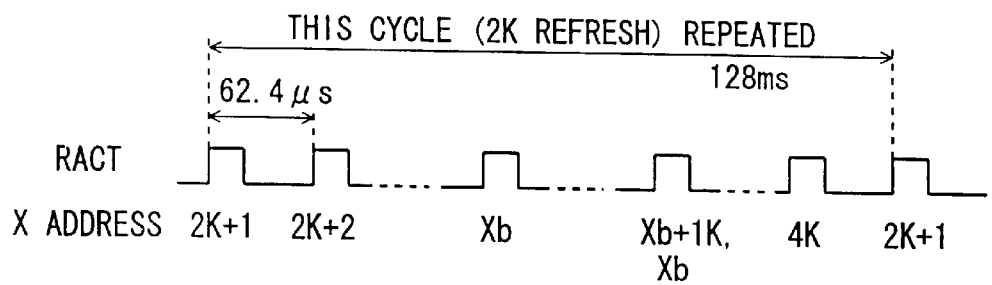
FIG. 53B is a time chart representing an operation of the semiconductor device of the eighth embodiment of the present invention.

For the configuration shown in FIG. 53A, in the self refresh mode, an X address varies from 2K+1 to 4K, as represented in FIG. 53B. When a refresh address designates an address Xb+1K, X address Xb is also designated simultaneously and a defective refresh word line is driven to a selected state.

In FIG. 53B, depending on the storage capacity of refresh region RFRG a refresh interval is increased to as long as 62 $\mu$s. With a refresh period of 128 ms, in the self refresh mode a refresh interval can be increased to reduce an average current consumption. Furthermore, defective refresh address Xb is selected twice in a 2K refresh cycle and the data in memory cells connected to a defective refresh word line are held reliably. In other words, if a refresh interval is increased depending on the storage capacity of refresh region RFRG, the data stored in a memory cell infelior in data holding characteristic can also be refreshed and held reliably.

Figure 54A:
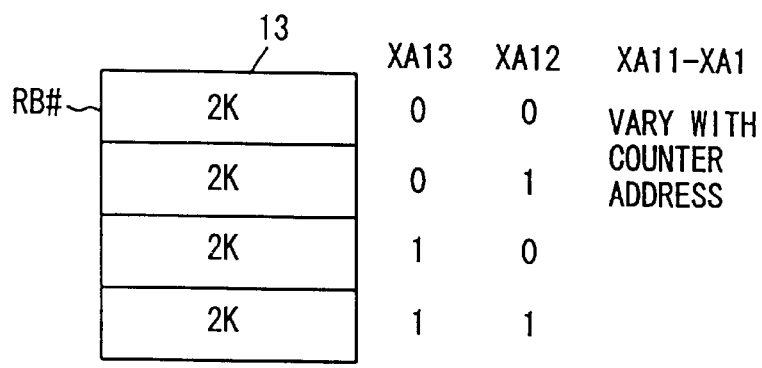
FIGS. 54A and 54B show an array block and an address bit corresponding thereto.

FIG. 54A shows a configuration DRAM cell array 13 divided into row blocks each with X addresses of 2K. One row block is specified by the most two significant address bits of XA13 and XA12. Lower address bits XA11–XA1 vary depending on the counter address from the refresh address counter. Thus, refresh operation is performed in a row block specified by address bits XA13 and XA12.

Figure 54B:
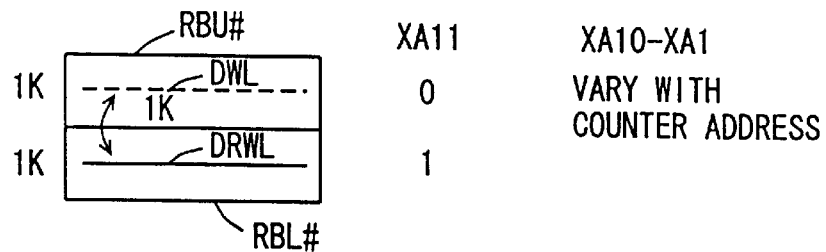

FIG. 54B shows a configuration of one row block RB# when it is divided into two sub row blocks RBU# and RBL#. There are 1K X addresses in each of sub row blocks RBU# and RBL#. Sub row blocks RBU# and RBL# are specified by X address bit XA11. For defective refresh word line DRWL, an address of a word line DWL indicated by the broken line included in sub row block RBU# is programmed as a defective refresh repairing address. Word lines DRWL and DWL are only different in the value of address bit XA11 and have the remaining lower address bits XA10X–A1 varying in accordance with the counter address from the refresh address counter.

Thus, when one of row blocks RB# is specified as refresh region RFRG, an address is substituted for each sub row block corresponding to half the storage capacity of the specified row block. More specifically, when refresh region RFRG has X addresses of a storage capacity M·K, a repairing defective address Xb (an address when it is driven to a selected state simultaneously) is set to Xb+M·K/2. Since a word line is selected simultaneously in sub row blocks RBU# and RBL#, each of sub row blocks RBU# and RBl# should have the sense amplifier circuit activated independently of the other. Thus, the minimal unit of refresh region RFRG is two sense amplifier blocks that do not share a sense amplifier circuit. Here, a sense amplifier block is configured of a sense amplifier circuit and a row of memory cells.

As is apparent from FIGS. 54A and 54B, if refresh region RFRG is specified and defective refresh word line DRWL is also included in refresh region RFRG, a defective refresh address can be programmed by inverting a value of an address bit next to a refresh region specifying address, i.e., the uppermost one of address bits varying depending on the count value output from a refresh address counter.

Figure 55:
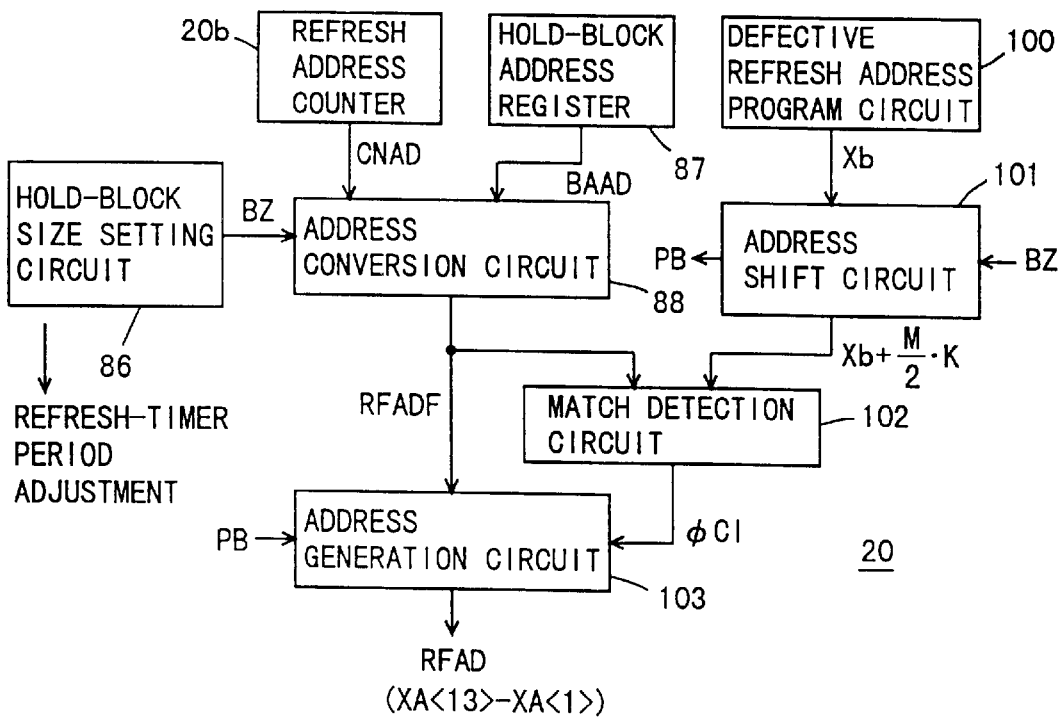
FIG. 55 schematically shows a configuration of a main portion of the semiconductor device according to the eighth embodiment of the present invention.

FIG. 55 schematically shows a configuration of refresh address generation circuitry of SR control circuit 20 of a semiconductor device according to the eighth embodiment of the present invention. In FIG. 55, SR control circuit 20 includes a refresh address counter 20b outputting count address CNAD, a hold-block size setting circuit 86 setting a size of a refresh region, a hold-block address register 87 storing information specifying a refresh region, an address conversion circuit 88 responsive to a hold-block size specifying signal BZ from hold-block size setting circuit 86 for combining count address CNAD from refresh address counter 20b and hold-block address BAAD from hold-block address register 87 together to produce a combined address signal RFADF, a defective refresh address program circuit 100 storing an X address specifying a defective refresh word line, an address shift circuit 101 responsive to hold-block size specifying signal BZ from hold-block size setting circuit 86 for shifting a defective refresh address from defective refresh address program circuit 110, a match detection circuit 102 detecting a matching of address signal RFADF from address conversion circuit 88 and a shifted defective refresh address from address shift circuit 101, and an address generation circuit 103 responsive to match detection signal φCI from match detection circuit 102 for adjusting address RFADF from address conversion circuit 88 to generate refresh row address RFAD setting to a selected state both of an X address designated by address RFADF from address conversion circuit 88 and defective refresh address Xb.

Although a refresh timer is not shown, a refresh interval is adjusted depending on the hold-block size, as in the configuration shown in FIG. 42.

Hold-block size setting circuit 86, hold-block address register 87 and refresh address counter 20b are the same in configuration as those shown in FIG. 42, and address conversion circuit 88 is the same in configuration as that shown in FIG. 47. A refresh region is specified by address BAAD from hold-block address register 87, and an X address in the refresh region is specified by refresh counter address CNAD from refresh address counter 20b. Defective refresh address program circuit 100 stores defective refresh address Xb indicative of a defective refresh word line, e.g., by programming a fuse element.

Address shift circuit 101 responds to hold-block size specifying signal BZ from hold-block size setting circuit 86 for inverting a value of the uppermost bit of X address bits varying in the self refresh mode, to shift a defective refresh address. In this address shift operation, the number of X addresses of half the capacity of the X addresses of a hold-block size is shifted.

Figure 56:
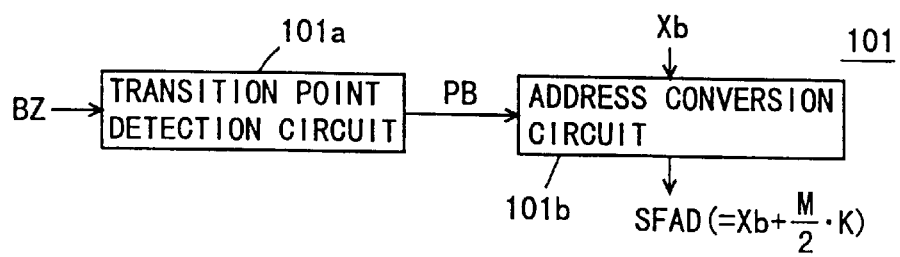
FIG. 56 schematically shows a configuration of the address shift circuit shown in FIG. 55.

FIG. 56 schematically shows a configuration of address shift circuit 101 shown in FIG. 55. In FIG. 56, address shift circuit 101 includes a transition point detection circuit 101a detecting a 0/1 transition point of hold-block size specifying signal BZ from hold-block size setting circuit 86, and an address conversion circuit 101b responsive to a transition point detection signal PB from transition point detection circuit 101a for inverting a value of an address bit corresponding to the transition point of defective refresh address Xb, to output a shift address SFAD (=Xb+M·K/2).

In hold-block size specifying signal BZ, a region set by a block specifying signal is "1" in bit value and a region varying in response to count address CMAD output from a refresh address counter is "0" in bit value. By detecting such 0/1 transition point, the uppermost bit of address bits varying in the self refresh mode can be detected. Address conversion circuit 101b responds to transition point detection signal PB for inverting a bit value of a corresponding digit of defective refresh address Xb. The inversion of the bit value allows shifting an X address by half a size of an X address of a refresh region (a hold block) (see FIGS. 54A and 54B).

Figure 57:
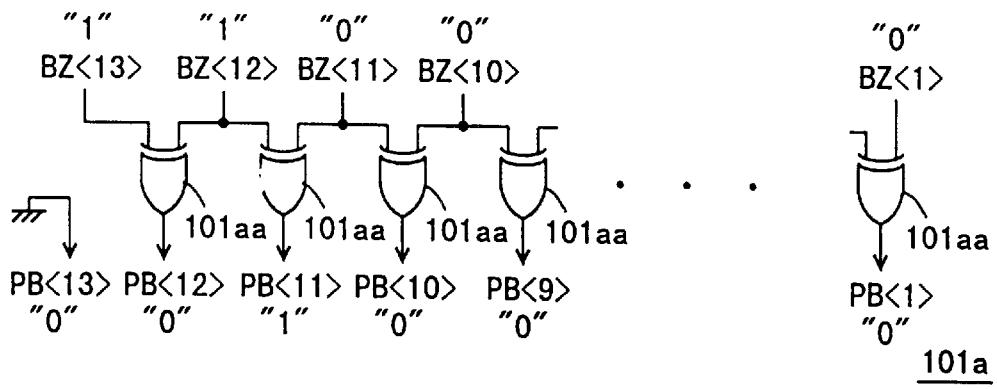
FIG. 57 schematically shows a configuration of the transition point detection circuit shown in FIG. 56.

FIG. 57 shows an exemplary configuration of transition point detection circuit 101a shown in FIG. 56. In FIG. 57, transition point detection circuit 101a includes EXOR circuit (a mismatch detection circuit) 101aa provided corresponding to two adjacent bits, hold-block size specifying signals BZ <k+1> and BZ <k> to output a transition point detection bit PB <k>, with k=12 to 1. The uppermost bit or a transition point detection signal PB <13> is fixed at "0".

For example, in the configuration of transition point detection circuit 101a shown in FIG. 57, when bits BZ <13> and BZ <12> are both "1" and the remaining bits BZ <11:1> are all "0", transition point detection bit BP <11> attains "1" and the remaining bits all attain "0". When an X address is a 13-bit address, the two uppermost bits thereof are set and fixed by an address from hold-block address register 87. The remaining address bits vary depending on the counter address of a refresh address counter. Thus, in response to transition point detection signal bit PB <11>, in address conversion circuit 101b a corresponding bit value can be inverted to shift an address.

Figure 58:
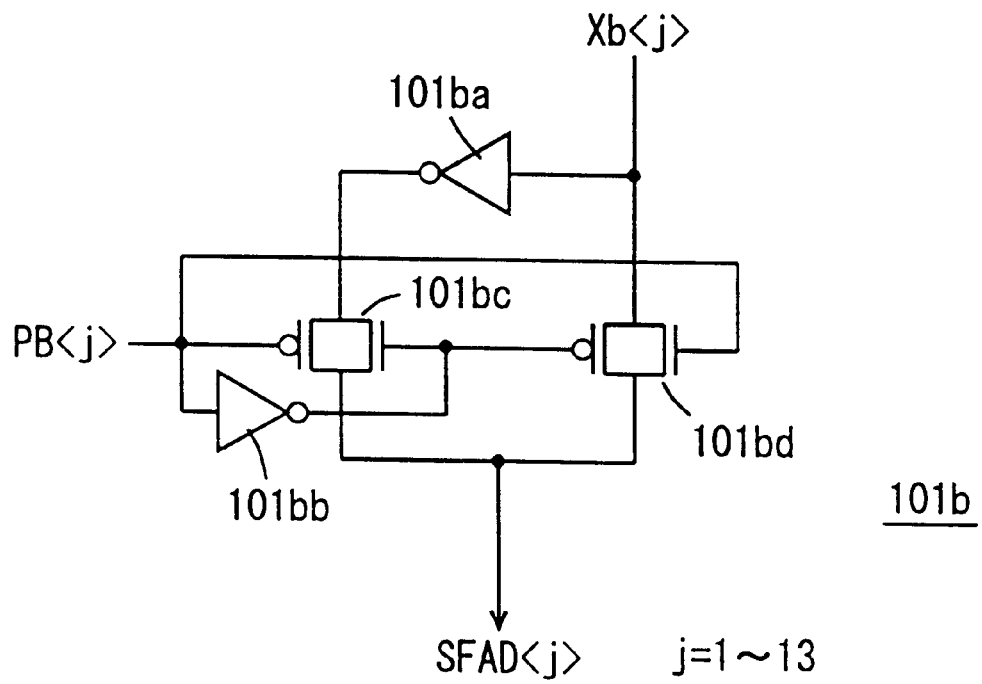
FIG. 58 shows a configuration of the address conversion circuit shown in FIG. 56.

FIG. 58 shows an exemplary configuration of address conversion circuit 101b shown in FIG. 56. Address conversion circuit 101b has select circuits identical in configuration and provided one for each shift address bit. FIG. 58 representatively shows a configuration of a select circuit for a 1-bit shift address SFAD <j>.

In FIG. 58, a select circuit in address conversion circuit 101b includes an inverter 101ba inverting a defective refresh address bit Xb <j>, an inverter 101bb inverting a transition point detection bit PB <j>, a CMOS transmission gate 101bc responsive to transition point detection bit PB <j> and a signal output from inverter 101bb for passing a signal output from inverter 101ba, and a CMOS transmission gate 101bd responsive to transition point detection bit PB <j> and a signal output from inverter 101bb for passing defective refresh address bit Xb <j>. CMOS transmission gates 101bc and 101bd complementarily turn on to produce a shifted refresh address bit SFAD <j>.

When transition point detection bit PB <j> is "1", CMOS transmission gate 101bc is turned on and a value of an inverted version of defective refresh address bit Xb <j> is output as shifted address bit SFAD <j>. When transition point detection bit PB <j> is "0", CMOS transmission gate 101bd is turned on and defective refresh address bit Xb <j> is output as shifted address bit SFAD <j>. By inverting a bit value of defective refresh address bit Xb <j>, address Xb of a defective refresh word line can be 2j-shifted.

Figure 59:
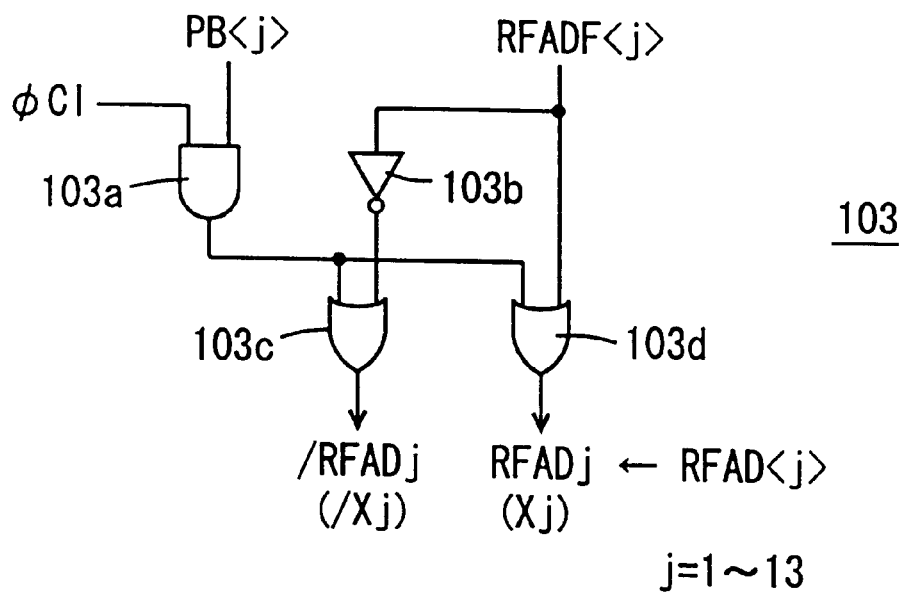
FIG. 59 shows an exemplary configuration of address generation circuit shown in FIG. 55.
Figure 60:
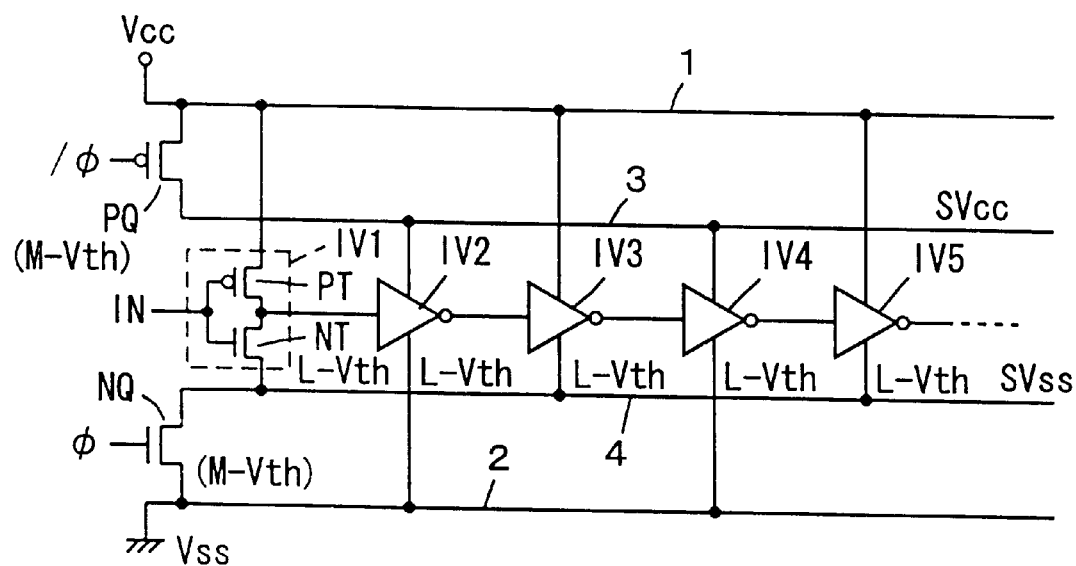
FIG. 60 shows a configuration of a conventional hierarchical power supply circuit.
Figure 61:
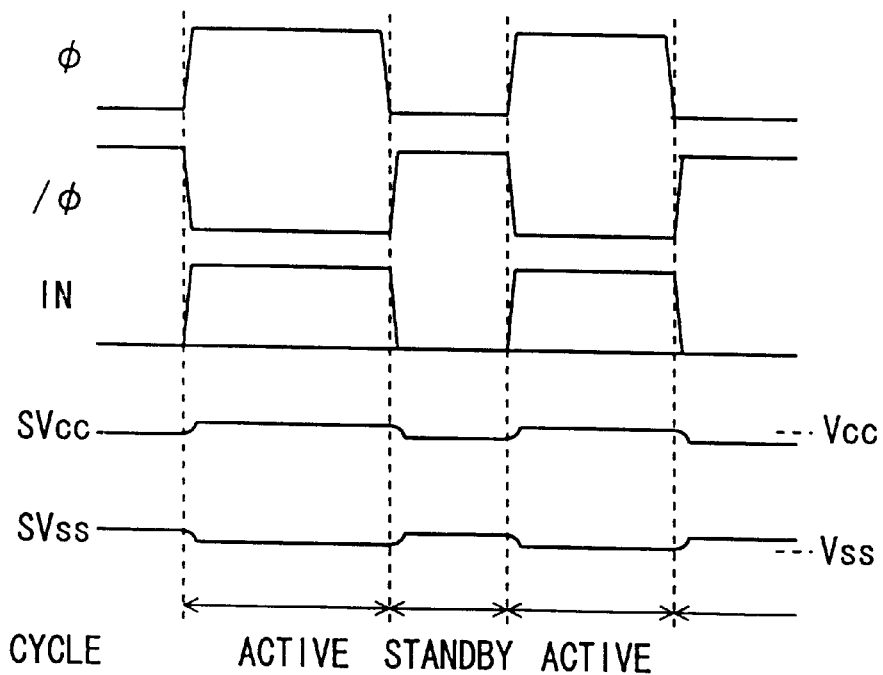
FIG. 61 is a signal waveform diagram representing an operation of the power supply circuit shown in FIG. 60.
Figure 62:
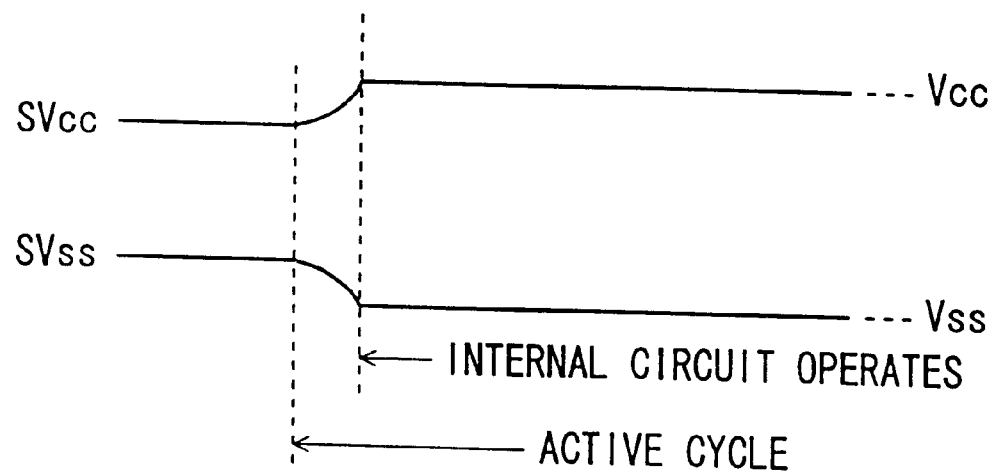
FIG. 62 is a signal waveform diagram representing a variation in power supply voltage in a conventional power supply circuit.

FIG. 59 schematically shows a configuration of address generation circuit 103 shown in FIG. 55. Address generation circuit 103 includes address conversion circuits identical in configuration and, provided one for each refresh address bit. Accordingly, FIG. 59 representatively shows a configuration for a 1-bit refresh address RFAD <j>.

In FIG. 59, address generation circuit 103 includes an AND circuit 103a receiving match detection signal φCI from match detection circuit 102 shown in FIG. 55 and transition point detection bit PB <j> from transition point detection circuit 101a shown in FIG. 5G, an inverter 103b inverting a converted address bit RFADF <j> from address conversion circuit 88 shown in FIG. 55, an OR circuit 103c receiving a signal output from AND circuit 103a and a signal output from inverter 103b to output a complementary address bit /RFADj (/Xj), and an OR circuit 103d receiving a signal output from AND circuit 103a and converted address bit RFADF <j> to output a refresh address bit RFADj (Xj). Complementary address bits RFADj and /RFADj are applied to the row decoder of the DRAM cell array.

When match detection signal φCI is at a low level, AND circuit 103a outputs a signal of low level and OR circuits 103c and 103d respond to converted address bit RFADF <j> to produce complementary address bits /RFADj and RFADj. Thus, in this state, in response to converted refresh address RFADF from address conversion circuit 88 shown in FIG. 55, an X address is designated and refresh operation is performed.

When match detection signal φCI is at a high level, there are two states. When transition point detection bit PB <j> is at a low level, AND circuit 103a outputs a signal of low level, and complementary address bits /RFADj and RFADj are produced in response to converted address bit RFADF <j>. When transition point detection bit PB <j> is at a high level ("1"), address bits /RFADj and RFADj from OR circuits 103c and 103d both attain a high level and the address bit is set in a so-called "both selected states." Thus address bit RFAD <j> is put in a degenerated state and a word line designated by a defective refresh address and a refresh address obtained by shifting the effective refresh address is driven to a selected state. If there is a defective refresh word line in a refresh region, a refresh interval for the defective refresh word line can be reduced as compared to that for another normal word line, to hold the data stored in a memory cell as reliably as in the seventh embodiment.

It should be noted that in the configuration of the eighth embodiment also, a register circuit may be provided with a capacitor as in the fifth embodiment, so that in the self refresh mode, power supply can be cut and the data stored in the capacitor can be refreshed.

The eighth embodiment of the present invention can provide an effect similar to those of the sixth and seventh embodiments.

Another Application

In the above description, a semiconductor device has a dynamic semiconductor memory device and a logic circuit integrated on a single semiconductor chip. However, the configurations of the first to eighth embodiments can be applied to a dynamic semiconductor memory device independently.

The configurations of the sixth to eight embodiments can be applied not only to a semiconductor device having a logic circuit and a dynamic random access memory formed on a single semiconductor chip, but also to a semiconductor memory device having a self refresh mode independently of the arrangement for controlling a power supply voltage.

Furthermore, in the sixth to eighth embodiments, the number of X addresses in the DRAM cell array is not limited to 8K.

Thus, in accordance with the present invention, a significantly reduced current consumption in the self refresh mode (the sleep mode) can be achieved without negatively affecting an access operation in the normal mode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a plurality of memory cells having information stored therein and refreshed within a predetermined period of time;
   a register circuit receiving a power supply voltage from a power supply node, for storing information related to accessing to said plurality of memory cells;
   a register capacitor provided for said register circuit, for holding the information stored in said register circuit; and
   a control circuit for refreshing, at a prescribed period, the information stored in said register capacitor when an operation mode designation signal designates a refresh mode.

2. The semiconductor device according to claim 1, wherein said control circuit includes means for supplying the power supply voltage from said power supply node to said register circuit at said prescribed period and coupling said register circuit with said register capacitor.

3. The semiconductor device according to claim 1, wherein:
   said plurality of memory cells each include a memory capacitor for storing information, said memory capacitor comprises capacitor insulation film and a cell plate electrode; and
   said register capacitor is identical to said memory capacitor in capacitor insulation film and cell plate electrode in terms of at least one of material and film thickness.

* * * * *